(12) United States Patent
Mori et al.

(10) Patent No.: US 7,058,865 B2
(45) Date of Patent: Jun. 6, 2006

(54) APPARATUS FOR TESTING SEMICONDUCTOR INTEGRATED CIRCUIT

(75) Inventors: Hisaya Mori, Hyogo (JP); Teruhiko Funakura, Tokyo (JP); Hisayoshi Hanai, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 483 days.

(21) Appl. No.: 10/647,267

(22) Filed: Aug. 26, 2003

(65) Prior Publication Data

US 2004/0177302 A1    Sep. 9, 2004

(30) Foreign Application Priority Data

Feb. 26, 2003  (JP)  ............................. 2003-049893

(51) Int. Cl.
  *G01R 31/28*    (2006.01)
  *G06F 11/00*    (2006.01)

(52) U.S. Cl. ...................................... 714/724; 714/738
(58) Field of Classification Search .................... None
See application file for complete search history.

(56) References Cited

U.S. PATENT DOCUMENTS

| | | | | |
|---|---|---|---|---|
| 4,555,663 A | * | 11/1985 | Shimizu ..................... 714/738 |
| 6,492,923 B1 | * | 12/2002 | Inoue et al. ................. 341/120 |
| 6,948,096 B1 | * | 9/2005 | Parvathala et al. ........... 714/30 |
| 2002/0049943 A1 | * | 4/2002 | Kobayashi ................... 714/734 |
| 2002/0062200 A1 | | 5/2002 | Mori et al. |
| 2003/0048112 A1 | | 3/2003 | Mori et al. |

FOREIGN PATENT DOCUMENTS

| | | |
|---|---|---|
| JP | 7-209389 | 8/1995 |
| JP | 2002-6001 | 1/2002 |

* cited by examiner

*Primary Examiner*—Christine T. Tu
(74) *Attorney, Agent, or Firm*—McDermott Will & Emery LLP

(57) ABSTRACT

An apparatus for testing a semiconductor integrated circuit has a test circuit board and an ancillary test device. The ancillary test device can test a digital circuit. The ancillary test device has test pattern memory, a test pattern signal generator, and a control section for controlling an operation for the test pattern data selected from among the plurality of test pattern data sets stored in the test pattern memory and an operation for writing the selected test pattern data into the test pattern signal generator. The ancillary test device generates a test input pattern signal on the basis of test pattern data written in the test pattern signal generator and determines a test output pattern signal output from the semiconductor integrated circuit on the basis of the test input pattern signal, thereby testing a digital circuit.

20 Claims, 52 Drawing Sheets

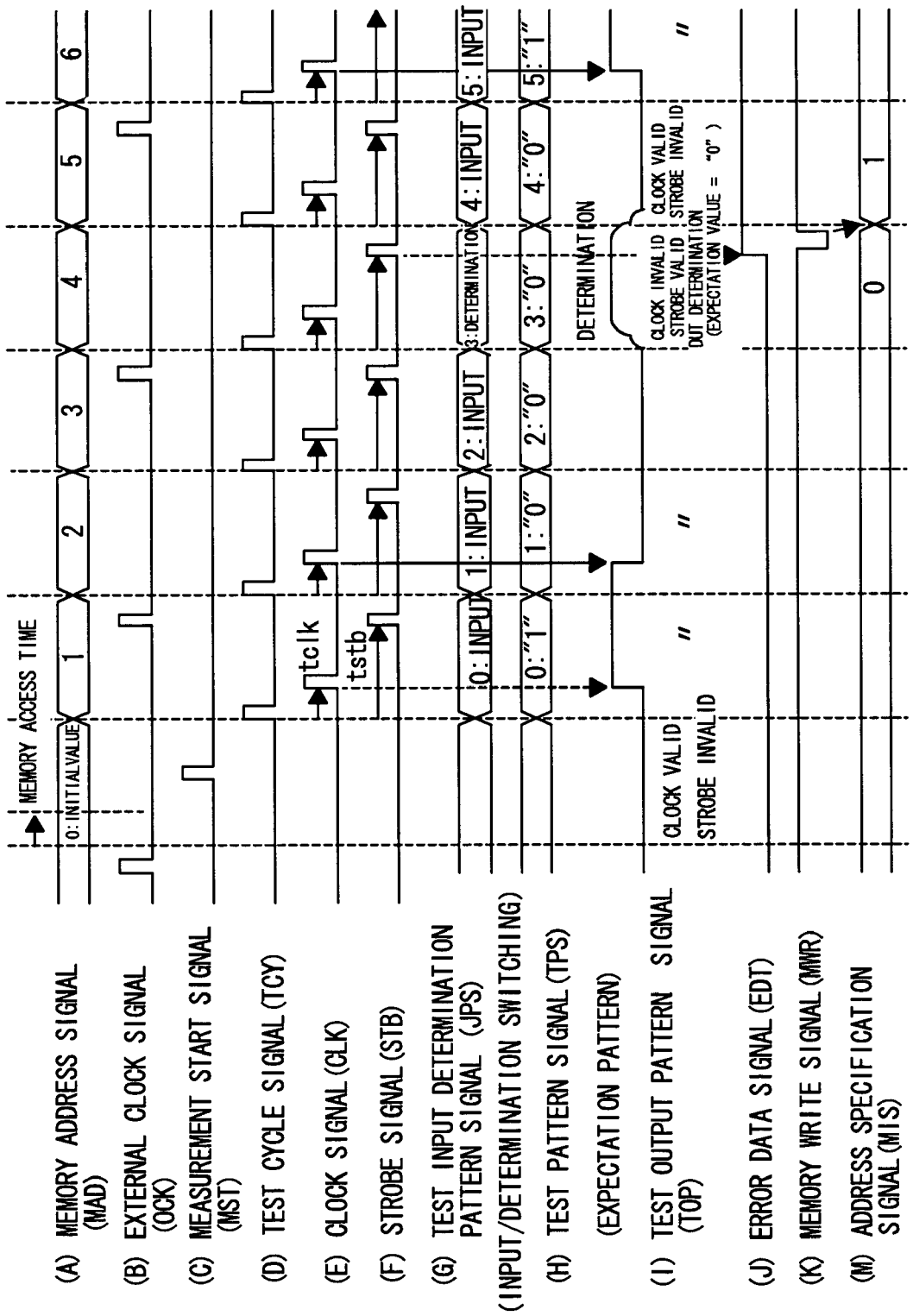

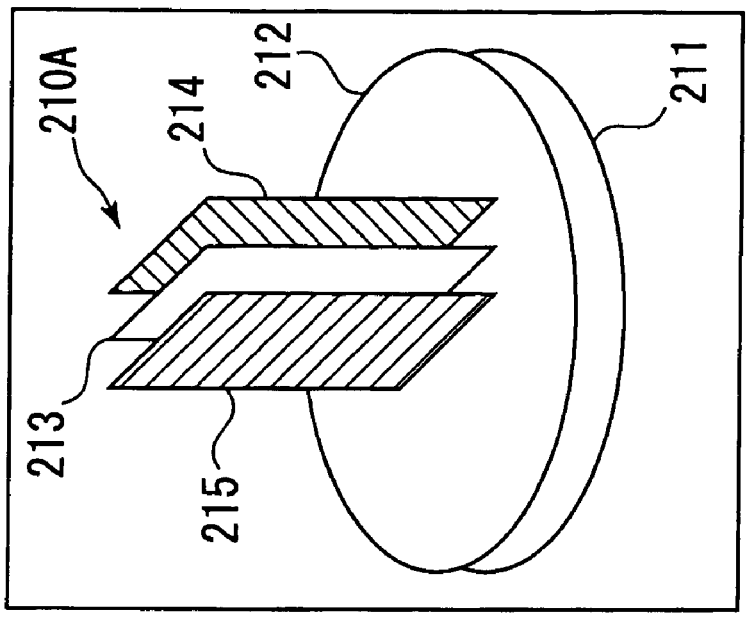
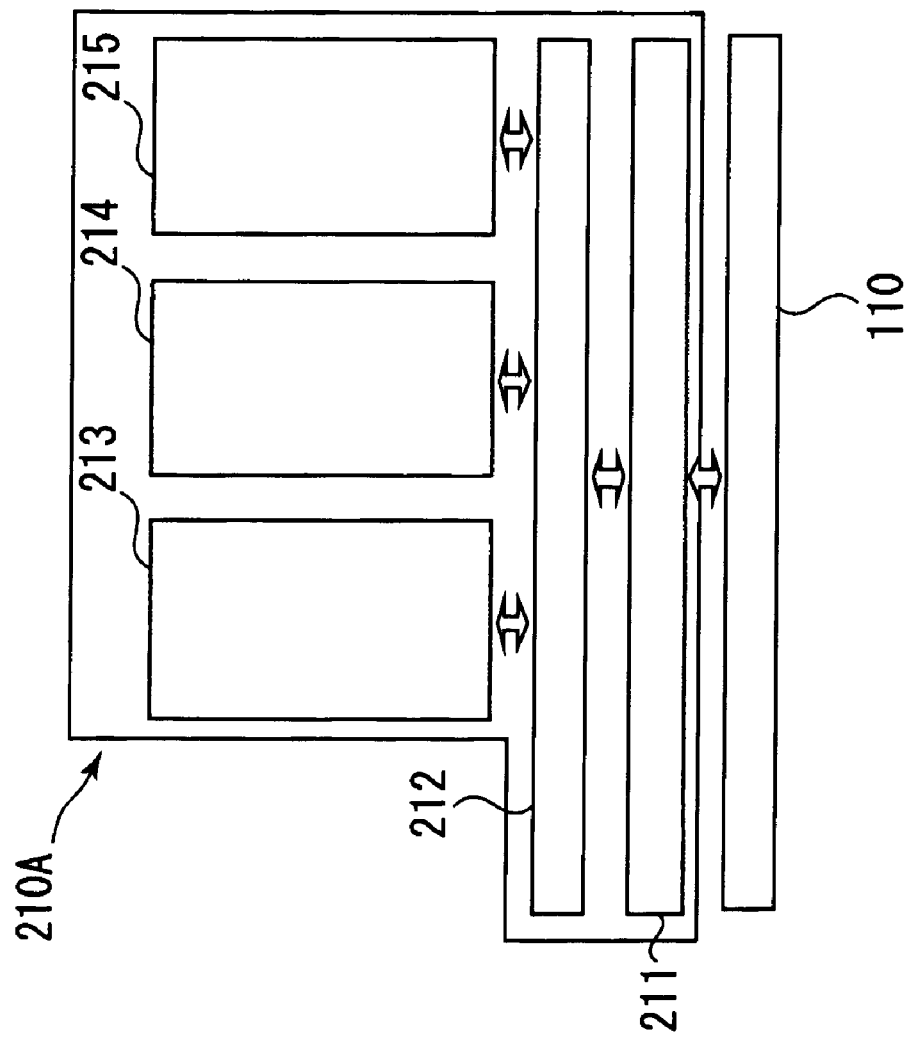
FIG. 4A
FIG. 4B

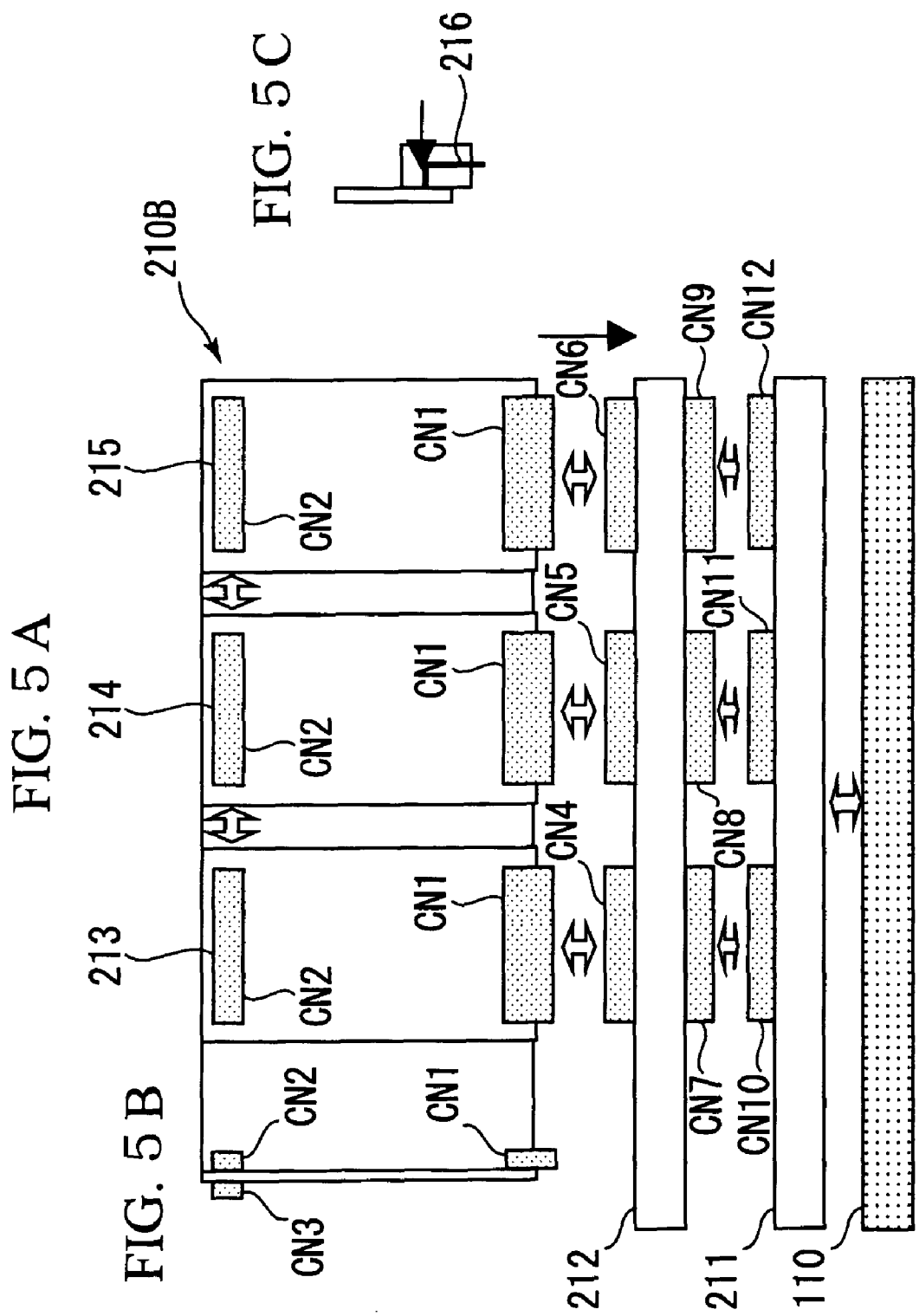

FIG. 11A
FIG. 11C
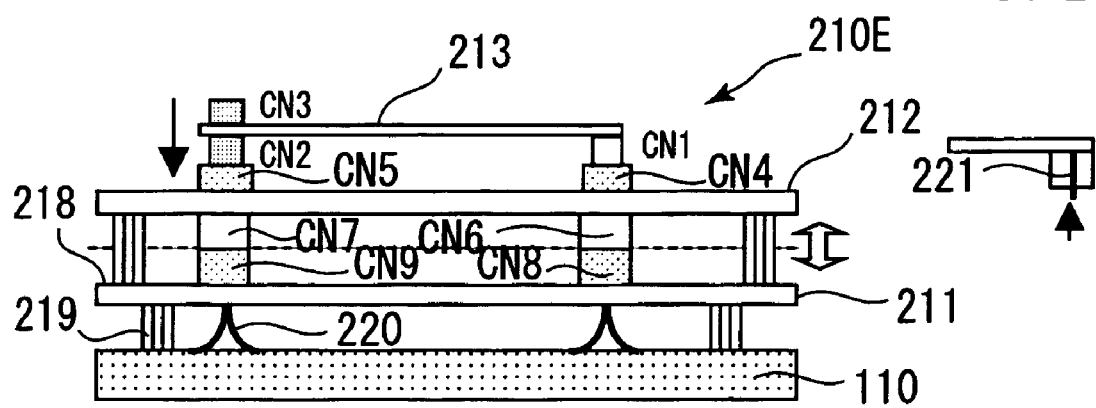
FIG. 11B
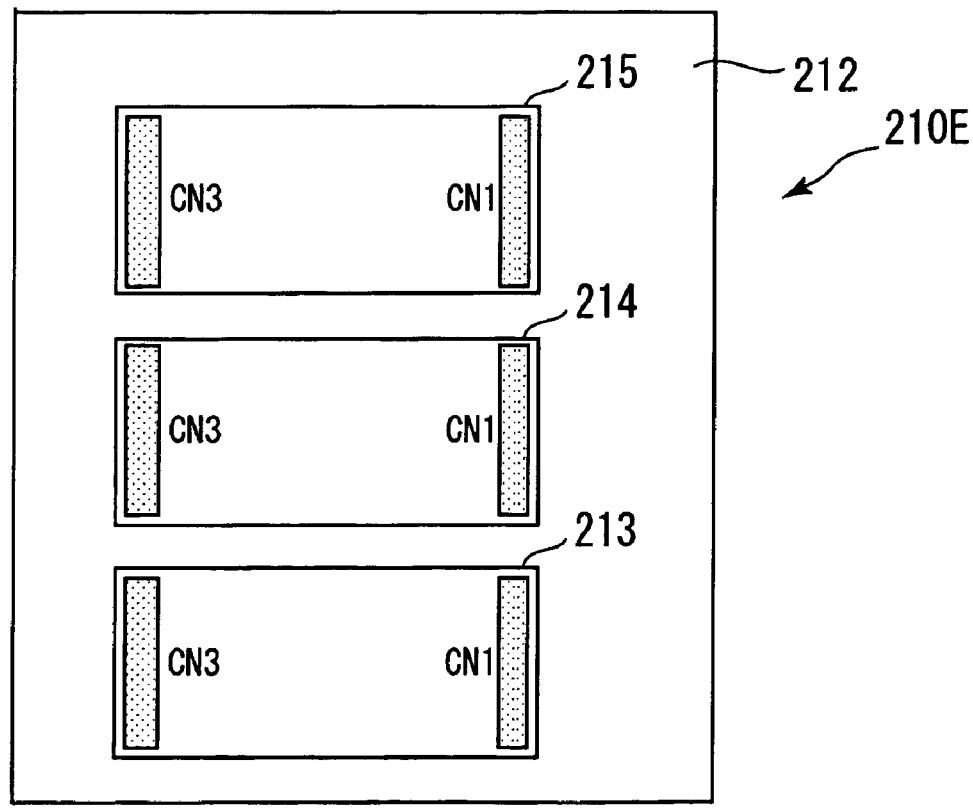

FIG. 14A
FIG. 14C
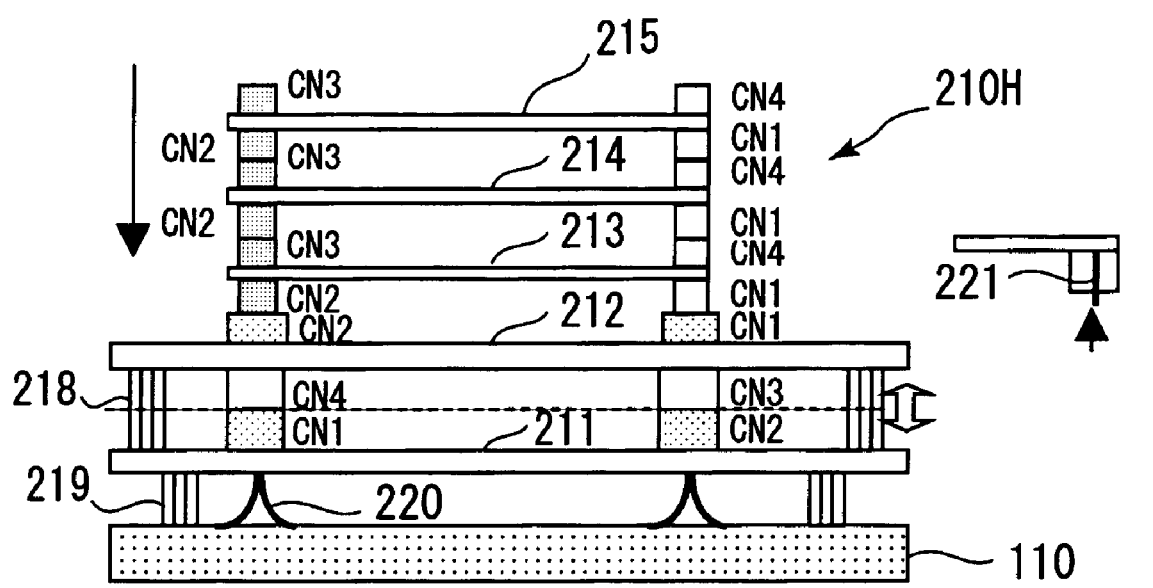
FIG. 14B
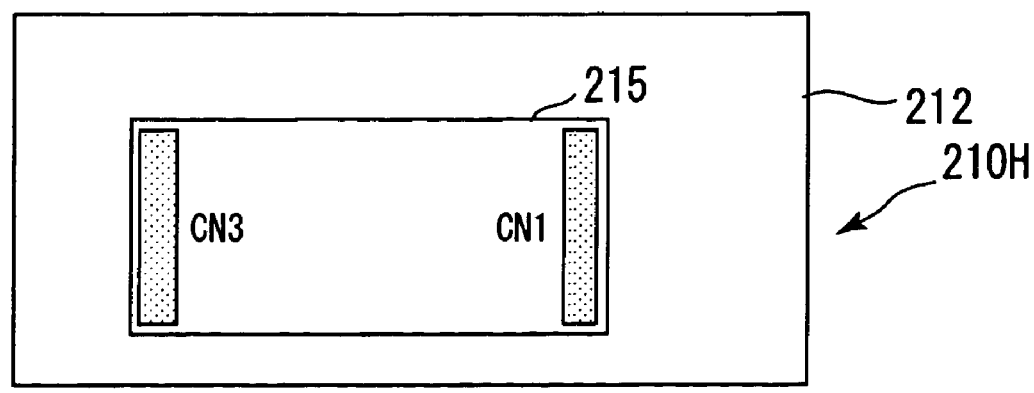

PROBING APPARATUS (PROBER)

LSI TESTER MAIN BODY

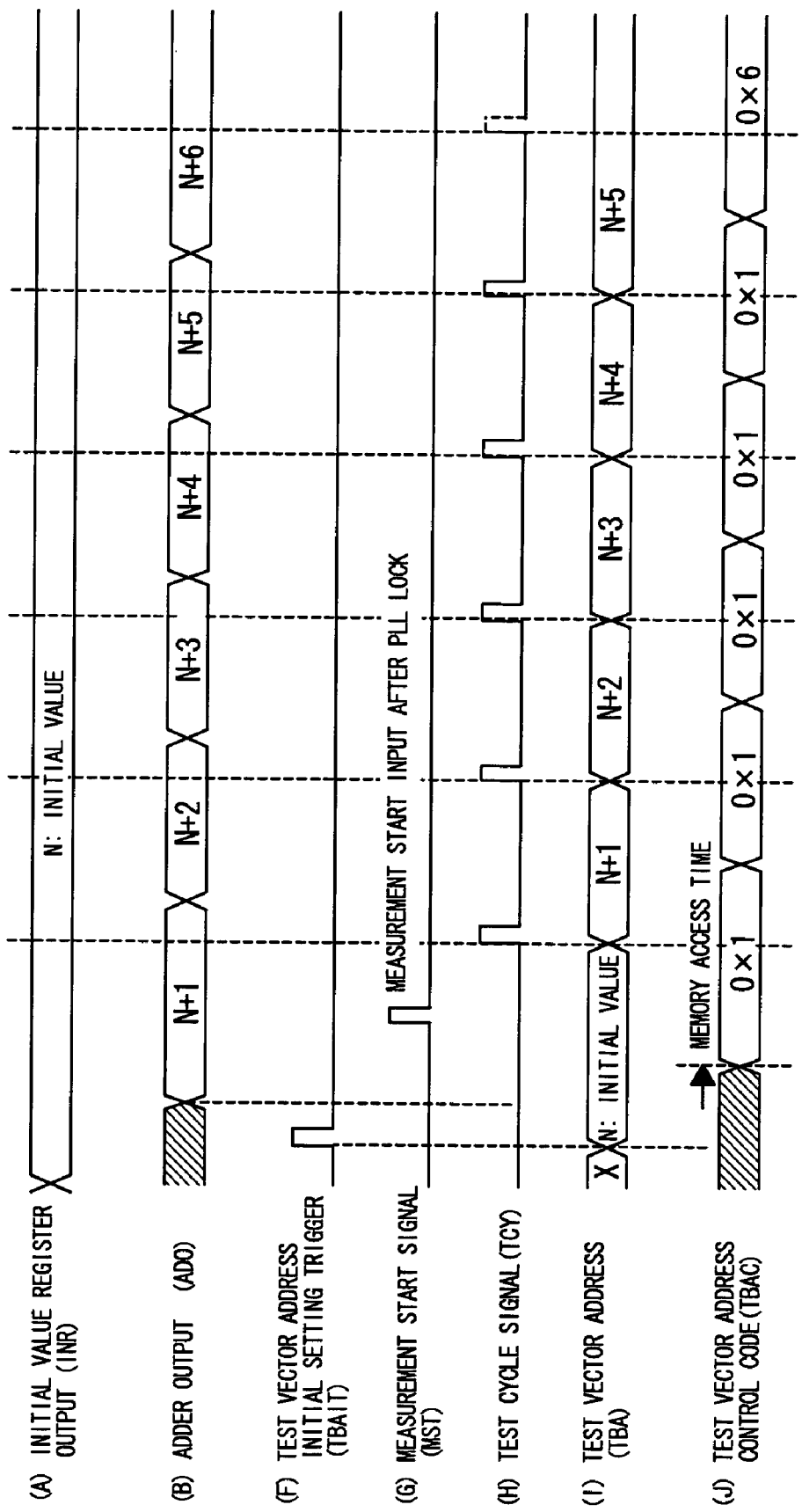

FIG. 29

| | TBA | TBAC CODE OUTPUT | ADRC |
|---|---|---|---|
| ↓ | N | NOP (0x1) | EA=0xFF  EB=0xFF |
| | N+1 | NOP (0x1) | MA=0x00  MB=0xFF |
| | N+2 | NOP (0x1) | MA=MB    MB=MA |
| | N+3 | STOP (0x6) | |

FIG. 31

| | TBA | TBAC | ADRC |
|---|---|---|---|
| ↓ | N | NOP (0x1) | EA=0xFF EB=0xFF |
| | N+1 | NOP (0x1) | CA=0xFF CB=0xFF |
| | N+2 | NOP (0x1) | MA=0x00 MB=0x00 |
| | N+3 | NOP (0x1) | MA=MA+1 MB=MB+1 |
| | N+4 | MAB/CAB N+3 (0x18) | MA=MA+1 MB=MB+1 |
| | N+5 | STOP (0x6) | |

FIG. 33

| | TBA | TBAC | ADRC | |
|---|---|---|---|---|
| ↓ | N | NOP (0x1) | EA=0xFF EB=0xFF | |
| | N+1 | NOP (0x1) | CA=0xFF CB=0xFF | |
| | N+2 | NOP (0x1) | MA=0x00 MB=0x00 | |
| | N+3 | MAB/CAB N+3 (0x18) | MA=MA+1 LMB+1 | ↵ |
| | N+4 | STOP (0x6) | | |

FIG. 35

| | TBA | TBAC | ADRC |
|---|---|---|---|
| ↓ | N | NOP (0x1) | EA=0xFF EB=0xFF MC=0x00 |
| | N+1 | NOP (0x1) | CA=0xFF CB=0xFF |
| | N+2 | NOP (0x1) | MA=0x00 MB=0x00 |
| | N+3 | NOP (0x1) | MA=MA+1 MB=MB+1 |
| | N+4 | MAB/CAB N+3 (0x18) | MA=MA+1 MB=MB+1 |
| | N+5 | STOP (0x6) | |

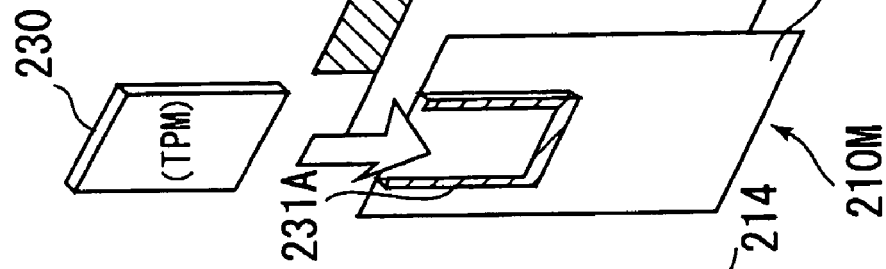
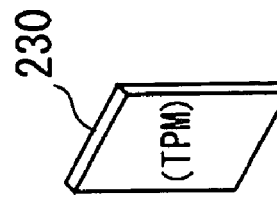
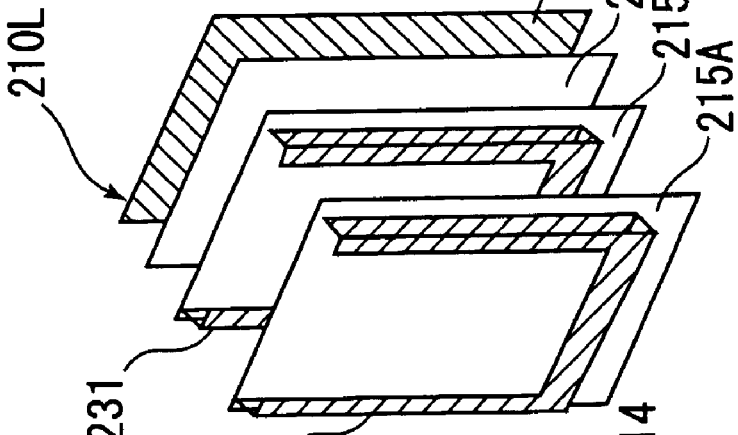
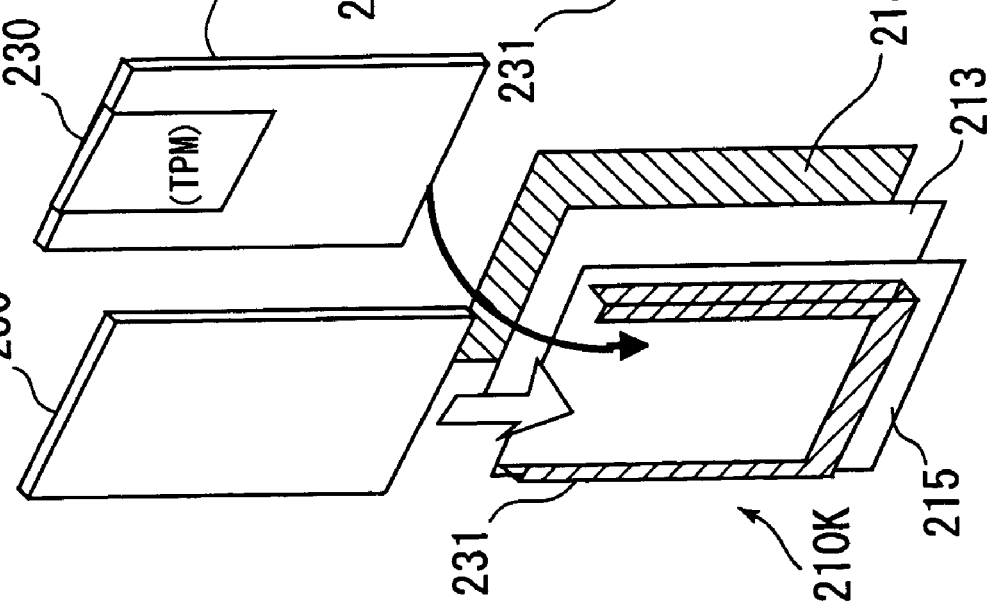

APPARATUS FOR TESTING SEMICONDUCTOR INTEGRATED CIRCUIT

BACKGROUND OF THE INVENTION

1. Field of the Invention

The invention relates to an apparatus for testing a semiconductor integrated circuit, the apparatus having an ancillary test device placed in the vicinity of a test circuit board which exchanges signals with a semiconductor integrated circuit under test.

2. Background Art

A large-scale analog semiconductor integrated circuit (hereinafter called an "LSI") is usually tested through use of an analog-only tester. The analog-only tester is configured so as to supply a test input signal to a semiconductor integrated circuit under test (hereinafter called a "DUT") by way of a test circuit board which exchanges signals with the DUT and receives a test output signal from the DUT and analyzes the output signal. However, in relation to a recent semiconductor integrated circuit, the number of consolidated-type LSIs; that is, a combination of an analog LSI having digital circuitry, more specifically, a combination of an analog LSI, and a logic circuit and a memory circuit, is increasing. If the scale of digital circuitry to be incorporated into the consolidated-type LSI is small and the digital circuitry operates at low speed, the analog-only tester can test the digital circuit by means of low-performance function testing capability incorporated in the analog-only tester. However, in association with a recent fast progression of an on-chip system, the scale of digital circuitry to be incorporated into an analog LSI becomes larger. Hence, testing of the analog LSI through use of the conventional testing capability becomes difficult.

A conceivable countermeasure for improving the circumstances under which testing of an analog LSI becomes difficult is expansion of digital function testing capability incorporated in the analog-only tester. Expansion of the digital function testing capability requires development of an individual custom-designed tester for expansion purpose. Another conceivable countermeasure is to prepare custom-designed testers for an analog circuit, a digital logic circuit, and digital memory, respectively. Plant and equipment investments for a logic-circuit-specific tester and a memory-specific tester are required. Further, an increase in the time required for testing is also feared. Moreover, preparation of a mixed-signal-type tester for a consolidated-type LSI is also conceivable, which requires big-budget investments for a special tester.

Even in the case of a test for a digital LSI, an increase in the scale of a logic circuit and that of a memory circuit, which are to be incorporated into an LSI, is also being pursued. Analogous problems arise in a custom-designed tester compatible with a logic circuit and a memory circuit. Further, similar problems arise in a test for a consolidated LSI formed by providing a digital LSI with an analog circuit.

JP-A-8-179013 and JP-A-2001-83216 describe testers which have a built-in pattern generator and digital function testing capability. However, these patents relate to testers having digital function testing capability; in other words, imparting digital function testing capability to a custom-designed tester. Expansion of the digital function requires development of individual custom-designed testers, as mentioned previously. A tester that cannot address such expansion of digital function capability requires significant modifications, which in turn leads to occurrence of problems pertaining to costs and ease of expansion.

Prior to filing the present patent application, the inventors had already filed JP-A-2002-236143, which proposes an ancillary test device-which is disposed in the vicinity of a test circuit board and has a test circuit for an analog-to-digital conversion circuit and a digital-to-analog conversion circuit—as an apparatus for testing a semiconductor integrated circuit including an analog-to-digital conversion circuit and a digital-to-analog conversion circuit. The ancillary test device tests an analog-to-digital conversion circuit and a digital-to-analog conversion circuit, both being included in an analog circuit, for a consolidated-type LSI embodied by mixedly incorporating an analog circuit into a digital LSI. As a result of an analog-to-digital conversion circuit for testing purpose and a digital-to-analog conversion circuit for testing purpose being provided in the ancillary test apparatus to be disposed in the vicinity of a test circuit board, significant modifications of the tester are not required, and an analog measurement line provided between the tester and a circuit board under test is obviated. Further, an effective test can be performed by the ancillary test device disposed in the vicinity of the circuit board under test while influence of noise on the analog measurement line is eliminated. However, such a tester disclosed in the preceding patent application is also insufficient for further expansion of testing capability.

SUMMARY OF THE INVENTION

The invention proposes an improved apparatus for testing a semiconductor integrated circuit which enables easy expansion of capability to test a digital circuit of a semiconductor integrated circuit without involvement of much expenses and with quick execution of testing of the digital circuit.

The invention also proposes an improved apparatus for testing a semiconductor integrated circuit which enables easy expansion of capability to test a digital circuit of a semiconductor integrated circuit without involvement of much expenses, with quick execution of testing of the digital circuit, and with easy and sufficient preparation of test pattern data required for a test.

The invention also proposes an improved apparatus for testing a semiconductor integrated circuit which enables easy expansion of capability to test a digital circuit of a semiconductor integrated circuit without involvement of much expenses, with quick execution of testing of the digital circuit, and with efficient transfer of test pattern data from test pattern memory.

According to one aspect of the present invention, an apparatus for testing a semiconductor integrated circuit comprises a test circuit board for exchanging signals with a semiconductor integrated circuit under test, and an ancillary test device which is disposed in the vicinity of the test circuit board and connected to the test circuit board. The ancillary test device has digital circuit testing capability for testing a digital circuit included in the semiconductor integrated circuit under test. The ancillary test device comprises test pattern memory for storing a plurality of test pattern data sets corresponding to a plurality of test items for testing the digital circuit, a test pattern signal generator into which are written test pattern data selected from a plurality of test pattern data sets stored in the test pattern memory, and a control section for controlling an operation for the test pattern data selected from among the plurality of test pattern data sets stored in the test pattern memory and an operation for writing the selected test pattern data into the test pattern signal generator. The ancillary test device generates a test input pattern signal for the semiconductor integrated circuit under test on the basis of test pattern data written in the test pattern signal generator and determines a test output pattern signal output from the semiconductor integrated circuit under test on the basis of the test input pattern signal, thereby testing a digital circuit of the semiconductor integrated circuit under test.

Other and further objects, features and advantages of the invention will appear more fully from the following description.

BRIEF DESCRIPTION OF THE DRAWINGS

FIG. 3 is a timing chart showing a test operation of the first embodiment.

FIG. 4A is a conceptual rendering of the configuration of the boards of the BOST assembly 210A, and FIG. 4B is a perspective external view of the BOST assembly 210A.

FIG. 5 shows a developed view of the BOST assembly 210B of embodiment 1-2.

FIG. 11A is a side view of the BOST assembly 210E; FIG. 11B is a front view of the BOST assembly 210E; and FIG. 11C is a block diagram of a straight-type connector.

FIG. 14A is a side view of the BOST assembly 210H; FIG. 14B is a front view of the BOST assembly 210H; and FIG. 14C is a block diagram of a straight-type connector.

FIG. 21 is a timing chart of signals and data when, in embodiment 2-1, the BOST device 20 is operated through use of a code NOP which advances the test vector address TBA in a normal mode.

FIG. 29 shows operation to be performed when the test vector address TBA assumes N, N+1, and N+2 is identical with.

FIG. 31 shows the test vector address TBA, the test vector address control code TBAC and the algorithmic data generation register control code ADRC through the operations shown in FIG. 30.

FIG. 33 shows the test vector address TBA, the test vector address control code TBAC and the algorithmic data generation register control code ADRC through the operations shown in FIG. 32.

FIG. 35 shows the test vector address TBA, the test vector address control code TBAC and the algorithmic data generation register control code ADRC through the operations shown in FIG. 34.

FIG. 46 shows embodiment 3-1, in which the TPM section is combined with a removable storage medium.

DETAILED DESCRIPTION OF THE PREFERRED EMBODIMENTS

First Embodiment

Figure 1:
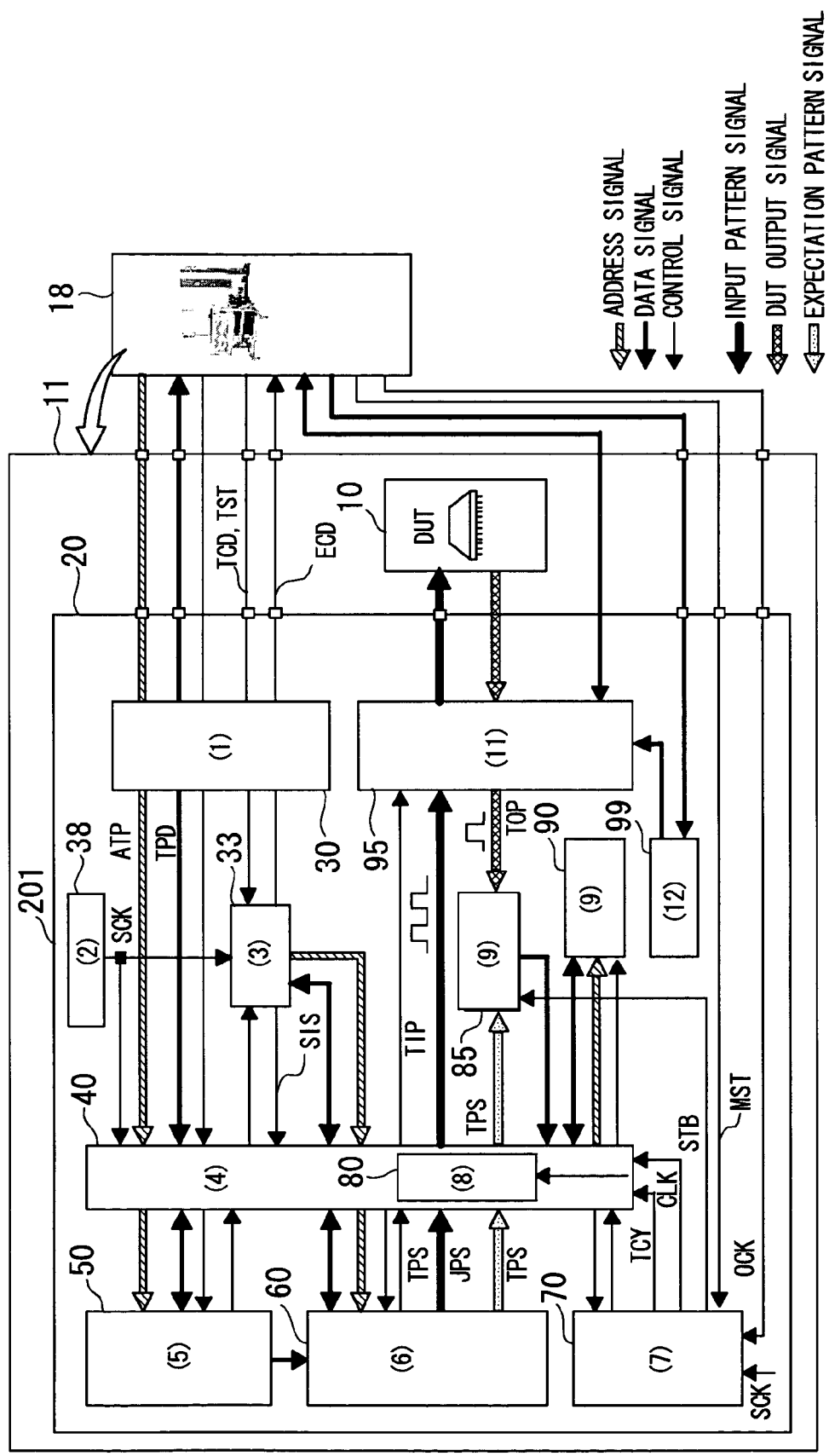
FIG. 1 is a block diagram showing a circuit configuration of a first embodiment of an apparatus for testing a semiconductor integrated circuit according to the invention.
Figure 2:
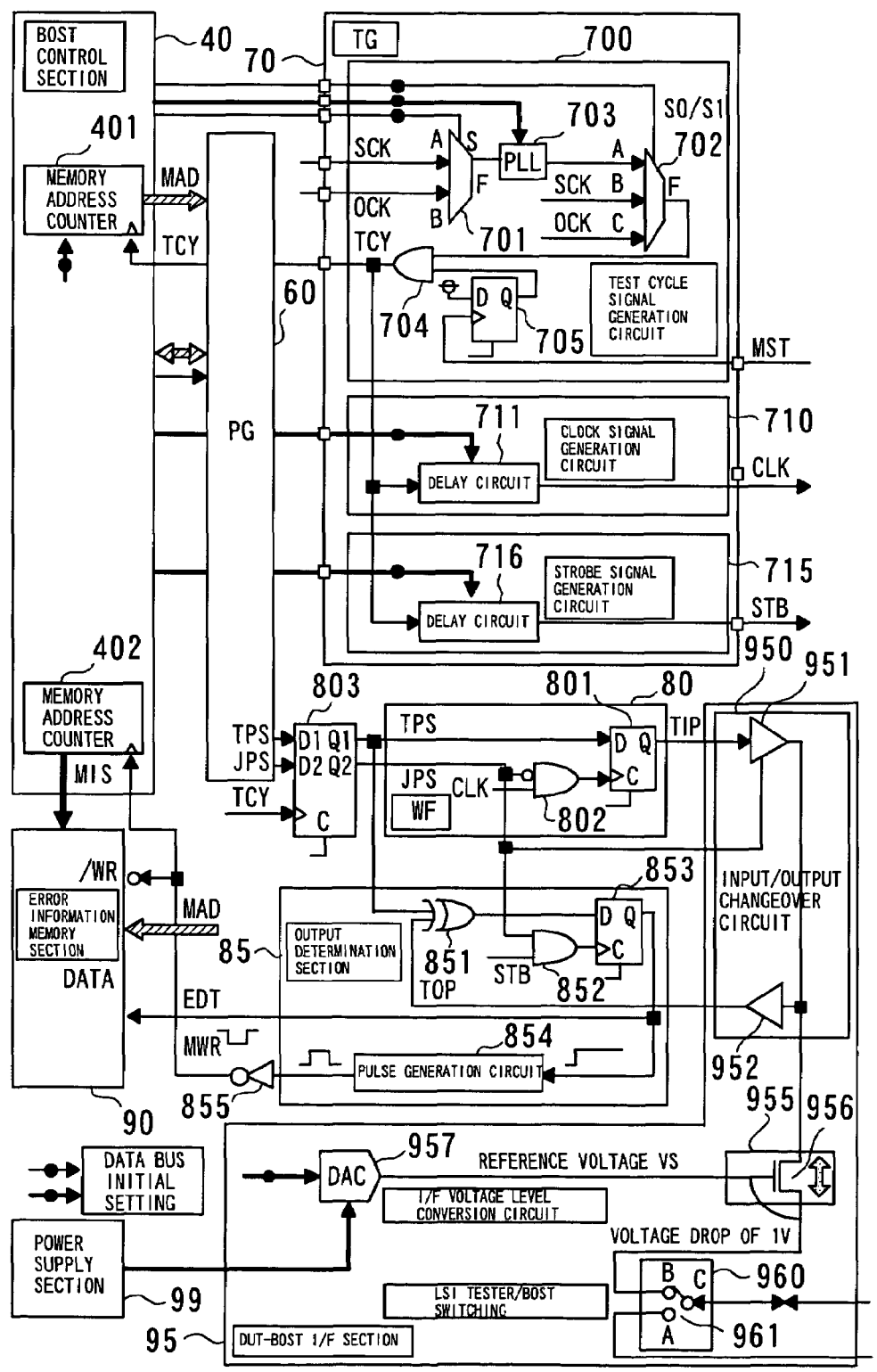
FIG. 2 is a block diagram showing a circuit configuration of an ancillary test device of the first embodiment.

FIG. 1 is a block diagram showing a circuit configuration of a first embodiment of an apparatus for testing a semiconductor integrated circuit according to the invention. FIG. 2 is a block diagram showing a circuit configuration of an ancillary test device of the first embodiment. FIG. 3 is a timing chart showing a test operation of the first embodiment.

The overall circuit configuration of the first embodiment will now be described by reference to FIG. 1. An apparatus for testing a semiconductor integrated circuit of the first embodiment is for testing a semiconductor integrated circuit 10 under test and has a test circuit board 11, an external tester 18, and an ancillary test device 20. The semiconductor integrated circuit 10 under test is also called a DUT (Device Under Test). Various types of LSIs are applicable to the DUT 10. The first embodiment is based on the assumption of a consolidated-type LSI formed by incorporating a digital circuit; specifically, a logic circuit or a memory circuit, into an analog LSI or a digital LSI. The test circuit board 11 is also called a DUT board. The external tester 18 is also called a tester, and the ancillary test device 20 is also called a BOST device.

In FIG. 1, a hatched signal line having a medium thickness depicts an address signal line; a black signal line having a medium thickness depicts a data signal line; and a narrow signal line depicts a control signal line. Further, a black, bold signal line depicts an input pattern signal line extending from the BOST device 20 to the DUT 10; a meshed bold signal line depicts a DUT output signal line extending from the DUT 10 to the BOST device 20; and a dotted bold signal line depicts an expectation pattern signal line with respect to the DUT 10.

The DUT board 11 is a circuit board disposed in the vicinity of the DUT 10 and acts as a tester-DUT I/F board for exchanging signals between the DUT 10 and the tester 18.

In FIG. 1, the DUT 10 is drawn within the DUT board 11. However, in practice the DUT board 11 and the DUT 10 are formed separately from each other, and signals are directly exchanged between the DUT board 11 and the DUT 10.

The BOST device (Built-Off Self Test device) 20 is an ancillary test device which does not depend on the tester 18 and is intended for assisting testing capability to carry out a built-in self test of the DUT 10 and expanding test capability of the tester 18.

The BOST device 20 includes a circuit board 201. The circuit board 201 is also called a BOST (Built-Off Self Test) board. This is a circuit board when the BOST device 20 is constituted of a single circuit board.

FIG. 1 illustrates that the BOST board 201 is within the DUT board 11, which shows that the BOST board 201 is to be disposed in the vicinity of the DUT board 11.

The BOST device 20 is further described in detail. The BOST device 20 has a hardware configuration shown in FIG. 1. Specifically, the BOST device 20 includes: (1) a BOST communication interface section (BOST communication I/F section) 30; (2) a CPU section 33; (3) a reference clock section 38; (4) a BOST control section 40; (5) a test pattern memory section (Test Pattern Memory/TPM section) 50; (6) a test pattern signal generator (Pattern Generator/PG section) 60; (7) a timing signal generator (Timing Generator/TG section) 70; (8) a waveform shaping section (Wave Form/WF section) 80; (9) an output determination section 85; (10) an error information memory section 90; (11) a DUT-BOST interface section (DUT-BOST I/F section) 95; and (12) a power supply section 99.

The BOST communication I/F section 30 is an interface for establishing communication between the tester 18 and the BOST device 20. The BOST communication I/F section 30 establishes communication between the TPM section 50 provided in the BOST device 20 and the tester 18; namely, writing of test pattern data TPD by the tester 18 into the TPM section 50, and reading of the test pattern data TPD by the tester from the TPM section 50. The BOST communication I/F section 30 receives an address signal ATP for writing and reading the test pattern data TPD. Further, the BOST communication I/F section 30 establishes the CPU section 33 of the BOST device 20 and the tester 18. More specifically, the tester 18 imparts a test code (test number) TCD and a test start signal TST to the CPU section 22 and imparts an error code (Pass/Fail information) ECD from the CPU section 33 to the tester 18.

Writing and reading of the test pattern data TPD into the TPM section 50 from another test data source can also be performed without use of the tester 18.

The CPU section 33 is a host computer of the BOST device 20 and formed from a digital signal processor (DSP) or a microprocessor. The CPU section 33 initializes individual sections of the BOST device 20 in accordance with the test code (test number) TCD and the test start signal TST imparted from the tester 18 by way of the BOST communication I/F section 30; performs diagnosis of the BOST device 20; and analyzes a test result. In accordance with the test code TCD, the CPU section 33 supplies a selection instruction signal SIS to a control section 40. The selection instruction signal SIS is an instruction signal for selecting test pattern data TPD to be executed from among a plurality of test pattern data TPD sets corresponding to a plurality of test items stored in the TPM section 50.

The reference clock section 38 generates a reference clock SCK and supplies the reference clock SCK to individual circuit portions of the BOST device 20 including the CPU section 33.

The BOST control section 40 controls the individual circuit portions of the BOST device 20 upon receipt of an instruction from the CPU section 33. Further, the BOST control section 40 also generates addresses to the TPM section 50 and the PG section 60 of the BOST device 20.

The TPM section 50 is memory for storing a digital test pattern data TPD. The test pattern data TPD serve as basic data to be used for generating a test input pattern signal TIP for the DUT 10, a test output pattern signal TOP output from the DUT 10, and other test pattern signals. A plurality of test pattern data sets TPD corresponding to various test items required for testing a digital circuit of various semiconductor integrated circuits are stored in the TPM section 50.

The TPM section 50 is constituted of semiconductor memory which is of relatively low speed and has a comparatively low operating frequency and large storage capacity. The large storage capacity of the semiconductor memory that constitutes the TPM section 50 is effective for storing a large volume of test pattern data TPD required for carrying out tests. Further, the comparatively low operating speed and the comparatively low operating frequency are effective for inexpensively miniaturizing the semiconductor memory constituting the TPM section 50. The BOST device 20 is disposed on the DUT board 11 near the DUT 10 and hence subjected to dimensional limitations. Miniaturization of the TPM section 50 is effective for making the entirety of the BOST device 20 more compact.

Specifically, the TPM section 50 is formed from a semiconductor memory device so as to assume large storage capacity, such as 10 gigabytes or 20 gigabytes. Further, the semiconductor memory constituting the TPM section 50 is embodied by semiconductor memory having a comparatively low operating frequency ranging from 10 to 20 megahertz. For instance, dynamic random access memory (DRAM), static random access memory (SRAM), and flash memory are used for semiconductor memory. The semiconductor memory is formed by combination of a plurality of sets of these memory devices.

The PG section 60 downloads test pattern data TPD corresponding to a test to be performed, from among the plurality of test pattern data sets TPD corresponding to the plurality of test items stored in the TPM section 50. On the basis of the thus-downloaded test pattern data TPD, the PG section 60 produces a test pattern signal TPS at high speed. On the basis of the test pattern data downloaded into the PG section 60, the PG section 60 also produces a test input/ determination pattern signal JPS. The test pattern signal TPS and the test input/determination pattern signal JPS are signals included in the test pattern data TPD. These signals are extracted as a result of the PG section 60 reading the test pattern data TPD downloaded from the TPM section 50.

The PG section 60 is formed from semiconductor memory which is faster than the semiconductor memory constituting the TPM section 50. The semiconductor memory constituting the PG section 60 has an operating frequency higher than that of the semiconductor memory constituting the TPM section 50 and reads the test pattern data ETPD at high speed. For example, the operating frequency ranges from 100 to 250 megahertz. Generation of a test pattern at high speed is effective for shortening a time required for reading the test pattern data ETPD and a time required for performing a test. The PG section 60 is smaller in storage capacity than the TPM section 50. For example, the PG section 60 has storage capacity ranging from, e.g., 256 megabits to 1 gigabits.

The TG section 70 receives a measurement start signal MST and an external clock signal OCK from the tester 18 and the reference clock signal SCK from the reference clock section 38, thereby producing various timing signals required for carrying out a test. The timing signals include a test cycle signal TCY to be used for determining a test cycle in synchronism with a measurement start signal MST, a clock signal CLK to be used for setting timings at which the test input pattern signal TIP input to the DUT 10 are to rise and fall, and a strobe signal (strobe cycle signal) STB to be used for setting a determination timing at which the test output pattern signal TOP output from the DUT 10 is to be determined. Among these timing signals, the test cycle signal TCY is also supplied to the BOST control section 40 and a flip flop 803 preceding the WF section 80 (FIG. 2); the clock signal CLK is supplied to the WF section 80; and the strobe signal STB is supplied to the output determination section 85.

The WF section 80 receives the test pattern signal TPS and the test input/determination pattern signal JPS from the PG section 60. Further, the WF section 80 receives the test cycle signal TCY and the clock signal CLK from the TG section 70, thereby producing a test input pattern signal TIP to be output to the DUT 10. The test input pattern signal TIP is supplied to the DUT 10 by way of the DUT-BOST I/F section 95.

The output determination section 85 determines a test output pattern signal TOP to be supplied from the DUT 10 by way of the DUT-BOST I/F section 95. More specifically, the test output pattern signal TOP and the test input pattern signal TPS output from the PG section 60 are determined at a timing of the strobe signal STB output from the TG section 70. The test pattern signal TPS supplied from the PG section 60 to the output determination section 85 is an expectation pattern signal corresponding to the test output pattern signal TOP output from the DUT 10. If the test output pattern signal TOP output from the DUT 10 is identical with the test pattern signal TPS, no error is determined to exist. If the test output pattern signal TOP output from the DUT 10 is different from the test pattern signal TPS that is an expectation pattern signal, an error data signal will be output.

The error information memory section 90 stores the error data signal output from the output determination section 85 and an address of a test pattern vector obtained at the time of occurrence of the error. The address of the test pattern vector is a vector address of the PG section 60; that is, a vector address of the PG section 60 when the output determination section 85 has determined the error. Here, a vector address of the test pattern vector signifies a series of group-basis addresses of the test pattern data TPD.

The DUT-BOST I/F section 95 supplies a test input pattern TIP to the DUT 10, receives the test output pattern signal TOP from the DUT 10, and supplies the test output pattern signal TOP to the output determination section 85. Further, the DUT-BOST I/F section 95 performs matching between an input voltage level of the test input pattern signal TIP and an output voltage level of the test output signal TOP, adjustment of the input and output voltage levels, and switching of connection of the input/output signal line to the DUT 10. Switching between the input signal line and the output signal line is performed by switching between a connection of the tester 18 to the DUT 10 and a connection of the BOST device 20 to the DUT 10.

The power supply section 99 receives a power supply from an external power source and provides various source voltages to the BOST device 20. The power supply section 99 includes voltage conversion from AC to DC and a voltage conversion from DC to DC.

FIG. 2 is a block diagram details pertaining to the BOST control section 40; the TG section 70; the WF section 80; the output determination section 85; the error information memory section 90; and the DUT-BOST I/F section 95 from among elements provided in the BOST device 20 shown in FIG. 1. In FIG. 2, a narrow signal line provided with a black dot depicts a data bus, and a signal line having a block dot and a medium thickness depicts an initial setting line.

The BOST control section 40 has memory address counters 401, 402. The memory address counter 401 advances a memory address signal MAD (shown in FIG. 3A) to be output to the PG section 60 every time the test cycle signal TCY (shown in FIG. 3D) is received from the TG section 70. The memory address signal MAD is an address signal corresponding to the test vector address. The memory address signal MAD is an address signal corresponding to the test vector address. The memory address signal MAD is supplied to the PG section 60 and a DATA terminal of the error information memory section 90. When having received a memory write signal MWR (shown in FIG. 3K) output from an inverse circuit 855 connected to an output stage of the output determination section 85, the memory address counter 402 supplies, to the error information memory section 90, an address specification signal MIS (shown in FIG. 3M) for specifying an address to be used for writing the error data signal EDT.

The TG section 70 has a test cycle signal generation circuit 700 for generating a test cycle signal TCY (shown in FIG. 3D), a clock signal generation circuit 710 for generating a clock signal CLK (shown in FIG. 3E), and a strobe signal generation circuit 715 for generating a strobe signal STB (shown in FIG. 3F).

The test cycle signal generation circuit 700 has a selection circuit 701, a selection circuit 702, a PLL circuit 703, an AND circuit 704, and a flip flop 705. The selection circuit 701 has an input A for receiving the reference clock signal SCK from the reference clock section 38, an input B for receiving an external clock signal OCK (shown in FIG. 3B) from the tester 18; a selection input S for receiving a selection signal S from the BOST control section 40; and an output F. If the selection input S is at a low level L, the output F from the selection circuit 701 is equal to the reference clock signal SCK. In contrast, if the selection input S is at a high level H, the output F becomes equal to the external clock signal OCK. The output F from the selection circuit 701 is supplied to the input A of the selection circuit 702 by way of the PLL circuit 703. The PLL circuit 703 performs phase locking of the reference clock signal CLK or the external clock signal OCK and is initialized by the BOST control section 40.

The selection circuit 702 has the input A, the input B for receiving the reference clock signal SCK, an input C for receiving an external clock signal OCK (shown in FIG. 3B), a selection input for receiving the selection signal S0/S1; and the output F. The output F from the selection circuit 702 is equal to the input A when the selection input S0 is at a low level L and the selection input S1 is also at a low level L. When the selection input S0 is at a high level H and the selection input S1 is at a low level L, the output F is equal to the reference clock input B. When the selection input S0 is at a low level L and the selection input S1 is at a high level H, the output F becomes equal to the external clock input C. The output F from the selection circuit 702 acts as one of inputs of the AND circuit 704.

The flip flop 705 has a clock input for receiving a measurement start signal MST (shown in FIG. 3C) from the tester 18; an input D connected to the supply voltage; and an output Q. The output Q of the flip flop 705 serves as the other input of the AND circuit 704. The AND circuit 704 outputs a logical AND product formed from the output F of the selection circuit 702 and the output Q of the flip flop 705. An output from the AND circuit 704 is a test cycle signal TCY. The test cycle signal TCY is shown in FIG. 3D and supplied to the memory address counter 401, to thereby advance a memory address count value. The test cycle signal TCY is also supplied to the clock signal generation circuit 710 and the strobe signal generation circuit 715.

The clock signal generation circuit 710 has a delay circuit 711. The delay circuit 711 delays the test cycle signal TCY supplied from the test cycle signal generation circuit 700 by only a delay time tclk, to thereby produce a clock signal CLK shown in FIG. 3E. The delay time tclk is initialized by the BOST control section 40.

The strobe signal generation circuit 715 has a delay circuit 716. The delay circuit 716 delays the test cycle signal TCY supplied from the test cycle signal generation circuit 700 by only an initially-set delay time tstb, thereby producing the strobe signal STB shown in FIG. 3F. The delay time tstb is initialized by the BOST control section 40.

As shown in FIG. 2, the WF section 80 has a flip flop 801 and an AND circuit 802. A flip flop 803 is connected to a stage preceding the flip flop 801 and the AND circuit 802. An input D1 of the flip flop 803 receives a test pattern TPS output from the PG section 60, and an input D2 of the same receives a test input determination pattern JPS. A clock input C of the flip flop 802 receives a test cycle signal TCY output from the test cycle signal generation circuit 700. The flip flop 803 outputs the test pattern signal TPS shown in FIG. 3H from an output Q1 in synchronism with the test cycle signal TCY and outputs the test input/determination pattern signal JPS shown in FIG. 3G from an output Q2 in synchronism with the test cycle signal TCY. The test pattern signal TPS output from the flip flop 803 is supplied to an input D of the flip flop 801 of the WF section 80. Further, the test input determination pattern JPS is supplied to one input (reverse input) of the AND circuit 802.

In conjunction with the test input/determination pattern signal JPS, the clock signal CLK output from the clock signal generation circuit 710 is input to the other input of the AND circuit 802. A logical AND product formed from these signals is supplied to a clock input of the flip flop 801. An output Q of the flip flop 801 outputs a test pattern signal TPS at a timing at which the clock signal CLK rises when the test input/determination pattern signal JPS shown in FIG. 3G is at a low level L; that is, when the test input/determination pattern JPS shows an input state. When the test input/determination pattern signal JPS shown in FIG. 3G is at a high level; that is, when the test input/determination pattern signal JPS shows a determination state, the output Q of the flip flop 801 retains the previous state without involvement of a change. Consequently, the output Q from the flip flop 801 becomes the test input pattern signal TIP and is supplied to the DUT 10 by way of a three-state buffer 951 of a DUT-BOST I/F section 95.

The output determination section 85 has an exclusive OR circuit 851, an AND circuit 852, a flip flop 853, and a pulse generation circuit 854. A test pattern signal TPS (shown in FIG. 3H) output from the flip flop 803 is input to one input of the exclusive OR circuit 851. A test output pattern signal TOP (shown in FIG. 3I) output from an input buffer circuit 952 of the DUT-BOST I/F section 95 is input to the other input of the exclusive OR circuit 851. The exclusive OR circuit 851 compares the test output pattern signal TOP with the test pattern signal TPS. If a match exists between the signals, the exclusive OR circuit 851 produces a low-level output L. If no match exists, a high-level output H is output, thereby indicating an error state.

An output from the exclusive OR circuit 851 becomes an input D of the flip flop 853. One input of the AND circuit 852 receives the test input/determination pattern signal JPS output from the flip flop 803. The other input of the AND circuit 852 receives the strobe signal STB output from the strobe signal generation circuit 715. An output from the AND circuit 852 becomes a clock input C of the flip flop 853. Here, when the test input/determination pattern signal JPS shows an input state, the output determination section 85 determines the clock signal CLK as being valid and the strobe signal STB as being invalid. When the test input/determination pattern signal JPS shows a determination state, the output determination section 85 determines the clock signal CLK as being invalid and the strobe be signal STB as being valid. The test pattern signal TPS is compared with the test output pattern signal TOP at the timing of the strobe signal STB.

An output Q from the flip flop 853 outputs an input D obtained at the timing of the strobe signal STB; that is, the value of the output from the AND circuit 852, when the test input/determination pattern signal JPS shown in FIG. 3G is high level H; that is, when the test input/determination pattern signal JPS shows a determination state. When the test input/determination pattern signal JPS is at a low level L; that is, when the test input/determination pattern signal JPS shows an input state, the output Q from the flip flop 853 retains a previous value without a change. Consequently, an output from the flip flop 853 becomes an error data signal EDT shown in FIG. 3J.

In the timing chart shown in FIG. 3, when the memory address signal MAD shown in FIG. 3A shows addresses of 1, 2, 3, 5, and 6, the test input/determination pattern signals JPS shown in FIG. 3G each show an input state. The clock signal CLK is made valid; the strobe signal STB is made invalid; and the test input pattern signal TIP is input to the DUT 10. When the memory address MAD assumes an address of four, the test input/determination pattern signal JPS shows a determination state. At this time, the clock signal CLK is made invalid, and the strobe signal STB becomes valid. A determination is made at the timing of the strobe signal STB. In FIG. 3, when the memory address signal MAD assumes an address of four, the test pattern signal TPS is zero, and an expectation value for the test output pattern signal TOP is zero. In contrast, since the test output pattern signal TOP shown in FIG. 3I assumes a value of one at this time, the output Q of the flip flop 853 of the output determination section 85 becomes a high level H, whereupon the error data signal EDS shown in FIG. 3J rises.

The error data signal EDT is supplied to a DATA input of an error information memory section 90 and also to the pulse generation circuit 854. The pulse generation circuit 854 imparts a pulse input to an inverse circuit 855. The inverse circuit 855 produces a memory write signal MWR shown in FIG. 3K and supplies the memory write signal MWR to a clock input of the memory address counter 402 and also to a WR input of the error information memory section 90. The error information memory section 90 stores the error data signal EDT and the memory address signal MAD (shown in FIG. 3A) output from the memory address counter 401 at the timing of a memory write signal MWR. An address specification signal MIS output from the memory address counter 402 specifies a storage address.

The DUT-BOST I/F section 95 has an input/output changeover circuit 950, an I/F voltage level conversion circuit 955, and a tester/BOST changeover circuit 960. The input/output changeover circuit 950 has a three-state buffer 951 and a buffer 952. The three-state buffer 951 has a control input for receiving the test input/determination pattern signal JPS output from the flip flop 803; an input for receiving an output Q from the flip flop 801, that is, a test input pattern signal TIP; and an output. When the test input/determination pattern signal JPS is at a low level L; that is, the test input/determination pattern signal JPS shows an input state, the three-state buffer 951 outputs a test input pattern signal TIP. When the test input/determination pattern signal JPS shows a high-level H; that is, when the test input/determination pattern signal shows a determination state, the three-state buffer 951 does not produce any output.

Since the buffer 952 shows a buffer for shaping an input signal, an output from the buffer is supplied to the other input of the exclusive OR circuit 851 of the output determination section 85. The I/F voltage level conversion circuit 955 has a MOS transistor 956. A gate of the MOS transistor 956 receives the reference voltage VS from an analog output of the digital-to-analog conversion circuit 957. A drain of the MOS transistor 956 is connected to the output of the three-state buffer 951 and the input of the buffer 952. The source of the buffer is connected to a tester/BOST changeover circuit 960. Source and drain voltages of the MOS transistor 956 are converted in accordance with the reference voltage VS imparted to the gate voltage. For instance, when the supply voltage of the DUT 10 is a low voltage for a three-volt system, the three-volt system and the voltage of the BOST device 20 is five volts, the level of a test input pattern signal TIP is converted to three volts, and the test output pattern signal TOP output from the DUT 10 is converted from three volts to five volts. The digital-to-analog conversion circuit 957 is given a voltage output from the power supply section 99. The digital-to-analog conversion circuit 957 is initialized by the BOST control section 40.

The tester/BOST changeover circuit 960 has a changeover switch 961. The changeover switch 961 has a common terminal C connected to the DUT 10, a terminal A connected to the tester 18, and a terminal B connected to the source of the MOS transistor 956. While the terminals B and C remain connected, the source of the MOS transistor 956 is connected to the DUT 10, and the BOST device 20 performs a test. While the terminals A and C remain connected, the tester 18 and the DUT 10 are connected directly to each other, and the tester 18 performs a test.

Operations of the first embodiment shown in FIGS. 1, 2, and 3 will be collectively described.

First, the initializing operation comprises the following four operations.

(1) Writing of test pattern data TPD
(2) Transmission of test code number TCD (3) Initial settings to be performed within the BOST device 20

(4) Setting of initial conditions to be performed within the BOST device 20

(1) Writing of Test Pattern Data TPD

Test pattern data TPD corresponding to a plurality of test items required for testing a digital circuit of various semiconductor integrated circuits are written from the tester 18 or another data source into the TMP section 50 by way of the BOST communication I/F section 30. Instead of writing the test pattern data TPD, the TMP section 50 into which test pattern data are previously written can be attached to the BOST device 20.

(2) Transmission of a Test Code Number TCD

The test codes TCD corresponding to test items to be carried out are transmitted from the tester 18 to the CPU section 33 by way of the BOST communication I/F section 30.

(3) Initial Settings to be Performed within the BOST Device 20

Upon receiving the test code TCD, the CPU section 33 initializes the TMP section 50, the PG section 60, and the TG section 70. Initialization of the TMP section 50 is performed by setting a start address and a stop address of the test pattern data TPD to be executed in correspondence to the test code TCD in the memory of the TMP section 50.

Initialization of the PG section 60 is performed by setting a start address and a stop address, both being used for writing the test pattern data TPD to be executed, into the memory of the PG section 60. Initialization of the TG section 70 is performed by setting a timing of the test cycle signal TCY while the reference signal to be used is taken as the reference clock signal CLK. After initialization of the TMP section 50, the PG section 60, and the TG section 70 has been completed, the test pattern data which have been selected from the plurality of test pattern data sets TPD and are to be executed-are downloaded from the TMP section 50 to the PG section 60.

(4) Setting of Initial Conditions to be Performed within the BOST Device 20

After completion of the initial settings (3), the initial conditions are set to the error information memory section 90, the TG section 70, and the DUT-BOST I/F section 95.

Setting of initial conditions to the error information memory section 90 is performed by setting a start address and a stop address to the error information memory section 90. Setting of initial conditions to the TG section 70 is performed by selecting a reference clock signal CLK to be used for testing and an external clock signal OCK, and by setting timing data to be used for generating the test cycle signal TCY, the clock signal CLK, and the strobe signal STB.

Initial conditions are set to the DUT-BOST I/F section 95 by setting a reference voltage VS to the gate of the MOS transistor 956.

After the initialization and setting of initial conditions have been completed, testing operation is performed through the following operations (1) through (4). Test operations (1) through (4) are sequentially performed.

(1) The test pattern data downloaded into the PG section 60 are read from the PG section 60, and a test pattern signal TPS and the test input/determination pattern signal JPS, both being included in the test pattern data, are output in synchronism with the test cycle signal TCY.

(2) The WF section 80 outputs the test input pattern signal TIP oriented to the DUT 10. The test input pattern signal TIP is supplied to the DUT 10 by way of the DUT-BOST I/F section 95.

(3) The test output pattern signal TOP is sent from the DUT 10 to the output determination section 85 by way of the DUT-BOST I/F section 95. The output determination section 85 compares the test output pattern signal TOP with the test pattern signal TPS, which serves as an expectation pattern signal for the signal output from the DUT 10, thereby checking occurrence of an error. When occurrence of an error is ascertained, the test pattern vector address MAD obtained at the time of occurrence of an error is stored in the error information memory section 90 along with the error data signal EDS.

(4) The test operations (1) through (3) are repeated until reading of the test pattern data TPD to be executed from the PG section 60 is completed.

Determination of test results is performed by the CPU 33 reading the error data signal EDT stored in the error information memory section 90 and the address MAD obtained at the time of occurrence of an error, determining the test results as a pass or a failure, and transmitting determination results to the tester 18 by way of the BOST communication I/F section 30. On the basis of the data pertaining to the error information memory section 90, various errors can be analyzed.

In the first embodiment, the TPM section 50 stores a plurality of test pattern data sets TPD corresponding to a plurality of test items to be used for testing a digital circuit of the DUT 10, and writes the test pattern data selected from the plurality of test pattern data sets TPD into the PG section 60. By means of such a configuration, the capability to test the digital circuit of the DUT 10 can be easily expanded without development of a special custom-designed tester by expanding the test pattern data to be stored into the TPM section 50. The ancillary test device 20 can quickly test the digital circuit by storing required test pattern data into the TPM section 50 beforehand.

In the first embodiment, the semiconductor memory constituting the TPM section 50 is formed so as to have storage capacity greater than that of the semiconductor memory constituting the PG section 60. The TPM section 50 can store a larger amount of test pattern data. As a result, the number of types of function tests which can be performed by the BOST device 20 is increased, and the BOST device 20 can perform an efficient test in a larger number of function tests.

In the first embodiment, the semiconductor memory constituting the PG section 60 is made faster than the semiconductor memory constituting the TPM section 50. Specifically, the semiconductor memory constituting the PG section 60 has an operating frequency—which is higher than that of the semiconductor memory constituting the TPM section 50—and operates at high speed. These features are effective for increasing the rate at which the test pattern data are read from the PG section 60. Consequently, the BOST device 20 can test the digital circuit of the DUT 10 at faster speed, thereby shortening the test time. The semiconductor memory of the TPM section 50 operates at low speed. However, this feature is effective for rendering the semiconductor memory constituting the TPM section 50 inexpensive and compact.

In the embodiment 1, in order to select one from the plurality of test pattern data stored in the TPM section 50, the CPU section 33 supplies the selection instruction signal SIS to the BOST control section 40. By means of such a configuration, the test pattern data corresponding to the selection instruction signal SIS are accurately transferred to the PG section 60.

There will now be described embodiments 1-1 to 1-12 pertaining to the apparatus for testing a semiconductor integrated circuit according to the invention, wherein the hardware configuration of the apparatus of the first embodiment has been expanded and modified.

Embodiment 1-1

Embodiment 1-1 is an embodiment of implementation of the apparatus for testing a semiconductor integrated circuit according to the invention. Embodiment 1-1 has a BOST assembly 210A constituting the BOST device 20. The BOST assembly 210A is formed by combination of five circuit boards 211 through 215.

FIG. 4A is a conceptual rendering of the configuration of the boards of the BOST assembly 210A, and FIG. 4B is a perspective external view of the BOST assembly 210A.

The BOST assembly 210A of embodiment 1-1 is disposed on a DUT board 110 and formed by combination of five circuit boards 211, 212, 213, 214, and 215. The two circuit boards 211, 212 are disposed in parallel with the DUT board 110, and three circuit boards 213, 214, and 215 are disposed perpendicular to the DUT board 110. The circuit board 211 is disposed at a position immediately above the DUT board 110, and the circuit board 212 is disposed on the circuit board 211. The circuit boards 213, 214, and 215 are disposed on the circuit board 212. The circuit board 211 is connected to the DUT board 110, and the circuit board 212 is connected to the circuit board 211. The circuit boards 213, 214, and 215 are connected to the circuit board 212.

Circuit boards (1) to (12) of the BOST device 20 shown in FIG. 1 are provided on the circuit boards 211, 212, 213, 214, and 215. The circuit board 211 constitutes a first BOST I/F section, and the DUT board 110 and the BOST device 20 are connected by means of signals. In addition, the power supply section 99 of the BOST device 20 is mounted on the circuit board 211. The circuit board 212 constitutes a second BOST I/F section, thereby connecting together the circuit boards 211, 212, 213, 214, and 215. Peripheral circuits (such as a line switching relay circuit) required for testing the DUT 10 are also mounted on the circuit board 212. The circuit board 212 is prepared for each kind of the DUT 10. The CPU section 33 is disposed on the circuit board 213. Further, the BOST communication I/F section 30 is provided on the circuit board 214. Mounted on the circuit board 215 are the BOST control section 40, the TMP section 50, the PG section 60, the output determination section 85, the error information memory section 90, and the DUT-BOST I/F section 95.

In the embodiment 1-1, the circuit boards 211, 212, 213, 214, and 215 can be selected in accordance with the BOST function required by the DUT 10 and combined together, thereby facilitating expansion of the capability of the BOST device 20 and improving flexibility in modifying the BOST device 20. There is no necessity for combining together pieces of undesired hardware. The BOST device 20 can be made compact and inexpensive.

For instance, the circuit boards 211, 213, and 214 are taken as standard boards (i.e., boards required at all times), and the circuit boards 212, 215 are replaced and changed in accordance with the type of the DUT 10. The ease of recycling of the standard boards is improved, in pursuit of cost reduction. Since embodiment 1-1 enables combination of only required boards, cost reduction and miniaturization of the apparatus can be achieved.

Embodiment 1-2

Embodiment 1-2 is an embodiment pertaining to the apparatus for testing a semiconductor integrated circuit of the invention. Embodiment 1-2 has a BOST assembly 210B which is more simplified than the BOST assembly 210A described in connection with embodiment 1-1. FIG. 5 shows a developed view of the BOST assembly 210B of embodiment 1-2. FIG. 5A is a front view showing the basic configuration of the BOST assembly 210B: FIG. 5B is a side view showing the circuit boards 213, 214, and 215; FIG. 5C is a block diagram of an angle connector; and FIG. 6 is a side view showing a specific configuration of the BOST assembly 210B.

First, as shown in FIG. 5A, the circuit boards 213, 214, and 215 are rectangular boards that are slightly elongated in the vertical direction, and straight-type connectors CN2, CN3 to be used for connecting together the circuit boards 213, 214, and 215 are provided at front and back upper ends of the respective circuit boards 213, 214, and 215. Angle-type connectors CN1 to be used for connecting the circuit boards 213, 214, and 215 to the upper main surface of the circuit board 212 are provided at lower ends of the respective circuit boards 213, 214, and 215. As shown in FIG. 5C, the angle-type connector CN1 is a plug gain connector, wherein a signal pin 216 is bent at right angles at a midpoint thereof so as to become parallel with the main surfaces of the respective circuit boards 213, 214, and 215. The straight-type connectors CN2, CN3 are connectors, wherein signal pins extend in a direction perpendicular to the main surfaces of the respective circuit boards 213, 214, and 215.

The straight-type connectors CN4, CN5, and CN6—into which the angle-type connectors CN1 disposed at the lower ends of the respective circuit boards 213, 214, and 215 are to be inserted at right angles—are provided on the upper main surface of the circuit board 212. Straight-type connectors CN7, CN8, and CN9 to be used for connection with the circuit board 211 are provided on a lower main surface of the circuit board 212. Straight-type connectors CN10, CN11, and CN12 to be used for connection with the circuit board 212 are provided on the upper main surface of the circuit board 211. Any one of several types of connections; that is, (a) fixed wiring connection using a cable, (b) interconnection using connectors, and (c) a cable connection by way of a connector, is used for establishing connection between the circuit board 211 and the DUT board 110. The fixed wiring connection (a) is not removable, but the connections (b) and (c) are removable.

Figure 6:
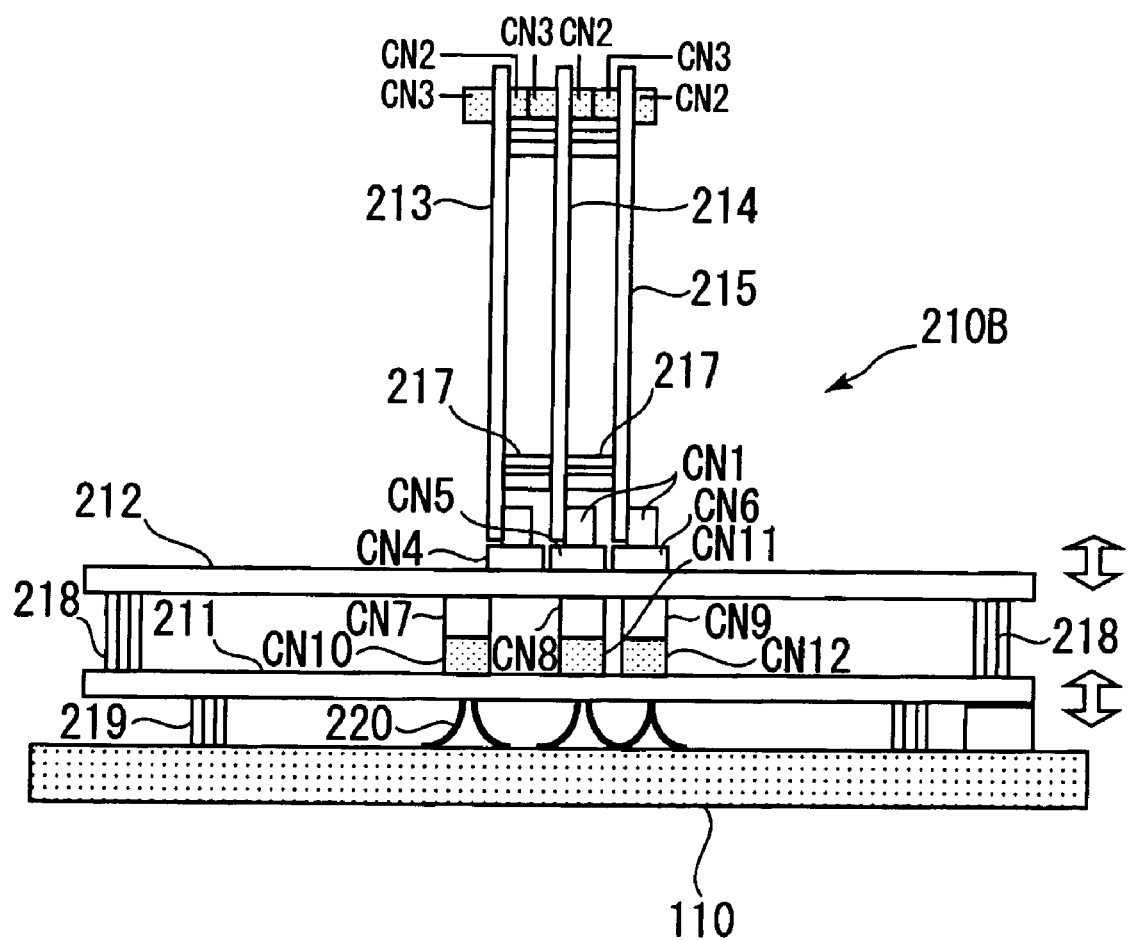
FIG. 6 is a side view showing a specific configuration of the BOST assembly 210B.

The specific BOST assembly 210B shown in FIG. 6 is a combination of the circuit boards 211, 212, 213, 214, and 215. The circuit boards 213, 214, and 215 are combined together while the connectors CN2, CN3 provided at the upper ends of the circuit boards 213, 214, and 215 are fitted together. The connectors CN1 provided at the lower ends of the circuit boards are fitted into the connectors CN4, CN5, and CN6 of the circuit board 212. Spacers 217 are interposed between the circuit boards 213, 214, and 215. The circuit board 212 is assembled by fitting connectors CN7, CN8, and CN9 provided on a lower main surface of the circuit board 212 into connectors CN10, CN11, and CN12 of the circuit board 211. Pillars or spacers 218 are interposed between the circuit boards 211, 212. The circuit board 211 is placed on the DUT board 110 via spacers 219. In the embodiment shown in FIG. 6, the circuit board 211 is mechanically fixed and electrically connected to the DUT board 110 by means of the fixed wiring connection 220.

The BOST device 20 is assembled into a module in accordance with required BOST capability and split into the five circuit boards 211, 212, 213, 214, and 215, thereby rendering the BOST assembly 210B compact. Further, as a result of the BOST device 20 being assembled into a module, flexibility of functional expansion and structural modification of the BOST device 20 is improved. For example, the circuit boards 211, 213, and 214 are taken as standard boards, and the circuit boards 212, 215 are replaced and changed according to the type of the DUT 10, thereby improving the ease of recycling of the standard boards and curtailing costs.

Embodiment 1-3

Figure 7:
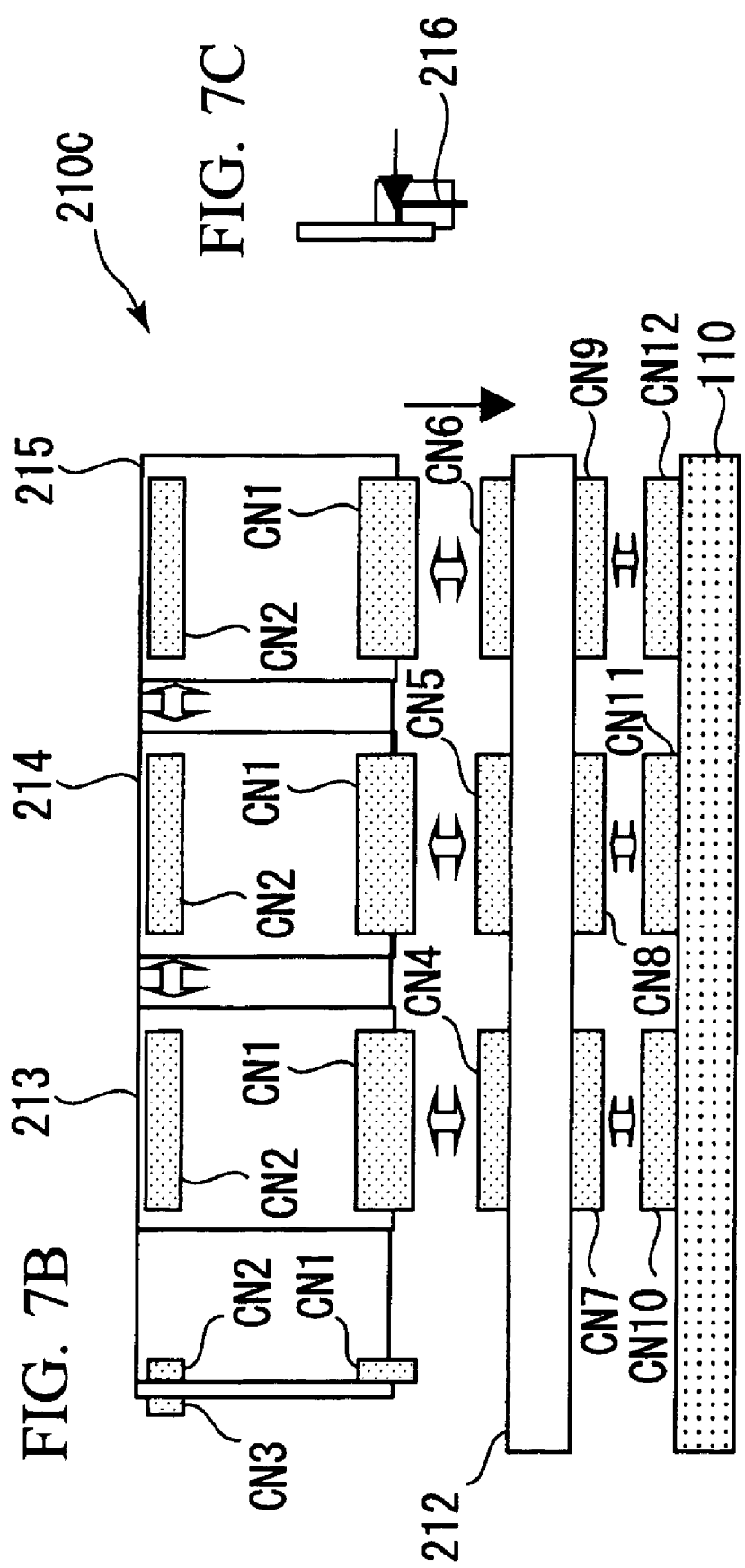
FIG. 7 is a developed view showing the BOST assembly 210C of embodiment 1-3.
Figure 8:
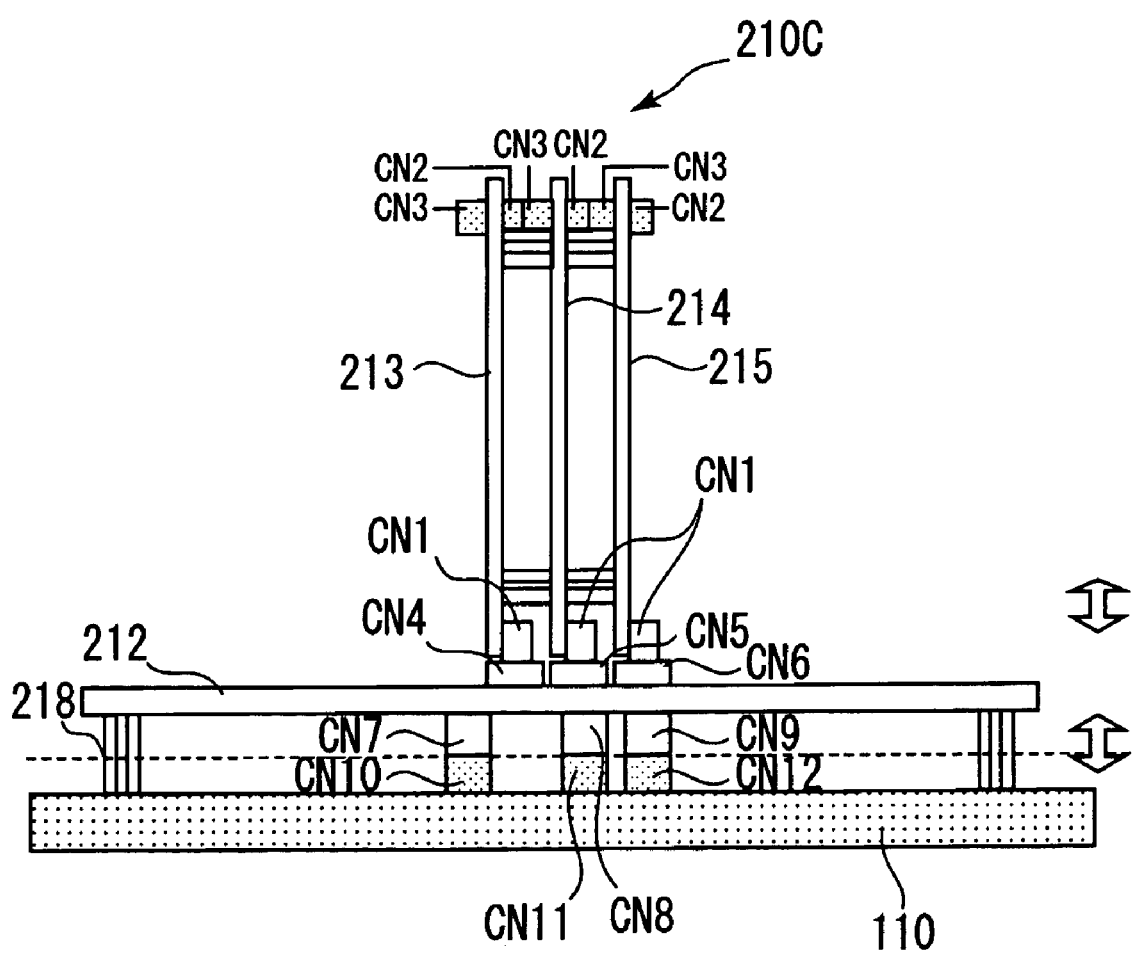
FIG. 8 is a specific block diagram of the BOST assembly 210C.

Embodiment 1-3 is an embodiment for implementing the apparatus for testing a semiconductor integrated circuit of the invention and has another BOST assembly 210C which is more simplified than the BOST assembly 210B described in connection with embodiment 1-2. FIG. 7 is a developed view showing the BOST assembly 210C of embodiment 1-3. FIG. 7A is a front view of the circuit boards 212, 213, 214, and 214 of the BOST assembly 210C. FIG. 7B shows side views of the circuit boards 213, 214, and 215. FIG. 7C is a block diagram of the angle-type connector. FIG. 8 is a specific block diagram of the BOST assembly 210C.

In relation to the BOST assembly 210B of embodiment 1-2, the circuit board 211 is omitted from the BOST assembly 210C, and hence the BOST assembly 210C is formed from four circuit boards 212, 213, 214, and 215. In other respects, the BOST assembly 210C is identical in configuration with the BOST assembly 210B of embodiment 1-2, and hence like elements are assigned like reference numerals and their repeated explanations are omitted. In the BOST assembly 210C of embodiment 1-3, the circuit board 212 has the capability to interconnect the BOST device 20 and the DUT board 110 as well as the capability to interconnect the circuit boards 213, 214, and 215. In embodiments 1-1, 1-7, the power supply section 99 mounted on the circuit board 211 is provided on the DUT board 110 or the circuit board 213. The connectors CN7, CN8, and CN9 provided on the lower main surface of the circuit board 212 are fitted into the connectors CN10, CN11, and CN12 provided on the upper main surface of the DUT board 110 in a plug-in form.

The BOST assembly 210C of embodiment 1-3 involves use of four circuit boards. The smaller BOST assembly 210C can be formed from circuit boards which are smaller in number than those used in embodiments 1-1, 1-7.

Embodiment 1-4

Figure 9:
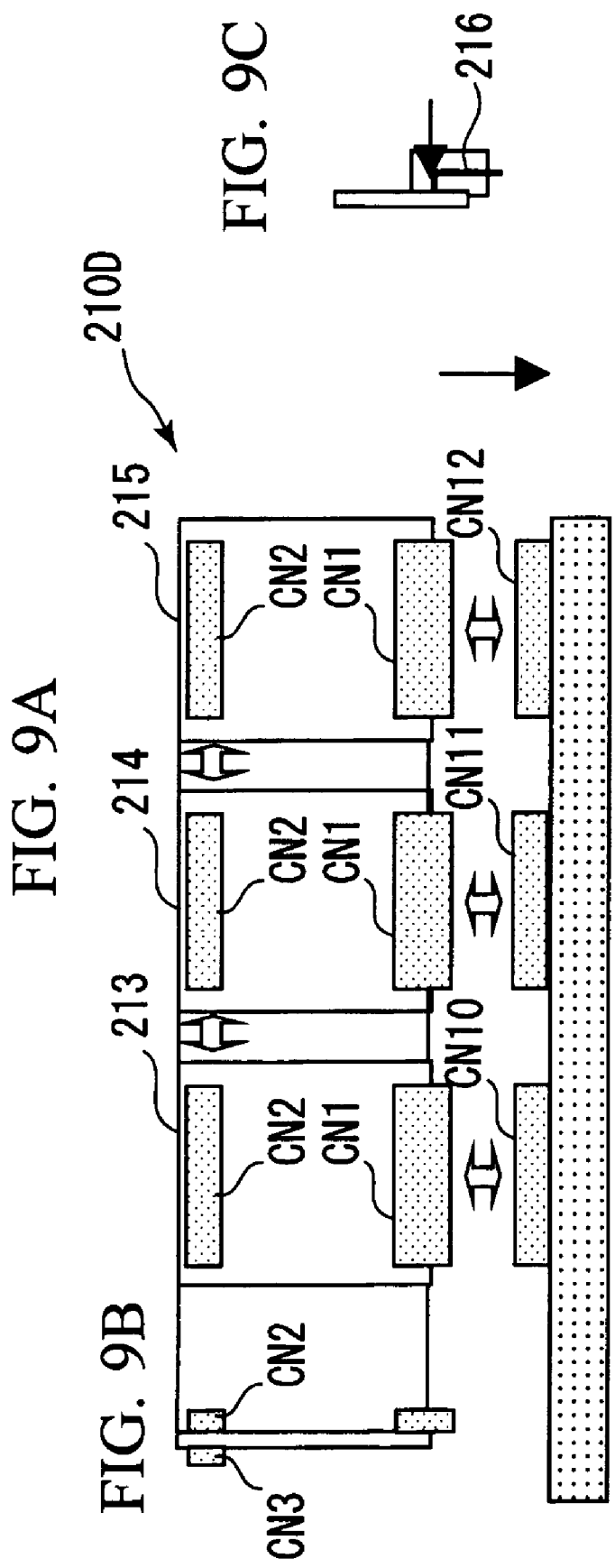
FIG. 9 is a developed view showing the BOST assembly 210D described in connection with embodiment 1-4.
Figure 10:
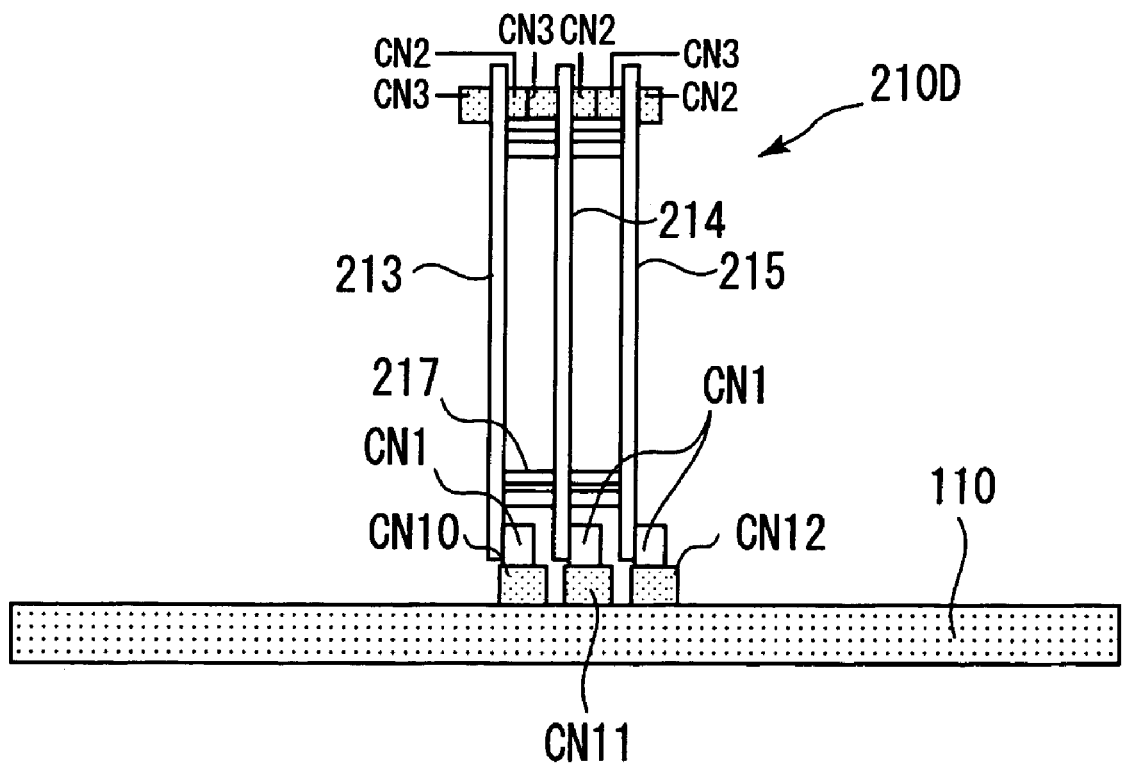
FIG. 10 is a specific block diagram of the BOST assembly 210D.

Embodiment 1-4 is an embodiment for implementing the apparatus for testing a semiconductor integrated circuit of the invention and has another BOST assembly 210D which is more simplified than the BOST assembly 210C described in connection with embodiment 1-3. The BOST assembly 210D is formed from three circuit boards 213, 214, and 215. FIG. 9 is a developed view showing the BOST assembly 210D described in connection with embodiment 1-4. FIG. 9A is a front view of the circuit boards 213, 214, and 215 of the BOST assembly 210D; FIG. 9B is a side view of the circuit boards 213, 214, and 215; FIG. 9C is a block diagram showing an angle-type connector; and FIG. 10 is a specific block diagram of the BOST assembly 210D.

The BOST assembly 210D is formed from three circuit boards 213, 214, and 215 by omitting the circuit board 212 of the BOST assembly 210C of embodiment 1-3. In other respects, the BOST assembly 210D is identical in configuration with the BOST assembly 210C shown in FIGS. 7 and 8. Those elements which are the same as those of the BOST assembly 210C are assigned the same reference numerals, and their repeated explanations are omitted. In the BOST assembly 210D of embodiment 1-4, the DUT board 110 has the capability to interconnect the BOST device 20 and the tester 18, as well as the capability to interconnect the circuit boards 213, 214, and 215. The power supply section 99 of the BOST device 20 is provided on the DUT board 110 or the circuit board 213. The relay circuit is also mounted on the DUT board 110 or the circuit board 213. The connectors CN1 provided at the lower ends of the three circuit boards 213, 214, and 215 are fitted into the connectors CN10, CN11, and CN12 provided on the upper main surface of the DUT board 100 in a plug-in form in a direction parallel to the main surfaces of the circuit boards 213, 214, and 215.

In relation to the BOST assembly 210D of the embodiment 1-4, the number of circuit boards is further reduced by one, and hence three circuit boards are employed. There is obtained the BOST assembly 210D which is more compact than the BOST assembly 210C of the embodiment 1-3.

Embodiment 1-5

Embodiment 1-5 is an embodiment for implementing the apparatus for testing a semiconductor integrated circuit of the invention and has another BOST assembly 210E. In the BOST assemblies 210B, 210C, and 210D described in connection with embodiments 1-2, 1-3, and 1-4, the circuit boards 213, 214, and 215 are disposed at right angles to the DUT board 110. However, embodiment 1-5 has a BOST assembly 210E, in which the circuit boards 213, 214, and 215 are disposed in parallel with the DUT board. FIG. 11A is a side view of the BOST assembly 210E; FIG. 11B is a front view of the BOST assembly 210E; and FIG. 11C is a block diagram of a straight-type connector.

Embodiment 1-5 employs the rectangular circuit boards 211, 212. The circuit boards 211, 212 are arranged in parallel with the DUT board 110. The circuit board 211 is disposed at a position immediately above the DUT board 110 and mechanically fixed and electrically connected to the DUT board 110 by means of the fixed wiring connection 220. The circuit board 212 is disposed on the circuit board 211 by way of the pillars or spacers 218. The three rectangular circuit boards 213, 214, 215 are arranged side by side on a common plane parallel to the circuit board 212. Individual circuit portions (1) to (12) of the BOST device 20 mounted on the circuit boards 211, 212, 213, 214, and 215 are assigned in the same manner as described in connection with embodiment 1-1.

The connectors CN1 are provided on the right ends on the lower surfaces of the respective circuit boards 213, 214, 215. The connectors CN2 are provided on the left ends on the lower surfaces of the respective circuit boards 213, 214, and 215. The connectors CN3 are provided on the left ends of the upper surfaces of the circuit boards 213, 214, and 215. Three connectors CN4 and three CN5 are provided on the upper surface of the circuit board 212. The connectors CN1 of the circuit boards 213, 214, and 215 are fitted into the connectors CN4, and the connectors CN2 of the same are fitted into the connectors CN5. Connectors CN6, CN7 are provided on the lower main surface of the circuit board 212. The connectors CN6, CN7 are fitted to connectors CN8, CN9 provided on the upper main surface of the circuit board 211. All the connectors used in embodiment 1-5 are of a straight type shown in FIG. 11C and have signal pins 221 perpendicular to the main surface of the circuit board.

The BOST assembly 210E of embodiment 1-5 includes the circuit boards 213, 214, and 215 arranged side by side on the common plane parallel to the DUT board 110, thereby shortening the vertical dimension of the BOST assembly 210E.

Embodiment 1-6

Figure 12:
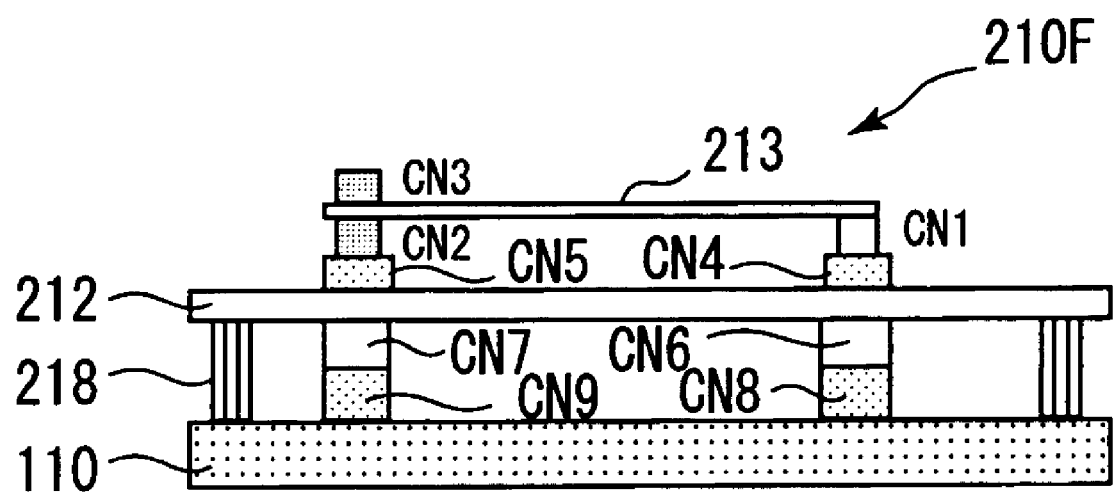
FIG. 12 is a side view of the BOST assembly 210F.

Embodiment 1-6 is an embodiment for implementing the apparatus for testing a semiconductor integrated circuit of the invention and has another BOST assembly 210F which is more simplified than the BOST assembly 210E described in connection with embodiment 1-5. FIG. 12 is a side view of the BOST assembly 210F. The BOST assembly 210F is embodied by omitting the circuit board 211 of the BOST assembly 210E described in connection with embodiment 1-5. In other respects, the BOST assembly 210F is identical in configuration with the BOST assembly 210E described in connection with embodiment 1-5. Those elements which are the same as those of the BOST assembly 210E are assigned the same reference numerals, and their repeated explanations are omitted. The BOST assembly 201F is identical with the BOST assembly 210C described in connection with embodiment 1-3, in that the circuit board 211 is omitted. The circuit components (1) to (12) to be mounted are assigned in the same manner as in embodiment 1-3. The connectors CN6, CN7 of the circuit board 212 are fitted into the connectors CN8, CN9 provided on the DUT board 110.

According to embodiment 1-6, the number of circuit boards of the BOST assembly 210F can be made smaller than those of the BOST assembly 210E described in connection with embodiment 1-5. As a result, the more simplified BOST assembly 210F can be obtained.

Embodiment 1-7

Figure 13:
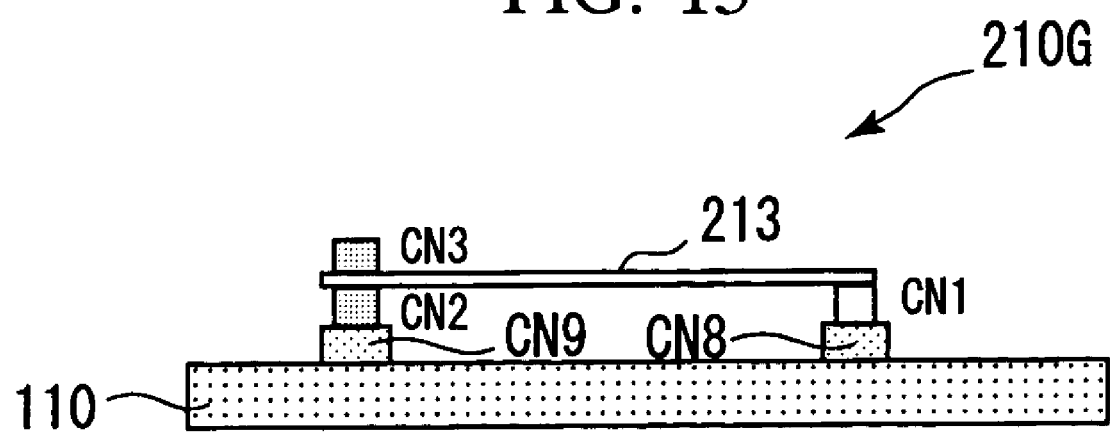
FIG. 13 is a side view of the BOST assembly 210G.

Embodiment 1-7 is an embodiment for implementing the apparatus for testing a semiconductor integrated circuit of the invention and has another BOST assembly 210G which is more simplified than the BOST assembly 210F described in connection with embodiment 1-6. FIG. 13 is a side view of the BOST assembly 210G. The BOST assembly 210G is embodied by omitting the circuit board 212 of the BOST assembly 210F described in connection with embodiment 1-6. In other respects, the BOST assembly 210G is identical in configuration with the BOST assembly 210F described in connection with embodiment 1-6. Those elements which are the same as those of the BOST assembly 210F are assigned the same reference numerals, and their repeated explanations are omitted. The BOST assembly 201G is identical with the BOST assembly 210D described in connection with embodiment 1-4, in that the circuit boards 211, 212 are omitted. The circuit components (1) to (12) to be mounted are assigned in the same manner as in embodiment 1-4. The connectors CN1, CN2 of the circuit boards 213, 214, and 215 are fitted into the connectors CN8, CN9 provided on the DUT board 110.

According to embodiment 1-7, the number of circuit boards of the BOST assembly 210G can be made smaller than those of the BOST assembly 210G described in connection with embodiment 1-6. As a result, the more simplified BOST assembly 210G can be obtained.

Embodiment 1-8

Embodiment 1-8 is an embodiment for implementing the apparatus for testing a semiconductor integrated circuit of the invention and has another BOST assembly 210H. In the BOST assembly 210H, the circuit boards 213, 214, and 215 are disposed in parallel with the DUT board 110 while being spaced apart from each other. FIG. 14A is a side view of the BOST assembly 210H; FIG. 14B is a front view of the BOST assembly 210H; and FIG. 14C is a block diagram of a straight-type connector. The connector has the signal pin 221 perpendicular to the main surface of the circuit board.

The BOST assembly 210H employs the rectangular circuit boards 211, 212. The circuit boards 211, 212 are arranged at upper portions of the DUT board 110 while being spaced apart from each other. The circuit board 211 is disposed at a position immediately above the DUT board 110 and mechanically supported on and electrically connected to the DUT board 110 by means of the fixed wiring connection 220. The circuit board 212 is disposed on the circuit board 211 by way of the pillars or spacers 218. The circuit boards 213, 214, 215 are stacked above the circuit board 212 while remaining spaced apart from and in parallel with each other. The circuit board 213 is arranged immediately above the circuit board 212; the circuit board 214 is arranged above the circuit board 213: and the circuit board 215 is arranged above the circuit board 214. The individual circuit portions (1) to (12) of the BOST device 20 mounted on the circuit boards 211, 212, 213, 214, and 215 are assigned in the same manner as described in connection with embodiment 1-1. Here, the capability to interconnect the circuit boards 213, 214, and 215 is imparted to connectors to be interposed between the circuit boards. Hence, the capability to interconnect the circuit boards 213, 214, and 215 is omitted from the circuit board 212.

The connectors CN1 are provided on the right ends on the lower surfaces of the respective circuit boards 213, 214, 215. The connectors CN4 are provided on the upper surfaces of the respective circuit boards 213, 214, and 215. The connectors CN2 are provided on the left ends of the lower surfaces of the circuit boards 213, 214, and 215. The connectors CN3 are provided on the upper surfaces of circuit boards 213, 214, and 215. The connectors CN1, CN2 of the circuit board 215 are fitted into the connectors CN3, CN4 of the circuit board 214. The connectors CN1, CN2 of the circuit board 214 are fitted to the connectors CN3. CN4 of the circuit board 213. The connectors CN1, CN2 of the circuit board 213 are fitted into the connectors CN1, CN2 of the circuit board 212. The connectors CN3, CN4 of the circuit board 212 are fitted into the connectors CN1, CN2 of the circuit board 211. All these connectors are of a straight type shown in FIG. 14C.

In the BOST assembly 210H of embodiment 1-8, the circuit boards 213, 214, and 215 are stacked in parallel with the DUT board 110 while being spaced apart from each other, thereby shortening the vertical dimension of the BOST assembly 210H.

Embodiment 1-9

Figure 15:
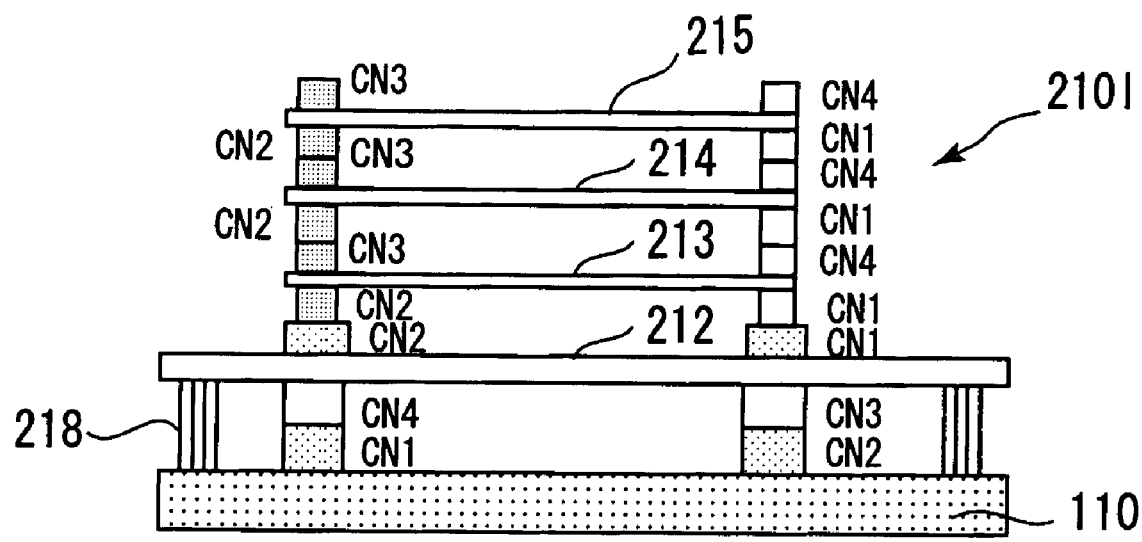
FIG. 15 is a side view of the BOST assembly 210I connected in connection with embodiment I-9.

Embodiment 1-9 is an embodiment for implementing the apparatus for testing a semiconductor integrated circuit of the invention and has another BOST assembly 210I formed by simplifying the BOST assembly 210H described in connection with embodiment 1-8. FIG. 15 is a side view of the BOST assembly 210I connected in connection with embodiment I-9.

The BOST assembly 210I is simplified by omitting the circuit board 211 of the BOST assembly 210H described in connection with embodiment 1-8. In other respects, the BOST assembly 210I is identical in configuration with the BOST assembly 210H described in connection with embodiment 1-8. In terms of omission of the circuit board 211, the BOST assembly 210I is identical with the BOST assembly 210C described in connection with embodiment 1-3 shown in FIGS. 7 and 8. The circuit sections (1) to (12) to be mounted are assigned in the same manner as in the case of embodiment 1-3.

Embodiment 1-9 enables a reduction in the number of circuit boards of the BOST assembly 210I when compared with that of the BOST assembly 210H described in connection with embodiment 1-8. Hence, the more simplified BOST assembly 210I can be obtained.

Embodiment 1-10

Figure 16:
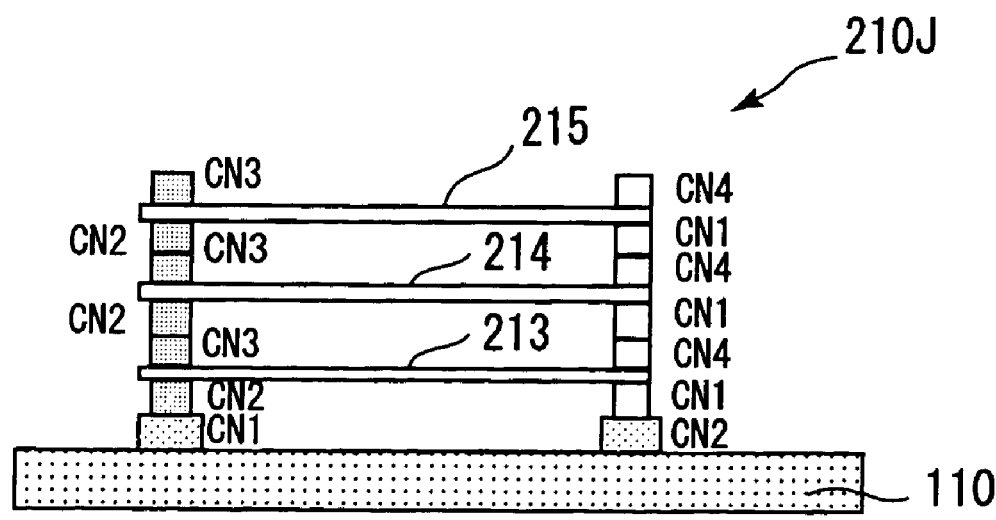
FIG. 16 is a side view of the BOST assembly.

Embodiment 1-10 is an embodiment for implementing the apparatus for testing a semiconductor integrated circuit of the invention and has another BOST assembly 210J which is more simplified than the BOST assembly 210I described in connection with embodiment 1-9. FIG. 16 is a side view of the BOST assembly 210J. The BOST assembly 210J is embodied by omitting the circuit board 212 of the BOST assembly 210I described in connection with embodiment 1-9. In other respects, the BOST assembly 210J is identical in configuration with the BOST assembly 210I described in connection with embodiment 1-9. Those elements which are the same as those of the BOST assembly 210I are assigned the same reference numerals, and their repeated explanations are omitted. In terms of omission of the circuit boards 211, 212, the BOST assembly 210J is identical with the BOST assembly 210D described in connection with embodiment 1-4 shown in FIGS. 9 and 10. The circuit sections (1) to (12) to be mounted are assigned in the same manner as in the case of embodiment 1-4.

Embodiment 1-10 enables a reduction in the number of circuit boards of the BOST assembly 210J when compared with that of the BOST assembly 210I described in connection with embodiment 1-9. Hence, the more simplified BOST assembly 210J can be obtained.

Embodiment 1-11

Embodiment 1-11 is an embodiment for implementing the apparatus for testing a semiconductor integrated circuit of the invention and has a test head device 12E embodied by combining the BOST assembly 210 with a probing device (prober) 125 and a test head 120A. The test head device 12E is used in a case where the DUT 10 is included in an LSI chip or a semiconductor wafer. The test head device 12E is used for testing a semiconductor integrated circuit during a preliminary process of the processes for manufacturing a semiconductor integrated circuit; that is, a process for handling a semiconductor wafer.

Figure 17:
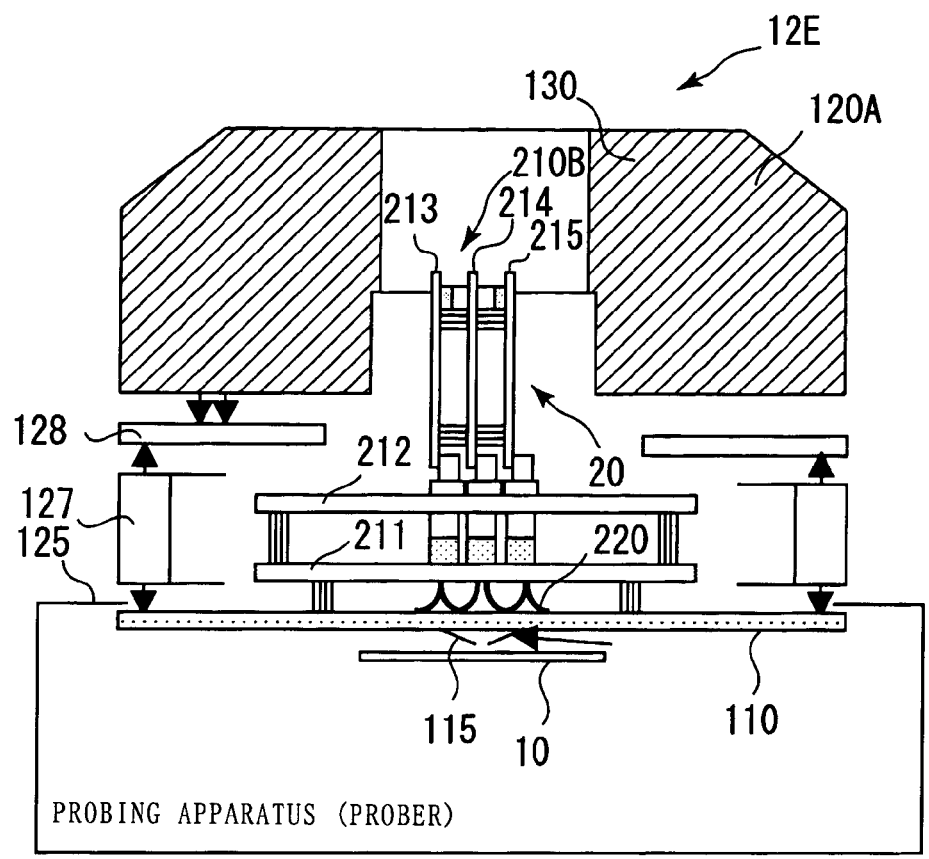
FIG. 17 is a side view showing an example of the test head device.
Figure 18:
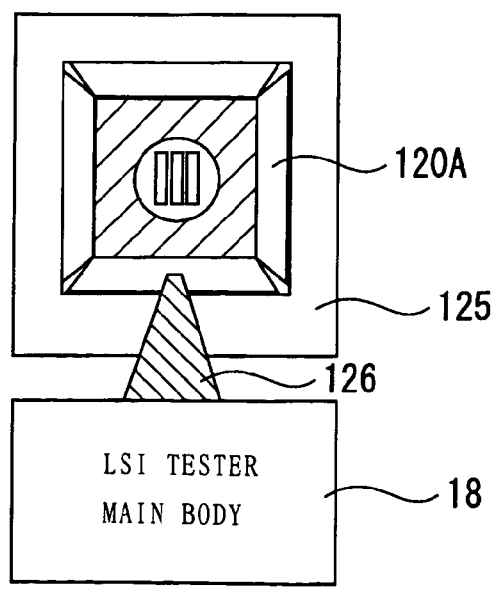
FIG. 18 is a front view of the test head device, including the tester.

FIG. 17 is a side view showing an example of the test head device 12E, and FIG. 18 is a front view of the test head device, including the tester 18.

The DUT board 110 is provided on an upper surface of the probing device (prober) 125. The DUT board 110 constitutes a probe card, and a plurality of probe needles 115 are provided at the center on the lower surface of the DUT board 110. The probe needles 115 come into contact with an LSI chip or a semiconductor wafer, which includes the DUT, thereby supplying the test input pattern signal TIP to a predetermined portion of the DUT 10 and extracting the test output pattern signal TOP from the DUT 10.

The test head 120A is connected to the tester 18 by way of a cable 126. When the tester 18 directly tests the DUT 10, a supply voltage, a clock signal, a control signal, and a test signal are supplied to the DUT 10 by way of the DUT board 110. When the BOST device 20 tests the DUT 10, the supply voltage, the test code TCD, the test start signal TST, and the test pattern data TPD, all being output from the tester 18, are supplied to the BOST device 20 by way of the DUT board 110. The error code ECD output from the BOST device 20 is supplied from the BOST device 20 to the tester 18 by way of the DUT board 110 and the test head 120A.

An annular POGO ring 127 is provided along an outer periphery of an upper portion of the probing device 125. An annular attachment board 128 is placed on the POGO ring 127. The test head 120A is arranged on the attachment board 128. A voltage and signals output from the test head 120A are supplied to the DUT board 10 by way of the attachment board 128 and the POGO ring 127. The voltage and the signals are supplied from the DUT board 110 further to the DUT 10 or the BOST device 20.

The test head device 12E uses a square-pole-shaped test head 120A. A circular scope hole 130 is formed in the center of the test head 120A so as to vertically penetrate through the test head 120A. The scope hole 130 is a hole to be used for observing an area under test. The scope hole has an inner diameter of, e.g., 120 to 130 mm.

The test head device 12E of embodiment 1-11 can employ any of the BOST assemblies 210A to 210J described in connection with embodiments 1-1 to 1-10 as the BOST assembly 210. The BOST assembly 210B described in connection with embodiment 1-2 is used in the case of the test head device 12E shown in FIGS. 17 and 24.

The BOST assembly 210B of the BOST device 20 is placed on the DUT board 110. The circuit boards 211, 212 of the BOST assembly 210B are arranged within a space formed along an inner periphery of the annular POGO ring 127. The circuit boards 213, 214, and 215 extend upright from the circuit board 212 and further into the scope hole 130 of the test head 120A by way of the space defined within the inner periphery of the attachment board 128. In this way, in the test head device 12E of embodiment 1-11, the BOST assembly 210B constituting the BOST device 20 is arranged by utilization of the space left in the test head device 12E; more specifically, the inner space of the POGO ring 127, that of the attachment board 128, and that of the scope hole 130 of the test head 120A.

In the test head device 12E of embodiment 1-11, the BOST device 20 is arranged in the scope hole 130 by utilization of the scope hole 130 of the test head 120A, thereby constituting the test head device 12E, which is compact in size.

Embodiment 1-12

Figure 19:
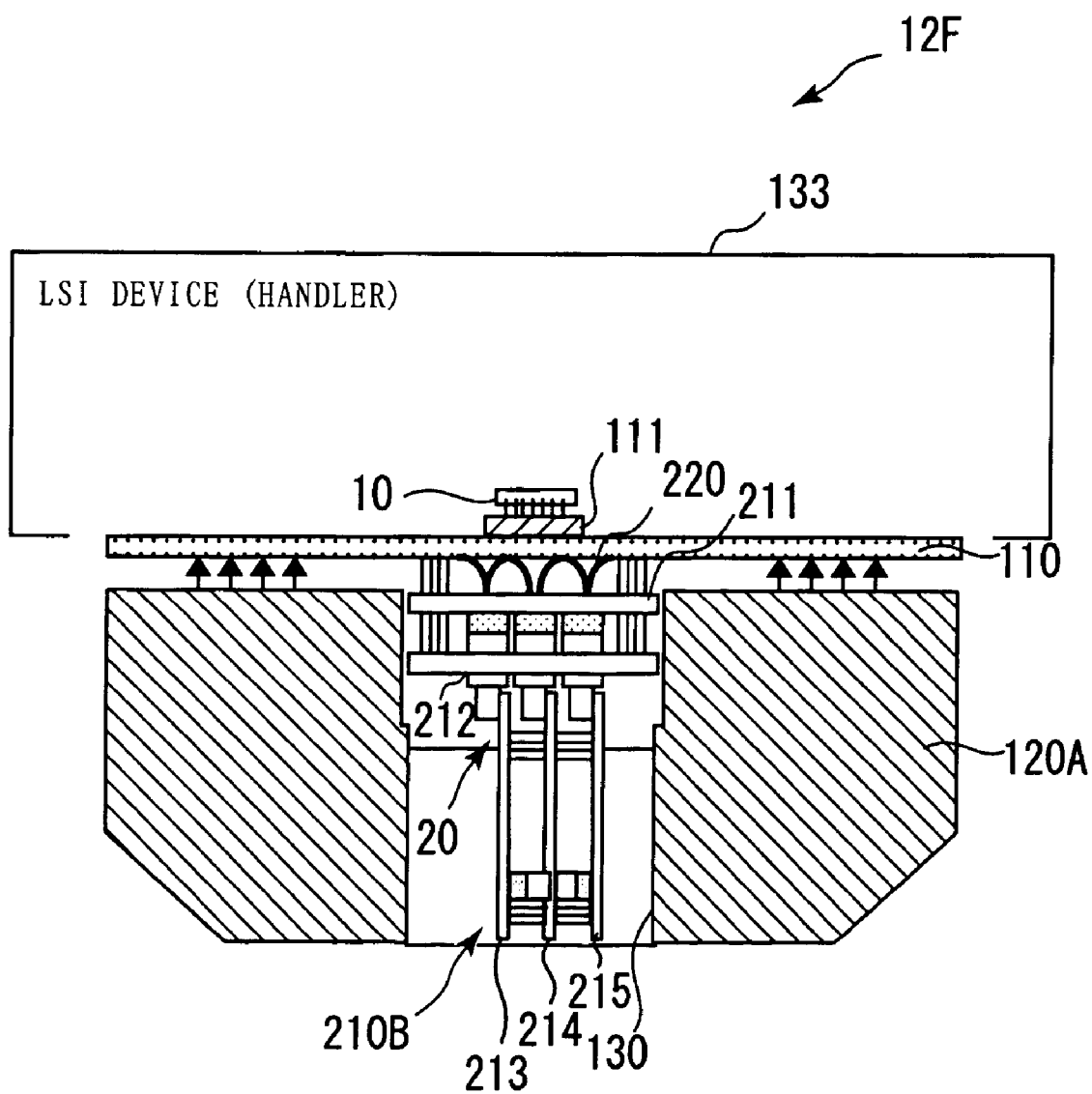
FIG. 19 is a side view showing the test head device.

Embodiment 1-12 is an embodiment for implementing the apparatus for testing a semiconductor integrated circuit of the invention and has a test head device 12F used in a case where a molded semiconductor integrated circuit is taken as the DUT 10. The molded semiconductor integrated circuit is formed by coating a semiconductor integrated circuit chip with molding resin. The molded semiconductor integrated circuit is tested during a subsequent process for assembling a semiconductor integrated circuit chip in the processes for manufacturing a semiconductor integrated circuit. FIG. 19 is a side view showing the test head device 12F.

In the test head device 12F of embodiment 1-12, the test head 120A of the test head device 12E of embodiment 1-11 is arranged while being inverted. The test head 120A is disposed below an LSI transporter (handler) 133.

The DUT board 110 is provided on a lower surface of the handler 133. A DUT socket 111 is placed at the center of the upper surface of the DUT board 110. The molded semiconductor integrated circuit transported by the handler 133 is inserted as the DUT 10 into the DUT socket 111. The test head 120A is arranged along an outer periphery of the lower portion of the DUT board 110.

Even in the test head 12F of embodiment 1-12, any of the BOST assemblies 210A to 210J described in connection with embodiments 1-1 to 1-10 can be used as the BOST assembly 20. In the case of the test head device 12F shown in FIG. 19, the BOST assembly 210B described in connection with embodiment 1-2 is used.

In embodiment 1-12, the BOST assembly 210B is also combined while being inverted in relation to the embodiment shown in FIG. 17. The BOST assembly 210B is attached to the center of the lower portion of the DUT board 110 in such a manner as to hang from the DUT board 110. In the BOST assembly 210B, the circuit board 211 is arranged immediately below and in parallel with the DUT board 110. The circuit board 211 is attached to the DUT board 110 by means of the fixed wiring connection 220. The circuit board 212 is arranged below the circuit board 211 and in parallel with the circuit board 210. The circuit boards 213, 214, and 215 are arranged on the lower surface of the circuit board 212 so as to hang from the same. The circuit boards 213, 214, and 215 are arranged in parallel with each other and extend into the space defined within the scope hole 130 of the test head 120A.

Even in the case of the test head device 12F of embodiment 1-12, the BOST device 20 is arranged in the scope hole 130 by utilization of the scope hole 130 of the teat head 120A, and hence the test head device 12F can be formed to be compact in size.

Embodiments 2-1 to 2-8 of the apparatus for testing a semiconductor integrated circuit of the invention pertaining to expansion of the test capability of the embodiment 1 will now be described. Embodiments 2-1 to 2-8 basically have the capabilities described in connection with embodiment 1 and additional capabilities and configuration, which will be described below.

Embodiment 2-1

Embodiment 2-1 is an embodiment for implementing the apparatus for testing a semiconductor integrated circuit of the invention, which enables instruction control of a test vector pertaining to the test pattern signal TPS. FIG. 20 shows the hardware configuration of embodiment 2-1, and test operations are shown in the form of timing charts shown in FIGS. 21 to 24.

First, the hardware configuration of embodiment 2-1 will be described by reference to FIG. 20. FIG. 20A shows the configuration of a BOST control section 40 of embodiment 2-1. FIG. 20B shows the configuration of memory of the PG section 60 corresponding to embodiment 2-1. FIG. 20C shows details of a pulse generation circuit 417 shown in FIG. 20A.

Figures 20A, 20B:
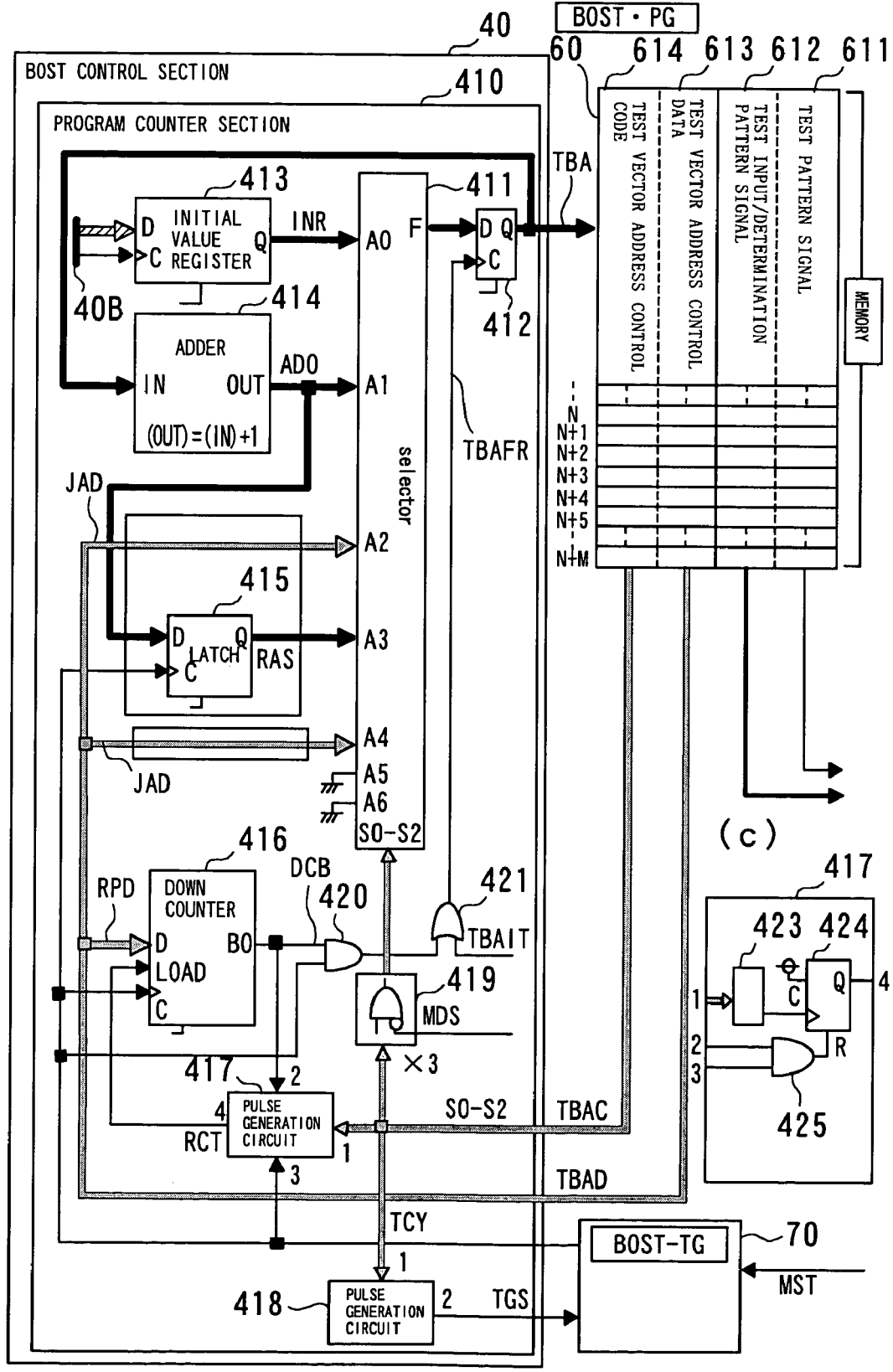
FIG. 20 shows the hardware configuration of embodiment 2-1, and test operations are shown in the form of timing charts shown in FIGS. 21 to 24.

In embodiment 2-1, the PG section 60 of the BOST device 20 shown in FIG. 1 has the memory configuration shown in FIG. 20B. The PG section 60 has a storage zone 614 for storing a test vector address control code TBAC, and a storage zone 613 for storing test vector address control data TBAD. In correspondence to the test vector address control code TBAC and the test vector address control data TBAD, the test input/determination pattern signal JPS is stored in a storage zone 612, and the test pattern signal TPS is stored in a storage zone 611. Here, the test vector signifies a group including a predetermined number of consecutive bits pertaining to the test pattern signal TPS. The control code TBAC, the control data TBAD, the test input pattern signal JPS, and the test pattern signal TPS are included in the test pattern TPD downloaded into the PG section 60 and stored along test vector addresses N, N+1, N+2, N+3, . . . N+M.

In embodiment 2-1, the test vector address control code TBAC includes five codes: that is, code NOP for a normal mode NOP; a code SJP for a subroutine jump SJP; a code RET for a subroutine return RET; a code JMP for an unconditional jump JMP; and a code REP for a repeat REP.

The code NOP is a code for specifying a normal mode. As indicated by a memory address signal MAD shown in FIG. 3A, in the normal mode NOP +1 is sequentially added to a previous address value of the test vector address. The code SJP is a code for specifying a subroutine jump and instructs a jump to a descriptive address stored in the test vector address control data TBAD corresponding to the code SJP. The code RET is a code for specifying the subroutine return and instructs a return to the address obtained by adding +1 to the descriptive address described in the test vector address control data TBAD in correspondence to the code RET. The code JMP is a code for specifying an unconditional jump and instructs a jump to the descriptive address described in the test vector address control data TBAD in correspondence to the code JMP. The code REP is a code for specifying an identical vector repeat and instructs a repeat of operation to an identical test vector address, by only the number of times +1 is added to the number of times a description is described in the test vector address control data TBAD in correspondence to the code REP.

The test vector address control data TBAD are used for respectively storing the descriptive addresses and the number of times a description is made, in correspondence to the test vector address control code TBAC.

In embodiment 2-1, as shown in FIG. 20A, the BOST control section 40 of the embodiment 1 shown in FIG. 1 has a program counter 410. The program counter 410 has an instruction control selector 411, a flip flop 412, an initial value register circuit 413, an adder 414, a subroutine return address latch circuit 415, a repeat count down-counter 416, pulse generation circuits 417, 418, and AND circuits 419, 420, and 421.

The instruction control selector 411 has input terminals A0 to A6, an output terminal F, and a control terminal for receiving control inputs S0 to S2. The instruction control selector 411 produces a test vector address TBA to be output to the PG section 60, on the output terminal Q of the flip flop 412 connected to the output terminal F. The test vector address TBA is shown in FIGS. 21I, 22I, 23I, and 24I. An initial value register 413 has an input D and a clock input C, both being connected to an internal bus 40B of the BOST control section 40, and an output Q connected to an input terminal A0 of the instruction control selector 411. The initial value register 413 provides the input terminal A0 of the instruction control selector 411 with an initial value register output INR. The initial value register output INR is shown in FIGS. 21A, 22A, 23A, 24A, 25A, 26A, 27A, 28A, 29A, and 30A.

An adder 414 has an input terminal IN connected to the output Q of the flip flop 412, and an output terminal OUT connected to the input terminal A1 of the instruction control selector 411. An adder output ADO=IN+1 is produced at the output terminal OUT. The adder output ADO is shown in FIGS. 21B, 22B, 23B, and 24B. The input terminals A2, A4 of the instruction control selector 411 are provided with jump destination address data JAD from the test vector address control data TBAD of the PG section 60. The jump destination address data JAD are shown in FIGS. 22C and 23C. The subroutine address latch circuit 415 has an input D connected to an output terminal OUT of the adder 414, a clock input C, and an output Q connected to the input terminal A3 of the instruction control selector 411. A return destination address signal RAS is produced at the output Q. The return destination address signal RAS is shown in FIG. 22D. Input terminals A5, A6 of the instruction control selector 411 are grounded.

The repeat count down-counter 416 has an input D for receiving repeat data RPD pertaining to a preset repeat count+1 included in the test vector address control data TBAD stored in the storage zone 613 of the PG section 60, a LOAD input, a clock input C, and an output B0. The repeat data RPD are shown in FIG. 24C. The LOAD input of the repeat count down-counter 416 is connected to a terminal 4 of a pulse generation circuit 417 and receives a repeat count set trigger signal RCT. The repeat count set trigger signal RCT is shown in FIG. 24E. The clock input C of the repeat count down-counter 416 is provided with the test cycle signal TCY from the TG section 70 of the BOST device 20. The test cycle signal TCY is shown in FIGS. 21H, 22H, 23H, and 24H. A down-counter borrow signal DCB develops at an output B0 of the repeat count down-counter 416. The down-counter borrow signal DCB is shown in FIG. 24K. The down-counter borrow signal DCB assumes a high level H at the time of a reset and assumes a low level L at the time of a LOAD.

The pulse generation circuit 417 has four terminals 1, 2, 3, and 4. The terminals 1, 2, and 3 are input terminals, and the test vector address control code TBAC output from the PG section 60 is delivered to the terminal 1. The test vector address control code TBAC is shown in FIGS. 21J, 22J, 23J, and 24J. The terminal 2 is provided with the down-counter borrow signal DCB output from the output B0 of the repeat count down-counter 416. The terminal 3 is provided with a test cycle signal TCY output from the TG section 70. On the basis of control input S0–S2 imparted to the terminal 1, the down-counter borrow signal DCB imparted to the terminal 2, and the test cycle signal TCY imparted to the terminal 3, the pulse generation circuit 417 produces a repeat count setting trigger signal RCT when a control input S0–S2=5, and the repeat count setting trigger signal RCT is supplied to the LOAD terminal of the repeat count down-counter 416.

As shown in FIG. 20C, the pulse generation circuit 417 has a decoder 423, a flip flop 424, and an AND circuit 425. The decoder 423 decodes the control input S0–S2 input to the terminal 1 and supplies the resultant signal to the clock input C of the flip flop 424. The AND circuit 425 supplies, to a reset input R of the flip flop 424, a logical AND output formed from the down-counter borrow signal DCB to be output to the terminal 2 and the test cycle signal TCY to be output to the terminal 3. The output Q of the flip flop 424 is connected to the terminal 4, and the repeat count setting trigger signal RCT is supplied to the terminal 4.

The pulse generation circuit 418 has a terminal 1 for receiving control input S0–S2, and an output terminal 2 for producing a TG section signal generation stop signal TGS to be output to the TG section 70. The pulse generation circuit 418 decodes the control input S0 to S2. When S0–S2=6, the pulse generation circuit produces a TG section signal generation stop signal TGS, thereby stopping generation of a test cycle signal TCY performed by the TG section 70. A measurement start signal MST (shown in FIGS. 21G, 22G, 23G, and 24G) is supplied to the TG section 70. On the basis of the measurement start signal MST, the test cycle signal TCY is produced.

One input of the AND circuit 419 receives the control inputs S0 to S2, and the other input of the same receives a mode signal MDS, which assumes a high level H at the time of initialization and assumes a low level during a normal time other than initialization. A total of three AND circuits 419 are provided so as to correspond to the control inputs S0, S1, and S2. Outputs from these control inputs become the control input S0–S2 of the instruction control selector 411. One input of the AND circuit 420 receives the down-counter borrow signal DCB that arises on the output B0 of the repeat count down-counter 416. The other input of the AND circuit 420 receives the test cycle signal TCY. An output from the AND circuit 420 is supplied to one input of the OR circuit 421. The test vector address initial setting trigger signal TBAIT, which is shown in FIGS. 21F, 22F, 23F, and 24F, is supplied to the other input of the OR circuit 421. A test vector address final latch trigger signal TBAFR shown in FIG. 24M is produced at an output of the OR circuit 421. This signal is supplied to the clock input C of the flip flop 412.

Selecting operation of the instruction control selector 411 will now be summarized. When a control input S0–S2=0, an input to the input terminal A0 is selected. When the control input S0–S2=0, the output F assumes an initial value register output INR (shown in FIGS. 21A, 22A, 23A, and 24A). When a control input S0–S2=1, an input to the input terminal A1 is selected. At this time, the output F assumes the adder output ADO (shown in FIGS. 21B, 22B, 23B, and 24B), and the BOST device 20 operates in a normal mode instructed by the code NOP. While the address value is incremented by +1, the BOST device 20 operates in a normal mode NOP. When a control input S0–S2=2, the input terminal A2 is selected. The output F becomes the jump destination address JAD. At this time, the BOST device 20 performs a subroutine jump SRJ operation, thereby causing a jump to a descriptive address included in the test vector address control data TBAD; that is, a test vector address corresponding to the jump destination address data JAD.

When a control input S0–S2=3, an input to the input terminal A3; that is, a return destination address signal RAS, is selected, and the signal is output from the output F. At this time, the BOST device 20 performs a subroutine return SRR operation, thereby causing a return to a test vector address return corresponding to the return destination address signal RAS. When a control input S0–S2=4, the signal of the output F assumes an input signal to the input terminal A4; that is, a jump destination address data JAD. The BOST device 20 performs an unconditional jump NCJ operation, thereby causing a jump to the test vector address TBA corresponding to the jump destination address data JAD. When a control input S0–S2=5, the signal of the output F becomes the input terminal A5; that is, a ground signal. The BOST device 20 performs the identical vector repeat operation SBR. On the basis of an output from the repeat count down-counter 416, an operation for returning to a previous test vector address is repeated until the count value assumes 0.

FIG. 21 is a timing chart of signals and data when, in embodiment 2-1, the BOST device 20 is operated through use of a code NOP which advances the test vector address TBA in a normal mode. The test vector address control code TBAC shown in FIG. 21J is presumed to be set as follows in correspondence to test vector addresses N, N+1, N+2, N+3, N+4, and N+5.

N: NOP (normal mode) compliant code 0x1
N+1: NOP compliant code 0x1
N+2: NOP compliant code 0x1
N+3: NOP compliant code 0x1
N+4: NOP compliant code 0x1
N+5: STOP (stop) compliant code 0x6

FIG. 21 shows signals and data, which are compliant with the normal mode NOP. FIG. 21A shows an initial value register output INR; FIG. 21B shows an adder output ADO; FIG. 21F shows a test vector initial setting trigger signal TBAIT; FIG. 21G shows a measurement start signal MST; FIG. 21H shows a test cycle signal TCY; FIG. 21I shows a test vector address TBA; and FIG. 21J shows a test vector address control code TBAC.

In the embodiment shown in FIG. 20, the adder output ADO shown in FIG. 21B is selected, thereby achieving a normal mode NOP where +1 is sequentially added to the test vector address TBA shown in FIG. 21I. When the test cycle signal TCY is produced sequentially, the test vector address TBA shown in FIG. 21I advances from N to N+1, N+2, N+3, N+4, and N+5. During a period in which the test vector address control code TBAC is 0x1; that is, a period in which the test vector address TBAC advances from N to N+4, operation is performed in the normal mode NOP. When the test vector address TBA has assume N+5, operation is stopped.

Figure 22:
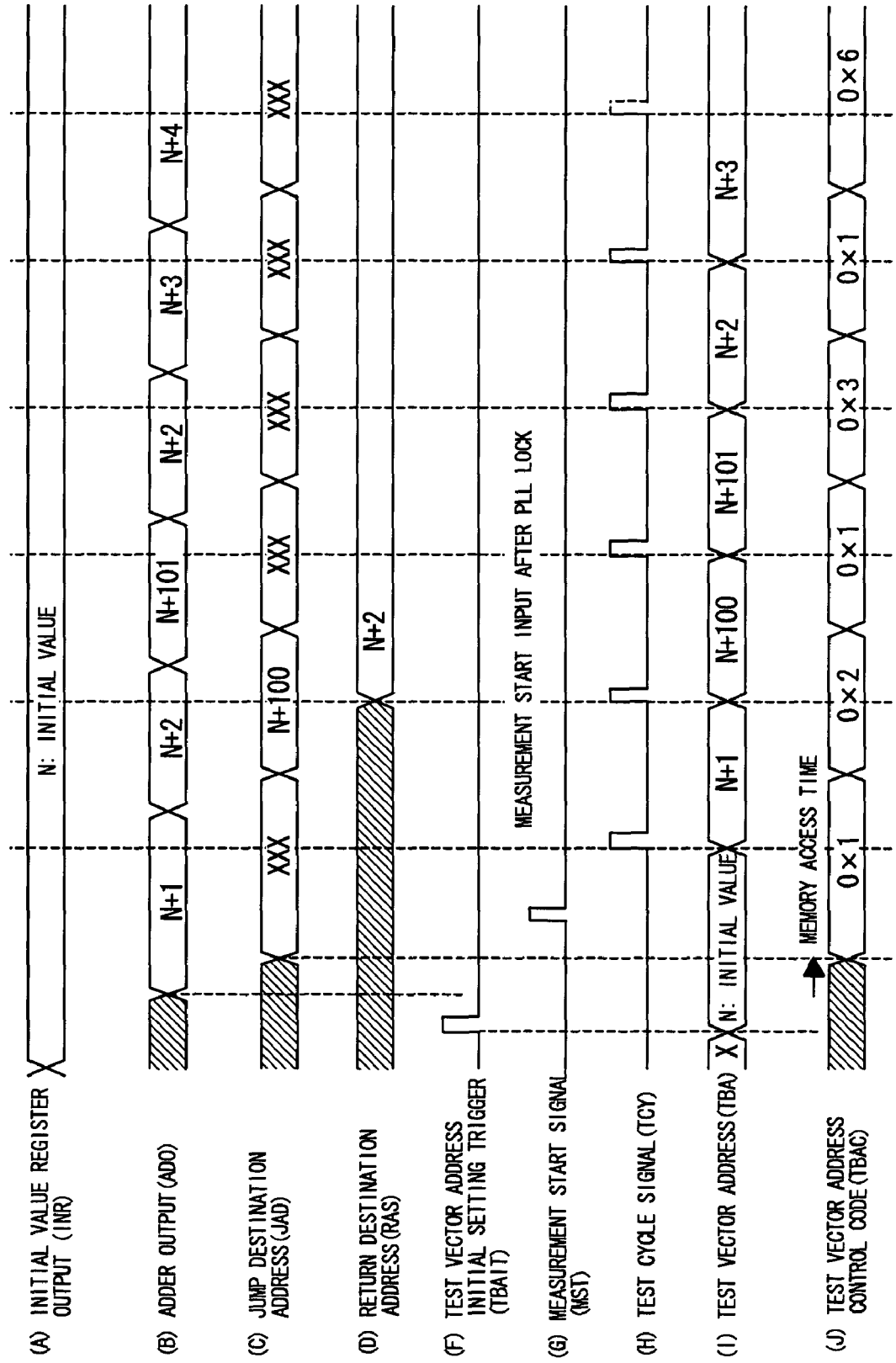
FIG. 22 is a timing chart obtained when, in embodiment 2-1, there are performed an operation for advancing the test vector address TBA in the normal mode NOP and an operation for causing a jump through use of a subroutine jump SRJ and a return operation through use of a subroutine return RET.

FIG. 22 is a timing chart obtained when, in embodiment 2-1, there are performed an operation for advancing the test vector address TBA in the normal mode NOP and an operation for causing a jump through use of a subroutine jump SRJ and a return operation through use of a subroutine return RET. The test vector address control code TBAC is set in the following manner in correspondence to N, N+1, N+2, N+3, N+100, and N+101.

N: NOP compliant code 0x1
N+1: [SJP N+100] compliant code 0x2
N+100: NOP compliant code 0x1
N+101: RET compliant code 0x3
N+2: NOP compliant code 0x1
N+3: STOP compliant code 0x6

The [SJP N+100] compliant code 0x2 defined in address N+1 signifies a jump to the test vector address N+100 in the test vector address N+1. The RET compliant code 0x3 defined in N+101 signifies a return to the test vector address N+3 in the test vector address N+101. FIG. 22 shows signals and data generated in response to these operations. FIG. 22A shows an initial value register output INR; FIG. 22B shows an adder output ADO; FIG. 22C shows a jump destination address JAD; FIG. 22D shows a return destination address RAS; FIG. 22F shows a test vector initial setting trigger signal TBAIT; FIG. 22G shows a measurement start signal MST; FIG. 22H shows a test cycle signal TCY; FIG. 22I shows a test vector address TBA; and FIG. 22J shows a test vector address control code TBAC.

In the embodiment shown in FIG. 22, when the test vector address TBA shown in FIG. 22I has assumed N+1, the subroutine jump SJP is performed, whereby an operation for causing a jump to the test vector address N+100 is performed. When the test vector address TBA has assumed N+101, an operation for causing a subroutine return RET to the test vector address N+3 is performed.

By means of the operation shown in FIG. 22, an identical jump destination address can be addressed by different test vector addresses. The number of test vector address can be reduced.

Figure 23:
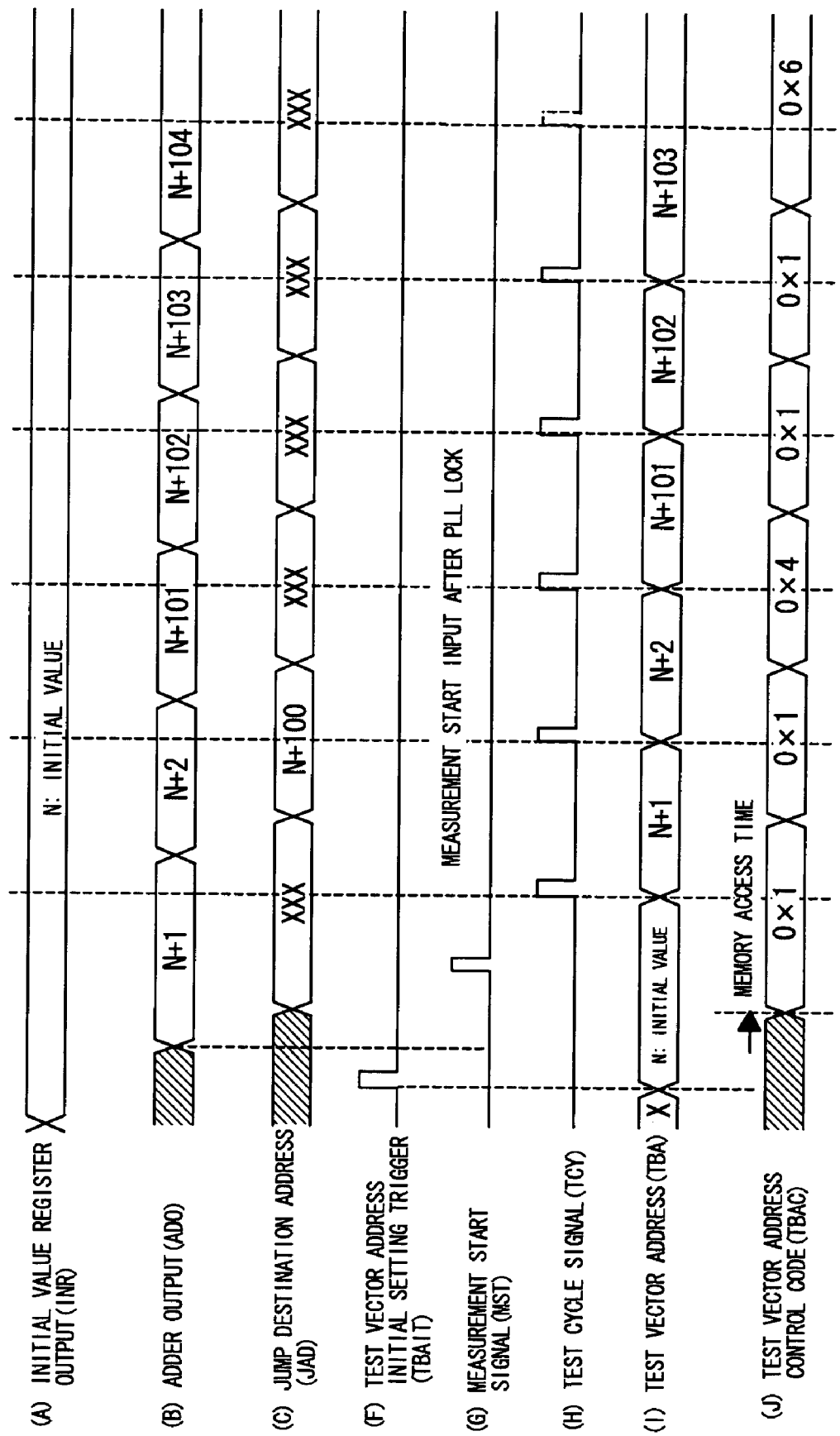
FIG. 23 is a timing chart obtained when, in embodiment 2-1, there are performed an operation for advancing the test vector address TBA in the normal mode NOP and an operation for causing an unconditional jump JMP.

FIG. 23 is a timing chart obtained when, in embodiment 2-1, there are performed an operation for advancing the test vector address TBA in the normal mode NOP and an operation for causing an unconditional jump JMP. The test vector address control code TBAC is set as follows in correspondence to N, N+1, N+2, N+100, N+101, N+102, N+103, and N+104.

N: NOP (normal mode) compliant code 0x1
N+1: NOP compliant code 0x1
N+2: [JMP N+100] compliant code 0x4
N+100: NOP compliant code 0x1
N+101: NOP compliant code 0x1
N+102: NOP compliant code 0x1
N+103: STOP (stop) compliant code 0x6

The [JMP N+100] compliant code 0x4 defined in address N+2 signifies a jump to the test vector address N+100 in the test vector address N+2. Further, STOP compliant code 0x6 defined in address N+103 signifies that operation is to be stopped at the test vector address N+103. FIG. 23 shows signals and data generated in response to these operations. FIG. 23A shows an initial value register output INR; FIG. 23B shows an adder output ADO; FIG. 23C shows a jump destination address JAD; FIG. 23F shows a test vector initial setting trigger signal TBAIT; FIG. 23G shows a measurement start signal MST; FIG. 23H shows a test cycle signal TCY; FIG. 23I shows a test vector address TBA; and FIG. 23J shows a test vector address control code TBAC.

In the embodiment shown in FIG. 23, when the test vector address TBA shown in FIG. 23I has assumed N+2, there is performed an unconditional jump JMP to the test vector address N+100.

By means of the operation shown in FIG. 23, an identical jump destination address can be addressed by different test vector addresses. The number of test vector address can be reduced.

Figure 24:
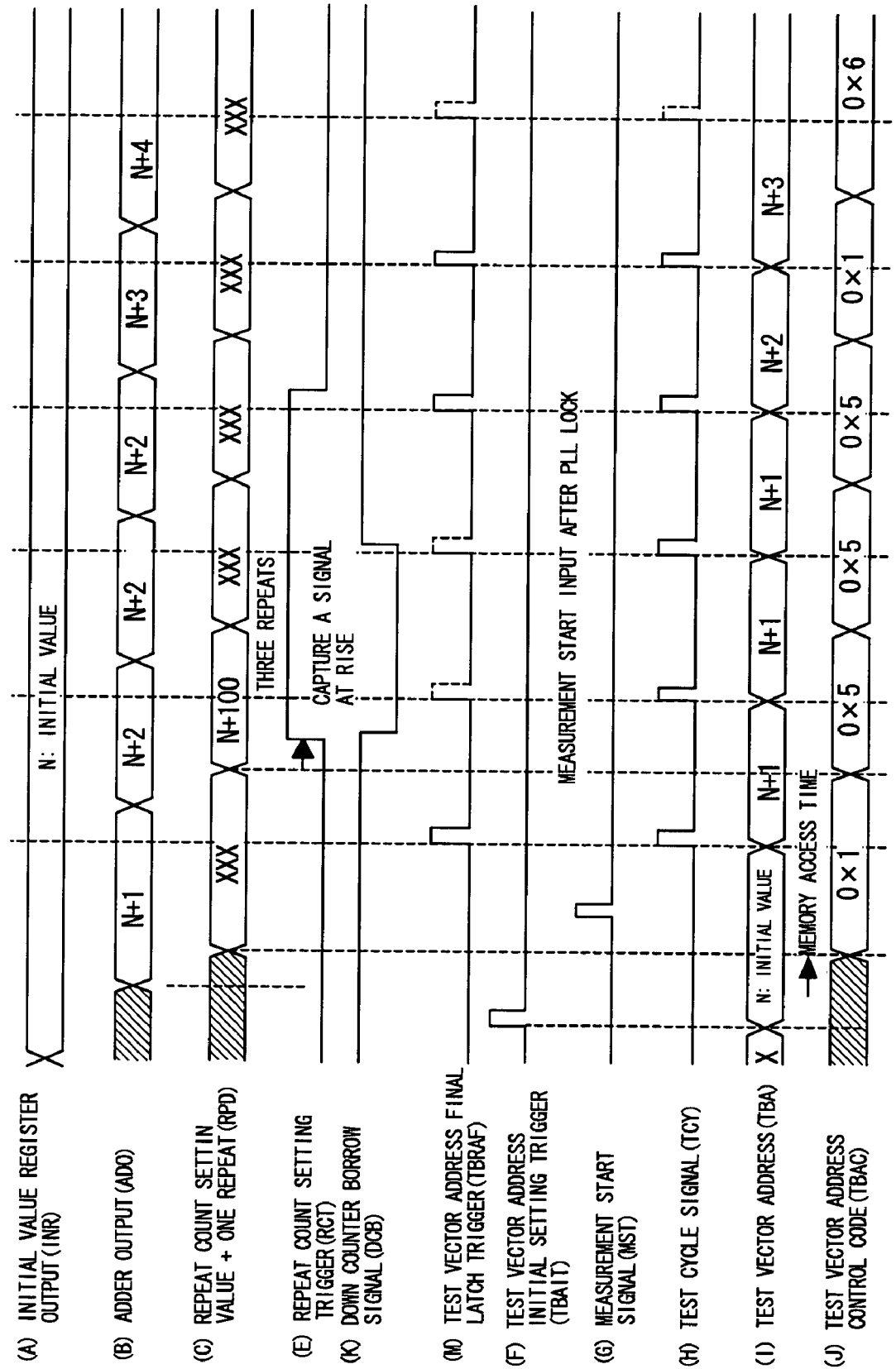
FIG. 24 is a timing chart obtained when, in embodiment 2-1, there are performed an operation for advancing the test vector address TBA in the normal mode NOP and an operation for effecting a repeat REP operation.

FIG. 24 is a timing chart obtained when, in embodiment 2-1, there are performed an operation for advancing the test vector address TBA in the normal mode NOP and an operation for effecting a repeat REP operation. The test vector address control code TBAC is set as follows in correspondence to N, N+1, N+2, and N+3.

N: NOP (normal mode) compliant code 0x1
N+1: [REP 2] compliant code 0x5
N+2: NOP compliant code 0x1
N+3: STOP (stop) compliant code 0x6

The [REP 2] compliant code 0x5 defined in address N+1 signifies the number of repeating operations 2 achieved at the test vector address N+1; in other words, signifies that the test vector address N+1 is repeated twice. FIG. 24 shows signals and data generated in response to these operations. FIG. 24A shows an initial value register output INR; FIG. 24B shows an adder output ADO; FIG. 24C shows a repeat signal RPD obtained at a repeat count preset value +1; FIG. 24E shows a repeat count setting trigger signal RCT; FIG. 24K shows a down-counter borrow signal DCB; FIG. 24M shows a test vector address final latch trigger signal TBRAF; FIG. 24F shows a test vector address initial setting trigger signal TBAIT; FIG. 24G shows a measurement start signal MST; FIG. 24H shows a test cycle signal TCY; FIG. 24I shows a test vector address TBA; and FIG. 24J shows a test vector address control code TBAC.

In the embodiment shown in FIG. 24, when the test vector address TBA shown in FIG. 24I has become N+1, operation pertaining to the test vector address N+1 is subjected to repeats REP twice. Consequently, operation pertaining to the test vector address N+1 is performed three times.

By means of the operation shown in FIG. 24, an identical jump destination address can be addressed by different test vector addresses. The number of test vector address can be reduced.

Embodiment 2-1 yields the same effect as that yielded in the embodiment 1. In addition, a variety of control operations, including the subroutine jump SJP, the subroutine return RET, the unconditional jump JMP, and the identical vector repeat REP, are performed on the basis of the test vector address control code TBAC and the test vector address control data TBAD. An attempt to modularize the test pattern data TPD and a reduction in the number of test vectors can be achieved. A variety of function tests can be performed by generating various test pattern data.

Embodiment 2-2

Figure 26A:
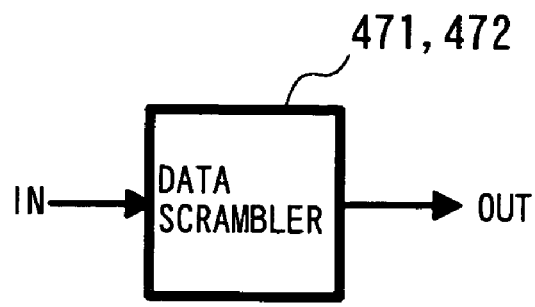
FIG. 26A shows the configuration of data scramblers included in the BOST control section shown in FIG. 25A.
Figure 26B:
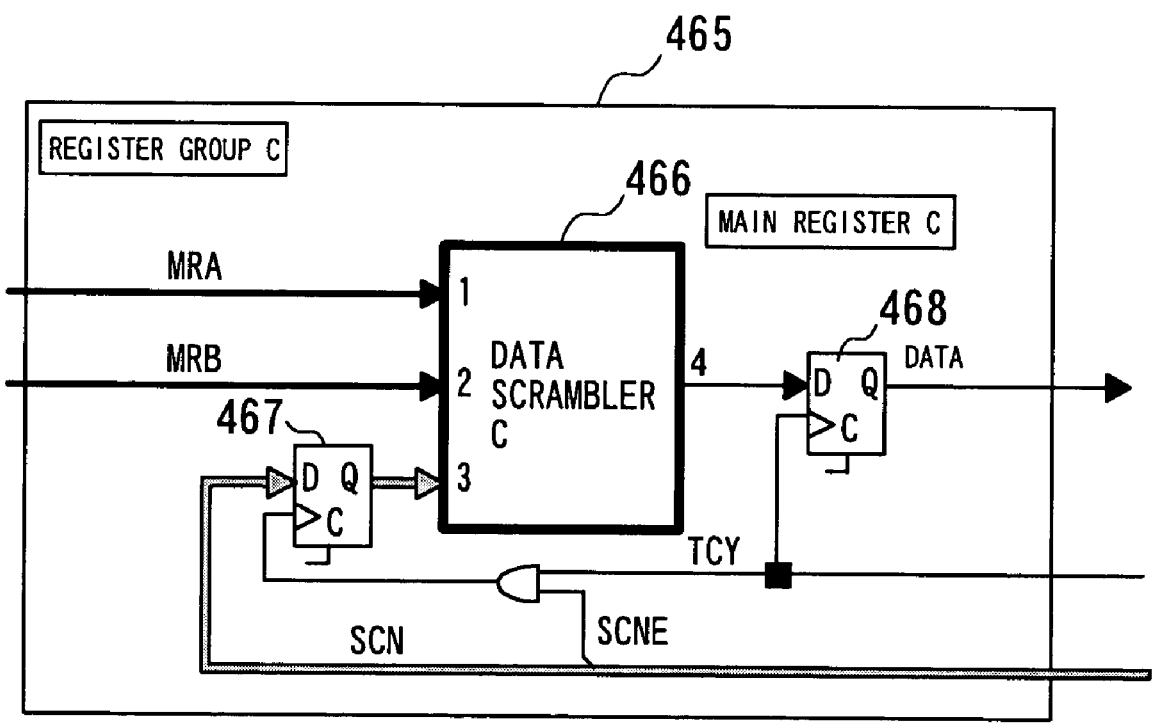
FIG. 26B shows the configuration of the register group.
Figure 26C:
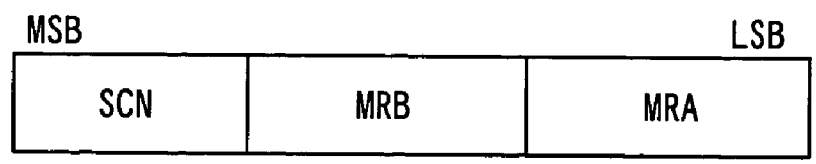
FIG. 26C shows the configuration of memory addresses of the data scrambler.
Figure 27:
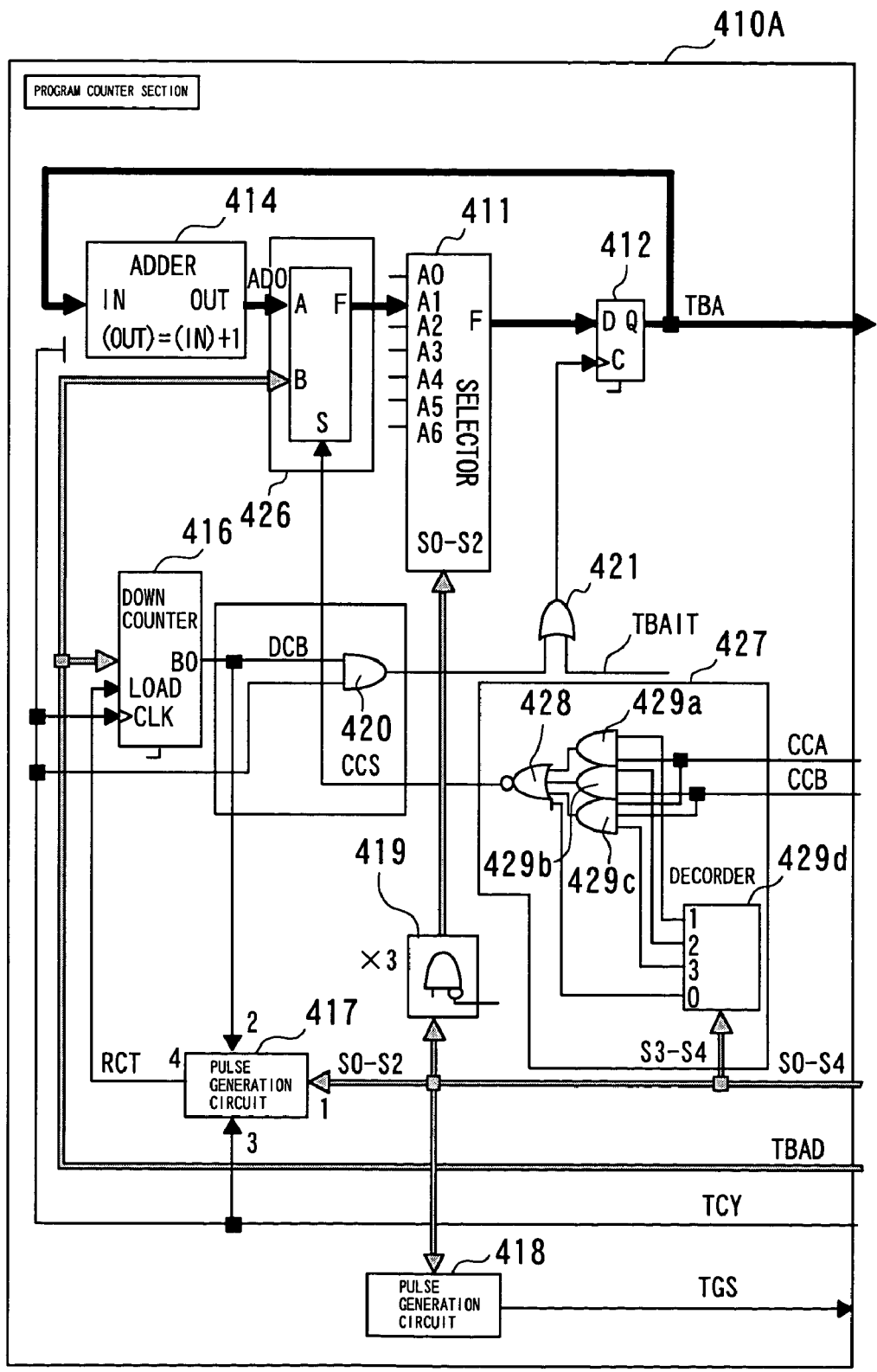
FIG. 27 shows the configuration of the program counter used in embodiment 2-2.

Embodiment 2-2 relates to the apparatus for testing a semiconductor integrated circuit of the invention, which is suitable for testing a digital circuit having a matrix layout, such as semiconductor memory. Particularly, in embodiment 2-2, the PG section 60 has the function of producing an algorithmic test pattern through instruction control operation. The configuration of the BOST control section 40 and that of the PG section 60, both pertaining to embodiment 2-2, are shown in FIGS. 25, 26, and 27. Further, operation timing charts pertaining to embodiment 2-2 are shown in FIGS. 28, 30, 32, and 34.

In the semiconductor memory taken as the DUT 10, a plurality of lines extending in the direction X (hereinafter called "X-direction lines") and a plurality of lines extending in the direction Y (hereinafter called "Y-direction lines") are arranged in a matrix pattern so as to cross each other at right angles. Memory cells are provided at respective intersections. The plurality of X-direction lines are selected by means of an X decoder, and the plurality of Y-direction lines are selected by means of a Y decoder. In this semiconductor memory, a test input pattern signal complying with the test pattern data is input to memory cells located at intersections between the selected X-direction lines and the Y-direction lines. Consequently, a test is performed such that a test output pattern signal produced by the DUT 10 is determined.

Figures 25A, 25B:
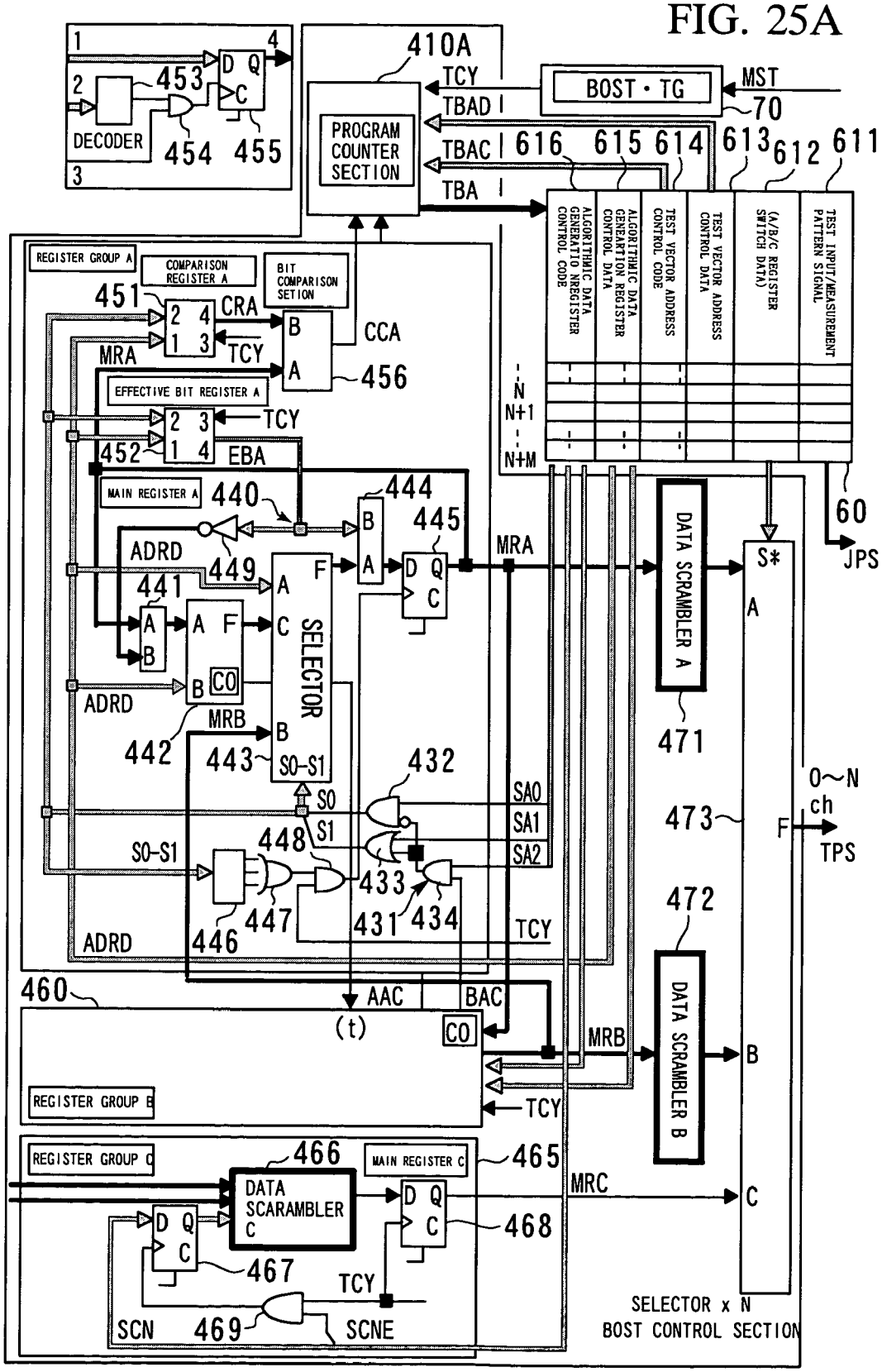
FIG. 25A shows the configuration of the PG section of embodiment 2-2 and the configuration of the register groups included in the BOST control section.
FIG. 25B shows the configuration of comparison registers included in the register groups and the configuration of effective bit registers.

FIG. 25A shows the configuration of the PG section 60 of embodiment 2-2 and the configuration of the register groups A430, B460, and C465 included in the BOST control section 40. FIG. 25B shows the configuration of comparison registers A451, B451 included in the register groups A430, B460 and the configuration of effective bit registers A452, B452. FIG. 26A shows the configuration of data scramblers 471, 472 included in the BOST control section 40 shown in FIG. 25A. FIG. 26B shows the configuration of the register group C465. FIG. 26C shows the configuration of memory addresses of the data scrambler 466. FIG. 27 shows the configuration of the program counter 410A used in embodiment 2-2.

In embodiment 2-2, as shown in FIG. 25A, the PG section 60 has six storage zones 611 to 616. An algorithmic data generation register control code ADRC is stored in the storage zone 616; algorithmic data generation register control data ADRD are stored in the storage zone 615; the test vector address control code TBAC is stored in the storage zone 614; the test vector address control data TBAD are stored in the storage zone 613: A/B/C register changeover data RSD are stored in the storage zone 612; and the test input/determination pattern signal JPS is stored in the storage zone 611. The code, data, and signals are included in the test pattern data downloaded from the TPM section 50 and stored into addresses N, N+1, . . . N+M of the PG section 60.

The addresses of the PG section 60 are advanced by a test vector address TBA (shown in FIGS. 28I, 30I, 32I, and 34I) output from the program counter 410A. The algorithmic data generation register control code ADRC (shown in FIGS. 28N, 30N, 32N, and 34N) stored in the storage zone 616 is supplied to the register groups A430, B450, and C460. The algorithmic data generation register control data ADRD (shown in FIGS. 28O, 30O, 32O, and 34O) stored in the storage zone 615 are supplied to the register groups A, B. The test vector address control code TBAC (shown in FIGS. 28J, 30J, 32J, and 34J) stored in the storage zone 614 and the test vector address control data TBAD stored in the storage zone 613 are supplied to the program counter 410A. The A/B/C register changeover data RSD stored in the storage zone 612 are supplied to the selector 473. The test input/determination pattern signal JPS stored in the storage zone 611 is supplied to the WF section 80.

The BOST control section 40 of embodiment 2-2 is formed from a plurality of 0-N channels. The respective channels correspond to, e.g., the plurality of X-direction lines of the semiconductor memory serving as the DUT 10. Each of the channels has register groups A430, B460, C465 shown in FIG. 25A, data scramblers 471, 472, and a selector 473. In the case of this multichannel configuration, the BOST control section 40 and the PG section 60 are provided on a per-channel basis. As mentioned in connection with embodiment 1-1 shown in FIGS. 4 and 5, the TMP section 50, the TG section 70, the WF section 80, the output determination section 85, the error information memory section 90, and the DUT-BOST I/F section 95 are also added to each channel.

The register group A430 has a control circuit 431, a main register A440, a comparison register A451, an effective bit register A452, and a bit comparison section 456. The control circuit 431 has an AND circuit 432, an OR circuit 433, and an AND circuit 434. A control code SA0 included in an algorithmic data generation register control code ADRC is supplied to one input of the AND circuit 432. A control code SA1 included in the algorithmic data generation register control code ADRC is supplied to one input of the OR circuit 433. A control code SA2 included in the algorithmic data generation register control code ADRC is supplied to one input of the AND circuit 434. An adder carrier output BAC output from a carrier terminal CO of the register group B is delivered to the other input of the AND circuit 434. An output from the AND circuit 434 is supplied to the other input of the AND circuit 431 (i.e., a reverse input) and the other input of the OR circuit 433. The AND circuit 432 produces a control signal S0, and the OR circuit 433 produces a control signal S1.

The main register A440 has a bit-by-bit OR circuit 441, an A+B adder circuit 442, a selector 443, a bit-by-bit AND circuit 444, a flip flop 445, a decoder 446, an OR circuit 447, an AND circuit 448, and an inverter 449. The bit-by-bit OR circuit 441 supplies an OR result formed from inputs A, B to an input A of the A+B adder circuit 442. An input A of the bit-by-bit OR circuit 441 is connected to an output Q of the flip flop 445. An input B of the bit-by-bit OR circuit 441 is provided with an output of the inverter 449 that inverts an output signal EBA (shown in FIGS. 28P, 30P, 32P, and 34P) from an output terminal 4 of an effective bit register A452. The algorithmic data generation register control data ADRD are supplied to the input B of the A+B adder circuit 442. The A+B adder circuit 442 supplies an addition output F formed from inputs A, B to an input C of the selector 443. The algorithmic data generation register control data ADRD are supplied to an input A of the selector 443. An output signal MRB from a main register B440 of the register group B460 is supplied to an input B of the selector 443. The output signal MRB from the main register B440 is shown in FIGS. 28R2, 30R, 32R2, and 34R.

The A+B adder 442 of the main register A440 produces, at a carrier terminal CO thereof, an adder carrier signal AAC (shown in FIG. 32T) of the register group A. The adder carrier signal AAC of the register group A is supplied to the register group B460.

In accordance with a control signal S0–SL, the selector 443 selects one from inputs A, B, and C and outputs the thus-selected input to an output F. The output F of the selector 443 is supplied to an input A of the bit-by-bit AND circuit 444. The input B of the bit-by-bit AND circuit 444 is given the output signal EBA from the output terminal 4 of the effective bit register A452. The output from the bit-by-bit AND circuit 444 is delivered to an input D of the flip flop 445.

The decoder 446 decodes the control signal S0–S1, and a resultant output is delivered to an input of the OR circuit 447. An output of the OR circuit 447 is delivered to one input of the AND circuit 448. The test cycle signal TCY is delivered to the other input of the AND circuit 448. An output from the AND circuit 448 is supplied to a clock input C of the flip flop 445. An output signal MRA from the main register A440 is output to an output Q of the flip flop 445. The output signal MRA from the main register A440 is shown in FIGS. 28R1, 30R, 32R1, and 34R.

The output F of the selector 443 is as follows. When the control codes SA0, SA1, and SA2 included in the algorithmic data generation register control code ADRC become SA0=0, SA1=0, and SA2=0, the input A is selected, and the algorithmic data generation register control data ADRD are output as immediate data. When SA0=L, SA1=0, and SA2=0, the input B is selected, whereby the MRB output from the main register B of the register group B is transferred as data to the output F of the selector 443. When SA0=0, SA1=1, and SA2=0, the input C is selected, and computation data input to the input C are output to the output F of the selector 443. When SA0=X, SA1=X, and SA2=1, the input C is selected, and computation data (link computation) supplied from the input C are output to the output F of the selector 443. The output F of the selector 443 is output as the output MRA of the main register A by way of the bit-by-bit AND circuit and the flip flop.

The comparison register A451 and the effective bit register A452 are each configured as shown in FIG. 25B. Each of the registers 451, 452 has a decoder 453, an AND circuit 454, and a flip flop 455. Further, each register has three input terminals 1, 2, and 3 and one output terminal 4. An input of the decoder 453 is connected to an input terminal 2. An output of the decoder 453 is connected to one input of the AND circuit 454. The other input of the AND circuit 454 is connected to the input terminal 3. An output of the AND circuit 454 is connected to the clock input C of the flip flop 455. An input D of the flip flop 455 is connected to an input terminal 1, and an output Q of the flip flop 455 is connected to the output terminal 4.

Algorithmic data generation register control data ARDR are supplied to a terminal 1 of the comparison register A451 and that of the effective bit register A452. The control signal S0–S1 is supplied to a terminal 2 of the comparison register A451 and that of the effective bit register A452. The test cycle signal TCY is supplied to a terminal 3 of the comparison register A451 and a terminal 3 of the effective bit register A452. An output signal CRA (shown in FIGS. 30Q, 32Q, and 34Q) of the comparison register A appears on a terminal 4 of the comparison register A451. The output signal CRA from the comparison register A451 is supplied to an input B of the bit comparator 456. An output signal MRA from the main register A440 is supplied to an input A of the bit comparator 456. The bit comparator 456 compares the inputs A and B on a per-bit basis, thereby producing a comparison coincidence signal CCA (shown in FIGS. 30S, 32S, and 34S) of the register group A. The comparison coincidence signal CCA assumes a high level H when the input A=the input B.

The effective bit register A452 produces the output signal EBA. The output signal EBA is shown in FIGS. 28P, 30P, 32P, and 34P. The output signal EBA assumes a high level H in response to an effective bit. This output is supplied to the input B of the bit-by-bit AND circuit 444.

The decoder 446 of the main register A440, the decoder 453 of the comparison register 451, and the decoder 453 of the effective bit register 452 decode the control signal S0–S1. These decoders are configured so as to produce a high-level output in response to the control signals S0–S1 that differ from each other. Consequently, when the control signals S0–S1 are different from each other, any of the main register A440, the comparison register A451, and the effective bit register A452 operates selectively.

The register group B460 is configured in the same fashion as the register group A430. The main register A440, the comparison register A451, and the effective bit register A452, all belonging to the register group A, are called the main register B, the comparison register B, and the effective bit register B in the register group B460. The main register B, the comparison register B, and the effective bit register B in the register group B460 are identical in configuration with the main register A440, the comparison register A451, and the effective bit register A452. The control circuit 431 and the bit comparator 456 other than these registers are also included in the register group B460 while assuming the same configuration. The A+B adder 442 of the register group B produces a carrier output BAC on the carrier terminal C0, and the carrier output BAC is supplied to the AND circuit 434 of the register group A430. The effective bit register B452 of the register group B460 produces an output signal EBB. The output signal EBB is shown in FIGS. 28P, 30P, 32P, and 34P along with the output signal EBA. The comparison register B451 of the register group B produces an output signal CRB. The output signal CRB is shown in FIGS. 30Q, 32Q, and 34Q along with the output signal CRA. The bit comparator 456 of the register group B460 produces a comparison coincidence signal CCB analogous to an output from the bit comparator 456 of the register group A. The comparison coincidence signal CCB is shown in FIGS. 30S, 32S, and 34S.

The output signal MRA from the main register A440 of the register group A430 is supplied to the data scrambler 471. The output signal MRB from the main register B of the register group B460 is supplied to the data scrambler 472. The data scramblers 471, 472 are extracted and shown in FIG. 26A. The data scramblers 471, 472 are formed from semiconductor memory. An input IN is supplied to the memory address of the semiconductor memory. Memory data corresponding to the memory address are output from an output OUT. Conversion data are written into the semiconductor memory constituting the data scramblers 471, 472 beforehand, whereby there is produced an output OUT into which the input IN has been converted in accordance with the conversion data. On the basis of the conversion data, the output OUT can be changed algorithmically, by cyclically changing the input IN.

The register group C465 has a data scrambler 466, flip flops 467, 478. The register group C465 is also shown in FIG. 26B. The data scrambler 466 constitutes the main register C and has three inputs 1, 2, 3, and an output 4. The output signal MRA from the main register A of the register group A430 is input to the input 1, and the output signal MRB from the main register B of the register group B460 is input to the input 2. A scramble number SCN included in the algorithmic data generation register control code ADRC is supplied to the input D of the flip flop 467. A scramble number setting enable code SCNE included in the algorithmic data generation register control code ADRC is supplied to one input of the AND circuit 469. The test cycle signal TCY is delivered to the other input of the AND circuit 469. An output of the AND circuit 469 is connected to the clock input C of the flip flop 467. An output Q of the flip flop 467 is connected to the input 3 of the data scrambler 466.

The data scrambler 466 is formed from the semiconductor memory addressed to the inputs 1, 2, and 3. As shown FIG. 26C, the scramble number SCN to be delivered to the input 3, the output signal MRB of the main register B to be delivered to the input 2, and the output signal MRA of the main register A to be delivered to the input 1 are taken as an address number assigned to the data scrambler 466. Conversion data are written into the data scrambler 466 beforehand, and a data output which changes algorithmically is output on the basis of a combination of the output signals MRA, MRB of the main registers A, B. Here, the scramble number SCN corresponds to an index number of the data algorithm to be output. When the scramble number setting enable code SCNE is at a high level H, the scramble number SCN is latched by the flip flop 467 at the test cycle signal TCY. Latching of the scramble number SCN obviates a necessity for setting a scramble number SCN for each test vector address.

The input D of the flip flop 468 is connected to the output 4 of the data scrambler 466. The test cycle signal TCY is delivered to the clock input C of the flip flop 468. An MRC output from the register group C465 (shown in FIG. 34V) is output from the output Q of the flip flop 468.

The selector 473 has inputs A, B, C, an output F, and a control input S*. An output signal of the data scrambler 471 is input to the input A; an output signal from the data scrambler 472 is input to the input B; and an output signal MRC from the register 465 of the register group C is input to the input C. A/B/C register change over data RSD stored in a storage zone 612 of the PG section 60 are input to the control input S* of the selector 473. On the basis of these inputs, the selector 473 outputs the test pattern signal TPS to the output F while selecting any of the inputs A, B, and C.

As mentioned previously, the circuit of the BOST control section 40 shown in FIG. 25A has a multichannel configuration of 0–N channels. FIG. 25A depicts one of the channels. The channels 0–N correspond to the plurality of X-direction lines of the memory of the DUT 10. Specifically, a plurality of test pattern signals TPS are simultaneously output in parallel from the respective channels corresponding to the X-direction lines of the semiconductor memory taken as the DUT 10. Each of the test pattern signals TPS is converted into the test input pattern signal TIP by the WF section 80 provided for each channel. The test input pattern signals TIP of the respective X-direction lines are supplied in parallel to the DUT 10. The test input/determination pattern signal JPS is also supplied from the storage zone 611 of the PG section 60 for each channel to the output determination section 85 of each channel. The test input/determination pattern signal JPS is compared with the test output pattern signal TOP output from the DUT 10 for each channel. The test address signal MAD obtained at the time of occurrence of an error is stored in the error information memory section 90 provided for each channel.

By reference to FIG. 27, the program counter 410A of embodiment 2-2 will now be described in detail. The program counter 410A is analogous to the program counter 410 shown in FIG. 20A. The program counter 410 is further provided with the selector 426 and the control circuit 427. In other respects, the program counter 410A is identical in configuration with the program counter 410 shown in FIG. 20.

The selector 426 is provided between the adder 414 and the input A1 of the selector 411. The selector 426 has the input A connected to the OUT terminal of the adder 414, and the input B for receiving the test vector address control data TBAD output from the storage zone 613 of the PG section 60. One is selected from the inputs A, B on the basis of the register group A, B comparison coincidence signals CCA, CCB (shown in FIGS. 30S, 32S, and 34S) input to the control terminal S.

The control circuit 427 has an OR circuit 428, AND circuits 429a, 429b, 429c, and a decoder 429d. The decoder 429d decodes the control signal S3–S4 included in the test vector address control code TBAC and outputs a resultant signal to the terminals 0 to 3. The terminal 1 of the decoder 429d is connected to one input of the AND circuit 429a. A bit comparison output CCA of the bit comparator A456 of the register group A430 is delivered to the other input. The terminal 2 of the decoder 429d is connected to one input of the AND circuit 429b. A bit comparison output CCB of the bit comparator B456 of the register group B is delivered to the other input of the AND circuit 429b. The AND circuit 429C is a three-input AND circuit. The bit comparison output CCA is delivered to one input; a bit comparison output CCB is delivered to the other input; and the terminal 3 of the decoder 429d is connected to the remaining input. Outputs from the AND circuits 429a, 429b, and 429c are supplied to the OR circuit 428. Further, an output from the terminal 0 of the decoder 429d is also delivered to the OR circuit 428. An output from the OR circuit 428 (an inverse output) becomes a register group A comparison coincidence signal CCS and a register group B comparison coincidence signal CCS, both being delivered to the control terminal S. When the register group A comparison coincidence signal CCS and the register group B comparison coincidence signal CCS, both being delivered to the control terminal S, have assumed a low level L, the selector 426 supplies the test vector address control data TBA delivered to the input B to the input A1 of the selector 411.

Figure 28:
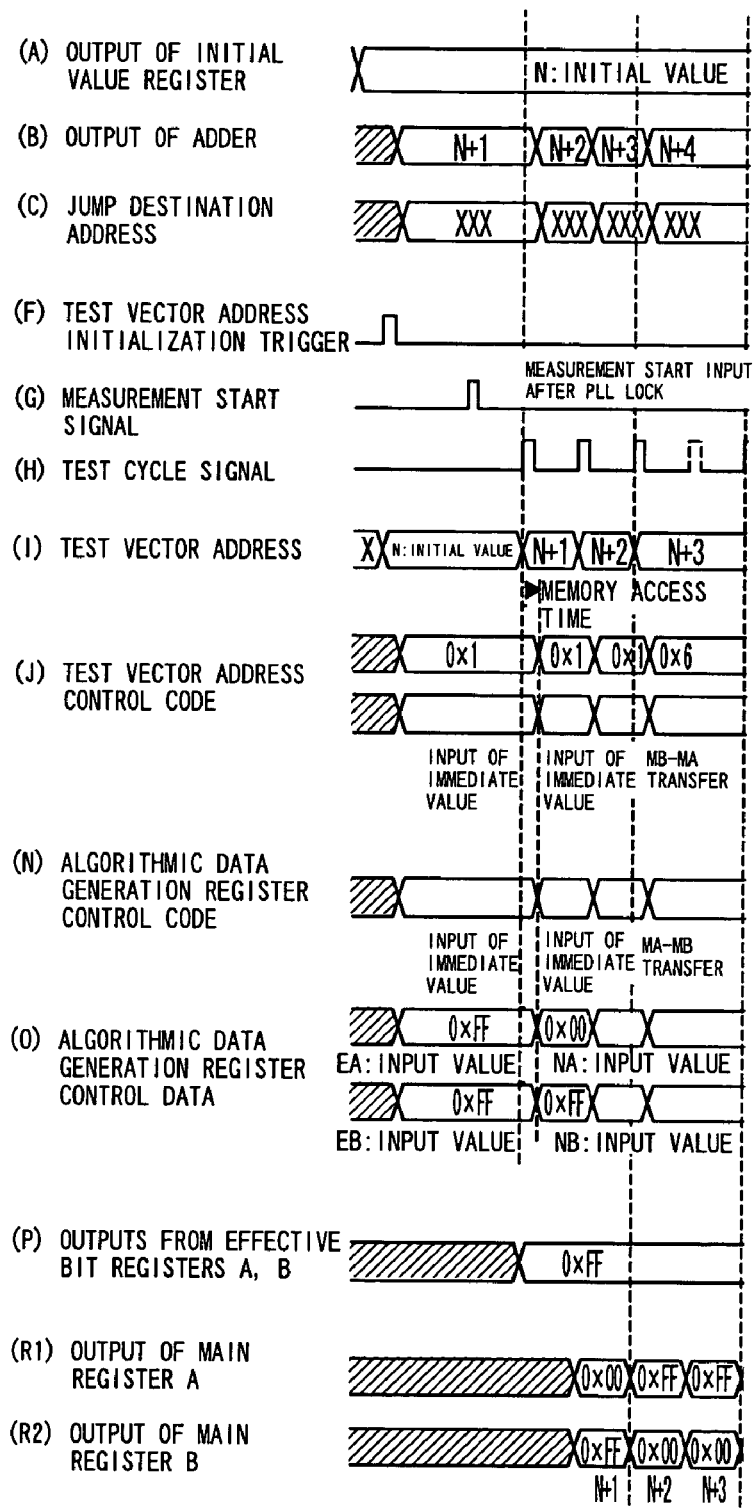
FIG. 28 shows an operation timing chart of embodiment 2-2.

FIG. 28 shows an operation timing chart of embodiment 2-2 obtained when the test vector address TBA is produced in a normal mode NOP and an output of the main register A440 and an output of the main register B440 are produced by combination of an immediate input and inter-register transfer.

FIGS. 28A shows an output INR of the initial value register 413; FIG. 28B shows an adder output ADO of the adder 414; FIG. 28C shows a jump destination address JAD; FIG. 28F shows a test vector address initial setting trigger TBAIT; FIG. 28G shows a measurement start signal MST; FIG. 28H shows the test cycle signal TCY; FIG. 28I shows the test vector address TBA; FIG. 28J shows the test vector address control code TBAC; FIG. 28N shows an algorithmic data generation register control code ADRC; FIG. 28O shows algorithmic data generation register control data ADRD; FIG. 28P shows an output EBA of the effective bit register A452 and an output EBB of the effective bit register B452; FIG. 28R1 shows an output MRA of the main register A440; and FIG. 28R2 shows an output MRB of the main register B440.

In FIG. 28, the test vector address control code TBAC and the algorithmic data generation control code ADRC are set in the manner shown in FIG. 29 with respect to the address values N, N+1, N+2, and N+3 of the test vector address TBA.

In FIG. 29, NOP means a normal mode, and a code of NOP is defined as 0x1. Further, STOP means a stop mode, and a code of STOP is defined as 0x6.

When the test vector address TBA is N, the test vector address control code TBAC assumes 0x1, which means the normal mode NOP. Along with setting of the initial value performed by the initial value register 413, the algorithmic data generation control code ADRC assumes EA=0xFF and EB=0xFF. Here, EA=0xFF means that 1111 is set to the higher four bits and the lower four bits of the effective bit register A452, respectively. When the test vector address TBA is N, the algorithmic data generation register control data ADRD are 0xFF. The data ADRD are set in the effective bit register A452 of the register group A430, and the effective bit register A452 is set to 0xFF. Similarly, EB=0xFF means that the effective bit register B452 is set to 0xFF. The effective bit register B452 of the register group B460 is set to 0xFF. Consequently, bits 0–7 of the main registers A440, B440 are taken as effective bits.

When the test vector address TBA is N+1, the test vector address control code TBAC assumes 0x1, which indicates a normal mode NOP, and the algorithmic data generation register control code ADRC assumes MA=1x00 and MB=0xFF. The algorithmic data generation register control data ADRD assume 0x00 with respect to the main register A440 and 0xFF with respect to the main register B460. Consequently, the output signal MRA from the main register A440 assumes 0x00, and the higher four bits and the lower four bits of the main register A440 assume 0000, respectively. The output MRB from the main register B440 assumes 0xFF, and the higher four bits and the lower four bits of the main register B440 assume 1111, respectively.

When the test vector TBA is N+2, the test vector address control code TBAC assumes 0x1, which means the normal mode NOP. The algorithmic data generation register control code ADRC assumes MA=MB (transfer from MB to MA) and MB=MA (transfer from MA to MB). The output signal MRA from the main register A440 assumes 0xFF, and the output signal MRB from the main register B440 assumes 0x00.

When the test vector address TBA is N+2, the test vector control code TBAC means 0x6, which means a stop STOP, so that operation is stopped.

Figure 30:
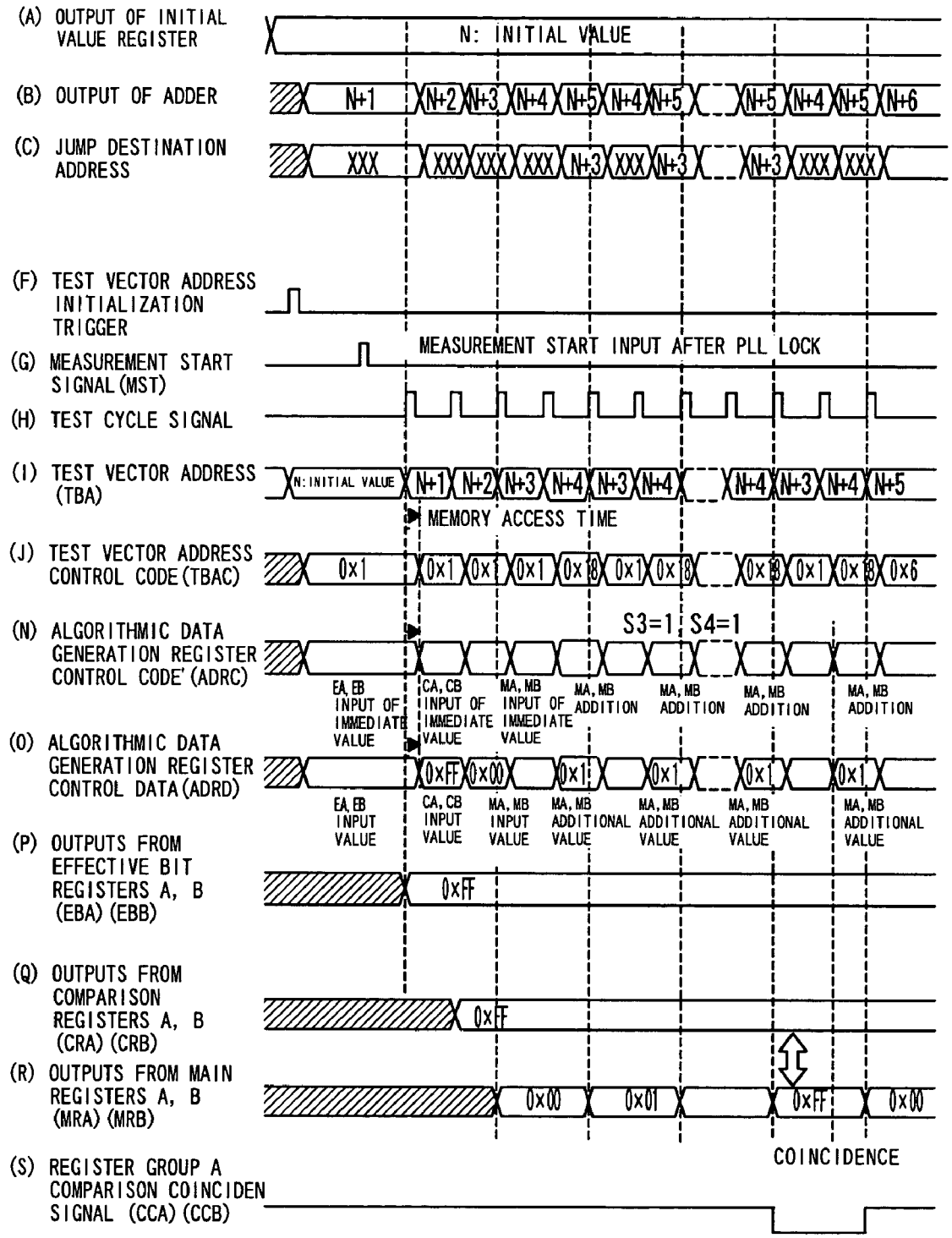
FIG. 30 shows a timing chart obtained when the test vector address TBA is produced by combination of a normal mode with register comparison and when outputs from the main registers are produced by combination of an immediate value input of a register with register operation.

FIG. 30 shows a timing chart obtained when the test vector address TBA is produced by combination of a normal mode with register comparison and when outputs from the main registers A440, B440 are produced by combination of an immediate value input of a register with register operation. Through the operation shown in FIG. 30, the test vector address control code TBAC and the algorithmic data generation register control code ADRC are set with respect to the address values N, N+1, N+2, N+3, N+4, and N+5 of the test vector address TBA in a manner shown in FIG. 31. [MAB/CAB N+3] of the test vector address control code TBAC shown in FIG. 31 means a jump to the specified jump destination address N+3 until the values output from the main registers A440, B440 coincide with the comparison registers A451, B451. If coincidence exists, operation proceeds to the next test vector address.

FIG. 30A shows an output INR of the initial value register 413; FIG. 30B shows the adder output ADO of the adder 414; FIG. 30C shows a jump destination address JAD; FIG. 30F shows the test vector address initial setting trigger TBAIT; FIG. 30G shows a measurement start signal MST; FIG. 30H shows a test cycle signal TCY; FIG. 30I shows the test vector address TBA; FIG. 30J shows the test vector address control code TBAC; FIG. 30N shows the algorithmic data generation control code ADRC; FIG. 30O shows the algorithmic data generation control data ADRD; FIG. 30P shows the output signals EBA, EBB from the effective bit registers A452, B452; FIG. 30Q shows the output signals CRA, CRB from the comparison registers A451, B451; FIG. 30R shows the output signals MRA, MRB from the main registers A440, B440; and FIG. 30S shows the register group A comparison coincidence signal CCA and the register group B comparison coincidence signal CCB.

When the test vector address TBA is N, the algorithmic data generation control code ADRC assumes EA=0xFF and EB=0xFF, and the effective bit registers A452, B452 are initialized in the same manner as shown in FIG. 28.

When the test vector address TBA is N+1, the algorithmic data generation register control code ADRC assumes CA=0xFF and CB=0xFF. This means that 0xFF is set in the comparison registers A451, B451. An immediate value of the algorithmic data generation register control data ADRD is input to the comparison registers A451, B451, and 0xFF is input to the comparison registers A451, B451.

When the test vector address TBA has assumed N+2, the algorithmic data generation register control code ADRC assumes MA=0x00 and MB=0x00. This means that 0x00 is set in the main registers A440 and B440. An immediate value of the algorithmic data generation register control data ADRD is input to the main registers A440, B440, and 0x00 is set in the main registers A440, B440.

When the test vector address TBA has assumed N+3, the algorithmic data generation register control code ADRC assumes MA=MA+1, MB=MB+1. This means that one is added to values output from the main registers A440, B440 during a previous cycle and that the results are set in the respective main registers A440, B440. The output signals MRA, MRB from the main registers A440, B440 assume 0x01.

When the test vector address TBA has assumed N+4, operation of MAB/CAB N+3 is performed. This means that the test vector address TBA jumps to the specified jump destination address N+3 until the values output from the main registers A440, B440 coincide with the values output from the comparison registers A451, B451. The test vector address TBA again jumps to the specified jump destination address N+3. Further, the algorithmic data generation register control code ADRC assumes MA=MA+1, MB=MB+1. This means that one is added to the values output from the main registers A440, B440 during a previous cycle and that the results are set in the respective main registers A440, B440. The output signals MRA, MRB from the main registers A440, B440 assume 0x02.

These operations are repeated until the output signals MRA, MRB from the main registers A440, B440 assume 0xFF output from the comparison registers A451, B451. If the output signals MRA, MRB from the main registers A440, B440 coincide with the outputs from the comparison registers A451, B451, the bit comparator 456 produces the comparison coincidence signals CCA, CCB, and one is added to 0xFF output from the main registers A440, B440. If one is added to the 0xFF output from the main registers A440, B440, the output signals MRA, MRB from the main registers A440, B440 assume 0x100. However, since the output signals EBA, EBB from the effective bit registers A452, B452 are set to 0xFF, the output signals MRA, MRB from the main registers A440, B440 return to 0x00.

As shown in FIG. 30, the output signals MRA, MRB from the main registers A440, B440 are produced on the basis of a combination of immediate values input to the registers with computing operations of the registers. The outputs MRA, MRB change from 0x00 to 0xFF.

Figure 32:
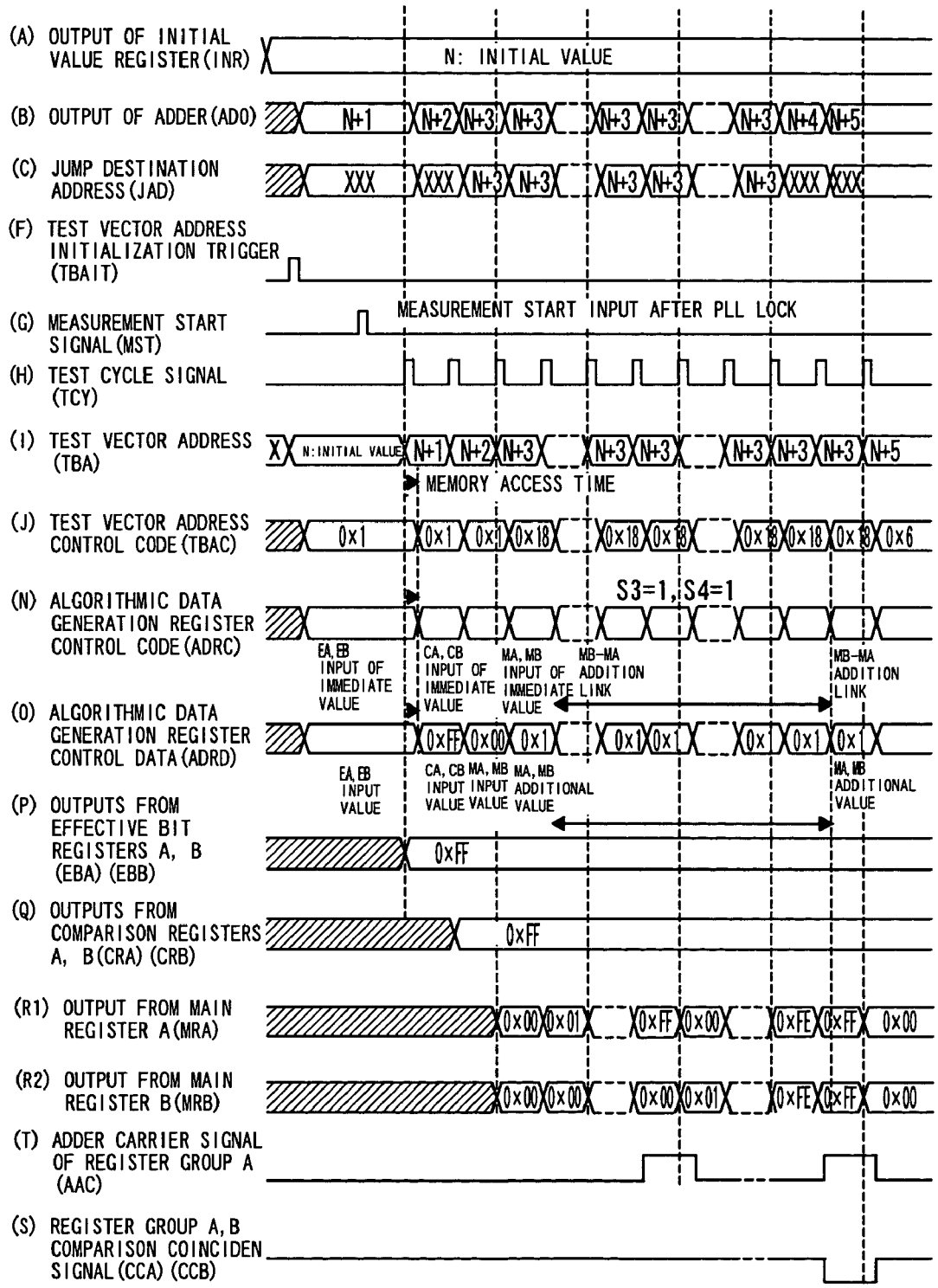
FIG. 32 shows an operation timing chart obtained when the test vector address TBA is produced by combination of a normal mode with comparison between the registers and the output signals MRA, MRB from the main registers are produced by combination of the immediate values input to the registers with register link computation.

FIG. 32 shows an operation timing chart obtained when the test vector address TBA is produced by combination of a normal mode with comparison between the registers and the output signals MRA, MRB from the main registers A440, B440 are produced by combination of the immediate values input to the registers with register link computation. Through the operations shown in FIG. 32, the test vector address control code TBAC and the algorithmic data generation register control code ADRC are set with respect to the address values N, N+1, N+2, N+3, N+4 of the test vector address TBA in the manner as shown in FIG. 33. In FIG. 33, this means that the code [MAB/CAB N+3] of the test vector address control code TBAC with respect to the address value N+3 of the test vector address TBA jumps to the specified jump destination address N+3 until the values output from the main registers A440, B440 coincide with the values output from the comparison registers A451, B451. If a coincidence exists, operation proceeds to the next test vector address. In FIG. 32, when the test vector address TBA has assume N+3, operation pertaining to MAB/CAB N+3 is performed, and the test vector address TBA repeats N+3.

FIG. 32A shows an output INR of the initial value register 413; FIG. 32B shows the adder output ADO of the adder 414; FIG. 32C shows the jump destination address JAD; FIG. 32F shows the test vector address initial setting trigger TBAIT; FIG. 32G shows a measurement start signal MST; FIG. 32H shows a test cycle signal TCY; FIG. 32I shows the test vector address TBA; FIG. 32J shows the test vector address control code TBAC; FIG. 32N shows the algorithmic data generation control code ADRC; FIG. 32O shows the algorithmic data generation control data ADRD; FIG. 32P shows the output signals EBA, EBB from the effective bit registers A452, B452; FIG. 32Q shows the output signals CRA, CRB from the comparison registers A451, B451; FIG. 32R1 shows the output signal MRA from the main register A440; FIG. 32R2 shows the output signal MRB from the main register B440; FIG. 32T shows a carrier output AAC of the A+B adder 422 of the register group A; and FIG. 32S shows the register group A comparison coincidence signal CCA and the register group B comparison coincidence signal CCB.

Operation to be performed when the test vector address TBA assumes N, N+1, and N+2 is identical with that shown in FIG. 29. When the test vector address TBA has become N+3, the algorithmic data generation register control code ADRC instructs MA=MA+1, LMB+1 along with the operation pertaining to MAB/CAB N+3. MA=MA+1 means that one is added to the value output from the main register A440 during a previous cycle. One is added to the output from the main register A440 every time the test vector address TBA assumes N+3. LBM+1 means that, when the carrier output AAC is produced by the A+B adder 442 of the main register A440, one is added to the main register B440. Consequently, when the test vector address TBA has repeated N+3, the main register B440 performs a link operation for repeating an output produced in a previous cycle. Every time the output of the main register A440 has assumed 0xFF and the carrier output AAC is produced, one is added to the output of the main register B440.

These operations are iterated until the output signal MRA from the main register A440 assumes 0xFF and the signal output MRB from the main register B440 assumes 0xFF. If the output signals MRA, MRB from the main registers A440, B440 assume 0xFF, the output signals MRA, MRB from the main registers A440, B440 return to 0x00 by means of the output signals CCA, CCB from the bit comparators 456 of the register groups A, B.

Figure 34:
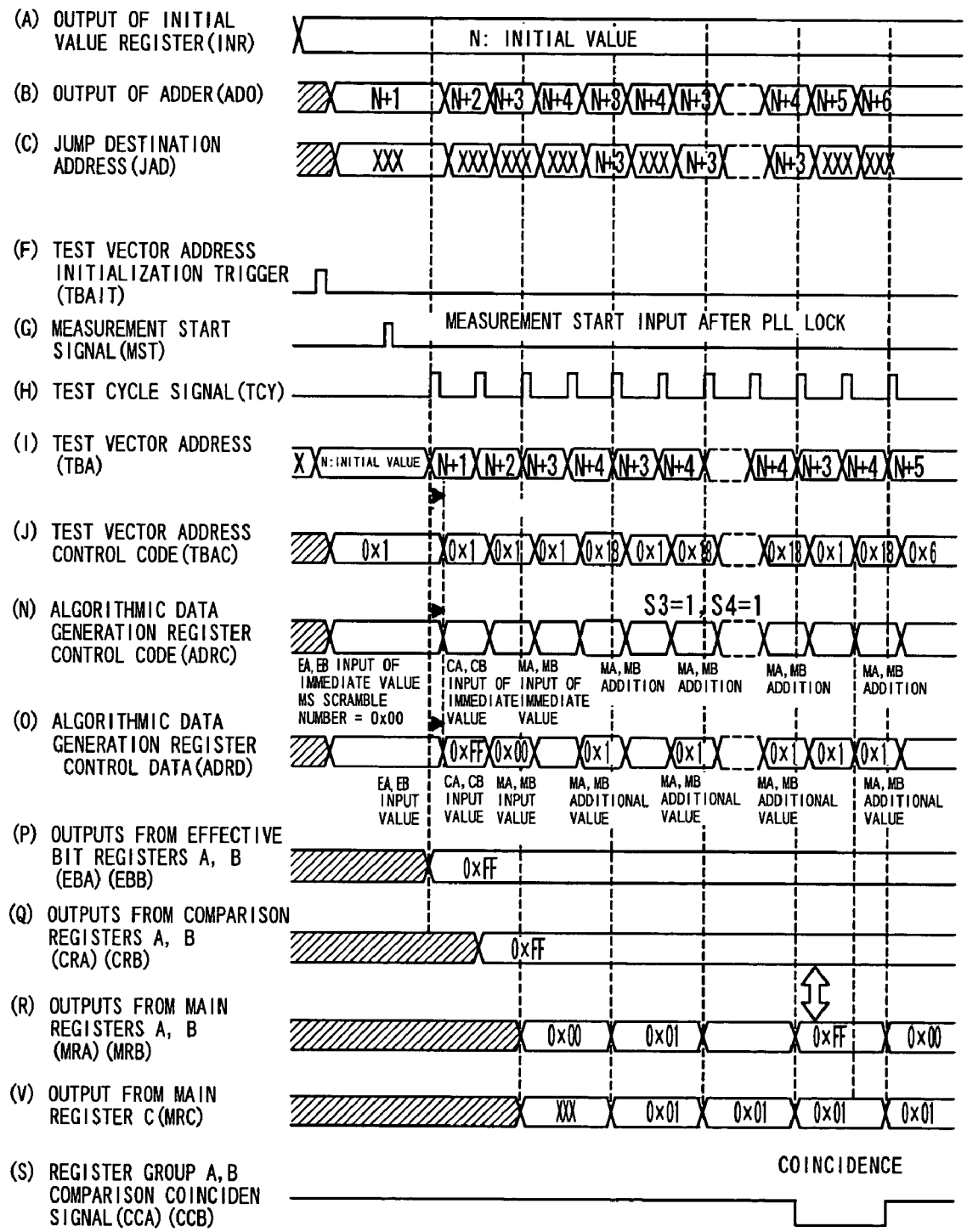
FIG. 34 shows an operation timing chart obtained when the test vector address TBA is produced by combination of a normal mode with comparison between the registers and the output signals MRA, MRB from the main registers are produced by combination of the immediate values input to the registers with operations of the registers.

FIG. 34 shows an operation timing chart obtained when the test vector address TBA is produced by combination of a normal mode with comparison between the registers and the output signals MRA, MRB from the main registers A440, B440 are produced by combination of the immediate values input to the registers with operations of the registers. Through the operations shown in FIG. 34, the test vector address control code TBAC and the algorithmic data generation register control code ADRC are set with respect to the address values N, N+1, N+2, N+3, N+4, N+5 of the test vector address TBA in the manner as shown in FIG. 35. In FIG. 35, this means that the code [MAB/CAB N+3] of the test vector address control code TBAC with respect to the address value N+4 of the test vector address TBA jumps to the specified jump destination address N+3 until the values output from the main registers A440, B440 coincide with the values output from the comparison registers A451, B451. If a coincidence exists, operation proceeds to the next test vector address. In FIG. 34, when the test vector address TBA has assumed N+4, operation pertaining to MAB/CAB N+3 is performed, and the test vector address TBA repeats N+3.

FIG. 34A shows an output INR of the initial value register 413; FIG. 34B shows the adder output ADO of the adder 414; FIG. 34C shows the jump destination address JAD; FIG. 34F shows the test vector address initial setting trigger TBAIT; FIG. 34G shows a measurement start signal MST; FIG. 34H shows a test cycle signal TCY; FIG. 34I shows the test vector address TBA; FIG. 34J shows the test vector address control code TBAC; FIG. 34N shows the algorithmic data generation control code ADRC; FIG. 34O shows the algorithmic data generation control data ADRD; FIG. 34P shows the output signals EBA, EBB from the effective bit registers A452, B452; FIG. 34Q shows the output signals CRA, CRB from the comparison registers A451, B451; FIG. 34R shows the output signals MRA, MRB from the main registers A440, B440; FIG. 34V shows an output signal MRC from the main register C466; and FIG. 34S shows the register group A comparison coincidence signal CCA and the register group B comparison coincidence signal CCB.

When the test vector address TBA assumes N, the algorithmic data generation register control code ADRC is set such that EA=0xFF, EB=0xFF, and MC=0x00. Specifically, 0xFF is set to the effective bit registers A452, B452; and 0x00 is set to the main register C465. The scramble number SCN of the main register C465 is set to 0x00, and the main register C465 produces an output MRC through use of a data algorithm of scramble number 0x00. When the test vector address TBA has assumed N+1, the algorithmic data generation register control code ADRC assumes CA=0xFF, CB=0xFF. 0xFF is set to both the comparison registers A451, B451. When the test vector address TBA has assumed N+2, the algorithmic data generation control code ADRC assume MA=0x00, MB=0x00, and 0x00is set to the main registers A440, B440. When the test vector address TBA has assumed N+3, the algorithmic data generation register control code ADRC assumes MA=MA+1, MB=MB+1. One is added to the respective values output from the main registers A440, B440 during a previous cycle.

When the test vector address assumes N+4, the test vector address control code TBAC assumes 0018. Through MAB/CAB N+3 operation, there is issued an instruction for returning the test vector address TBA to N+3. Simultaneously, the algorithmic data generation register control code ADRC assumes MA=MA+1, MB=MB+1, and one is again added to the respective values output from the main registers A440, B440. When the test vector address TBAN has returned to N+3, the algorithmic data generation register control code ADRC assumes MA=MA+1, MB=MB+1, whereby one is added to the respective values output from the main registers A440, B440 during a previous cycle. The output MRA from the main register A440 and the output MRB from the main register B440 are sequentially increased. If the output MRA from the main register A440 and the output MRB from the main register B440 assume 0xFF, the output MRA from the main register A440 and the output MRB from the main register B440 return to 0x00 by means of the outputs CCA, CCB from the bit comparator 456.

The operation shown in FIG. 34 enables sharing of a jump destination pattern by means of different test pattern signals, thereby resulting in a reduction in the number of test vectors.

Embodiment 2-2 yields the same effects as those yielded in embodiment 1. In addition, the algorithmic test pattern signal TPS can be produced on the basis of the algorithmic data generation register control code ADRC and an algorithmic data generation register control data RDRD, thereby enabling a reduction in the number of test vectors. Various test pattern data are produced, and a variety of function tests can be performed. By means of the multichannel configuration, the test pattern signals TPS are produced in parallel to each other for the respective channels 0 to N. The test pattern signals TPS corresponding to, e.g., the X-direction lines, can be supplied in parallel. For instance, a digital circuit included in the DUT 10; particularly, a memory circuit, can be tested effectively.

Embodiment 2-3

Figure 36:
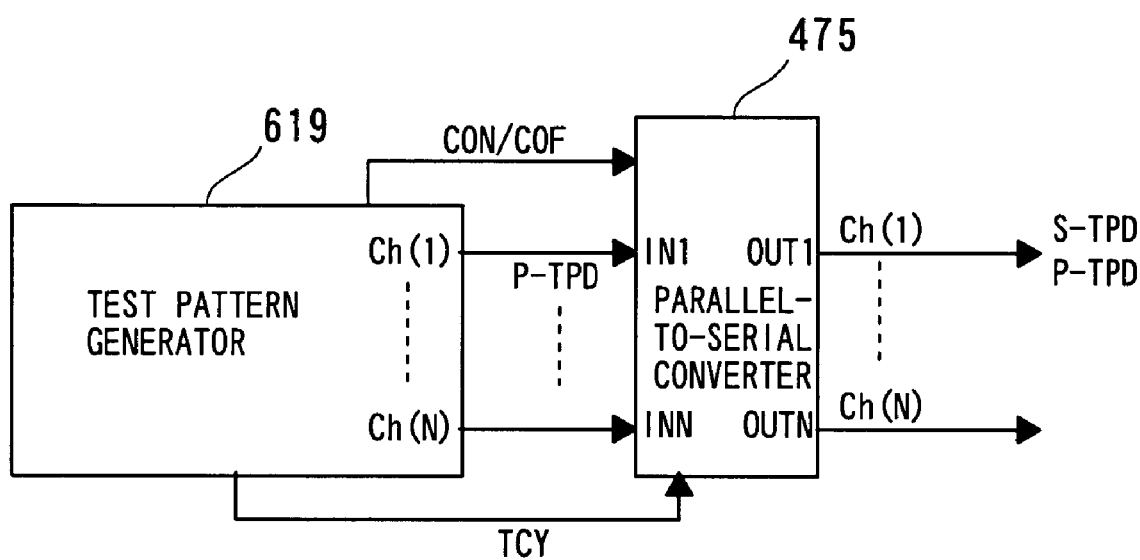
FIG. 36 shows the configuration of the BOST control section 40 of embodiment 2-3
Figure 37:
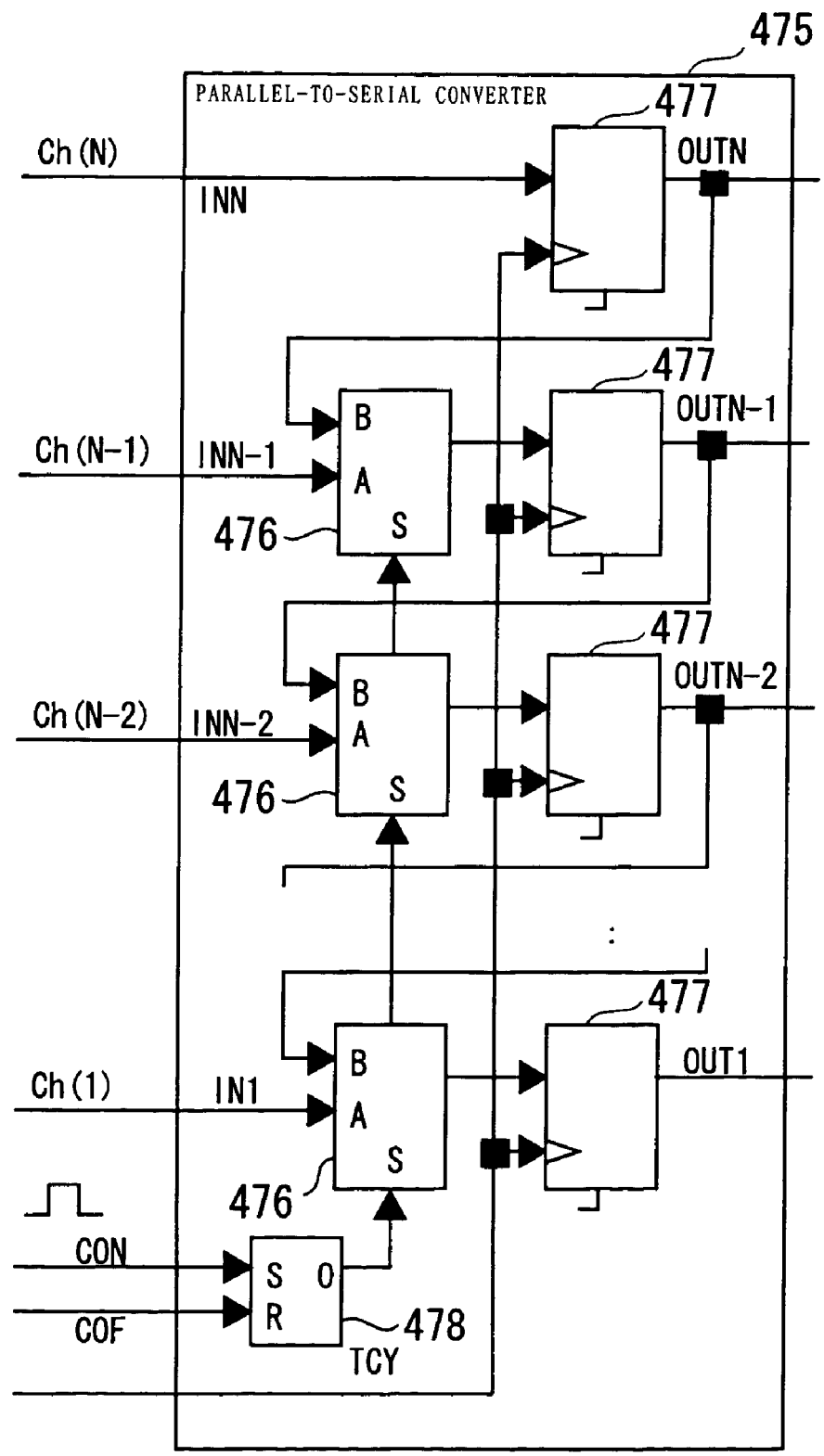
FIG. 37 shows details of a parallel-to-serial converter used for the BOST control section.
Figure 38:
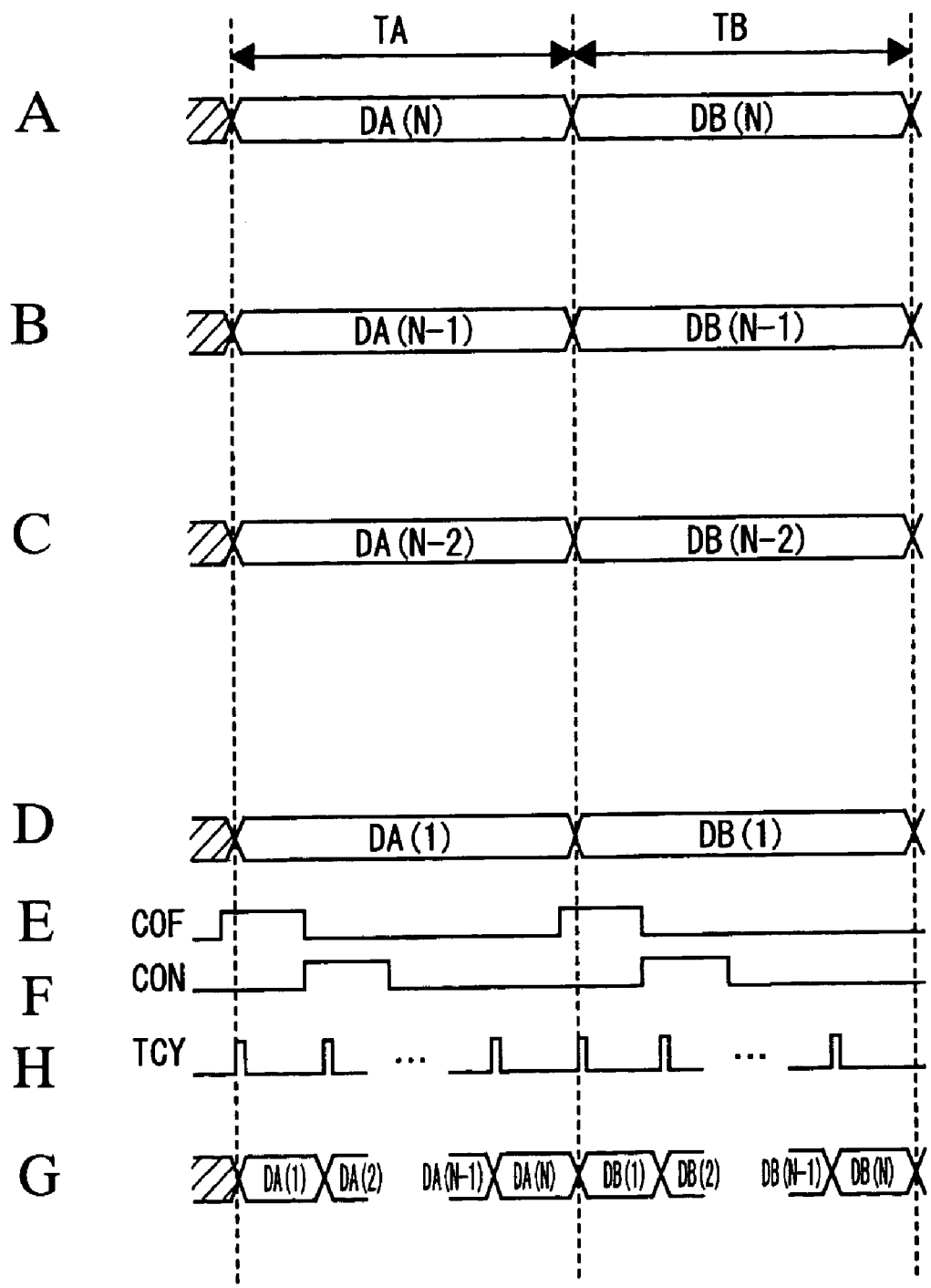
FIG. 38 is a timing chart of the parallel-to-serial converter.

Embodiment 2-3 relates to an apparatus for testing a semiconductor integrated circuit of the invention having a parallel-to-serial converter 457 for converting a test pattern signal TPS produced in parallel into a serial test pattern signal. FIG. 36 shows the configuration of the BOST control section 40 of embodiment 2-3; FIG. 37 shows details of a parallel-to-serial converter used for the BOST control section; and FIG. 38 is a timing chart of the parallel-to-serial converter.

Embodiment 2-3 has a parallel-to-serial converter 475 and a test pattern generator 619. The parallel-to-serial converter 475 is included in the BOST control section 40, and the test pattern generator 619 is included in the PG section 60. The parallel-to-serial converter 475 has a plurality of input terminals IN1 to INN and a plurality of output terminals OUT1 to OUTN. The test pattern generator 619 is formed into a multichannel configuration. The test pattern generator 619 produces test pattern data TPD simultaneously and in parallel for the respective channels CH(1) to CH(N). Particularly, the parallel test pattern data are depicted by a code P-TPD. The test parallel-serial converter 475 has the function of converting the parallel test pattern data P-TPD output from the channels CH(1) to CH(N) into serial test pattern data S-TPD and outputting the serial test pattern data to the respective output terminals OUT1 to OUTN. The parallel-to-serial converter 475 can output the parallel test pattern data P-TPD in unmodified form.

As shown in FIG. 37, the parallel-to-serial converter 475 is formed into a multichannel configuration and has a plurality of channels CH1 to CHN. The input terminals IN1 to INN and the output terminals OU1 to OUTN are formed for the respective channels CH1 to CHN. The respective channels CH1 to CHN−1 of the parallel-to-serial converter 475 are connected to the selectors 476 and the flip flops 477. Only the flip flops 477 are connected to the channels CHN of the parallel-to-serial converter 475. The selectors 476 each have the inputs A, B, the control terminal S, and the output F. The inputs A of the respective selectors 476 provided for the channels CH1 to CHN−1 are connected to the input terminals IN1 to INN−1. The inputs B of the respective selectors 476 are connected to outputs Q of the flip flops 477 provided for the next channels CH2 to CHN.

Outputs F of the flip flops 477 provided for the channels CH1 to CHN are connected to output terminals OUT1 to OUTN. The test cycle signal TCY is delivered to the clock inputs of the flip flops 477.

The parallel-to-serial converter 475 further has an SR flip flop 478. The SR flip flop 478 has a set input S and a reset input R. An output 0 of the respective SR flip flop 478 is connected to the control terminals S of the selectors 476. When the set input S of the SR flip flop 478 has assumed a high level H in response to a conversion ON signal CON, the output O assumes a high level H. The inputs B of the respective selectors 476 are connected to the outputs F. If the reset input R of the SR flip flop 478 has assumed a high level H in response to a conversion OFF signal COF, the output O of the same assumes a low level L, whereby the respective selectors 476 are switched so as to impart the inputs A to the outputs F.

FIG. 38E shows a conversion ON signal CON, and FIG. 38F shows a conversion OFF signal COF. When the SR flip flop 478 has received the conversion OFF signal COF and the inputs A of the respective selectors 476 are connected to the output F, parallel test pattern data P-TDP shown in FIGS. 38A to 38D are output to the respective output terminals OUT1 to OUTN of the parallel-to-serial converter 475. In relation to the parallel test pattern data P-TDP, test pattern data DA(1), . . . , DA(N−2), DA(N−1), and DA(N) supplied to the input terminals IN1 to INN are output in their unmodified forms and in parallel during the first test cycle TA (TA=N×TCY). During a second test cycle TB (TB=N× TCY) subsequent to the test cycle TA, the test pattern data DB(1), . . . DB(N−2), DB(N−1), and DB(N) are output in parallel and in unmodified forms.

When the conversion ON signal CON has assumed a high level H and the inputs B of the respective selectors 476 are connected to the outputs F, serial test pattern data S-TPD shown in FIG. 38G appear. In relation to the serial test pattern data S-TPD, outputs at the output terminals OUT1 to OUTN are sequentially switched in the manner shown in FIG. 38G in synchronism with the test cycle signal TCY shown in FIG. 38H. FIG. 38G illustrates the serial test pattern data TPDS appearing at the output terminal OUT1. In synchronism with the test cycle signal TCY, test data DA(1), DA(2), . . . DA(N−1), and DA(N) are sequentially and serially output during the first test cycle TA. Similarly, the test data DB(1), DB(2), . . . DB(N−1), and DB(N) are sequentially output during a second test cycle TB.

Embodiment 2-3 yields the same effect as that yielded by embodiment 1. In addition, the BOST control section 40 has the parallel-to-serial converter 475. Hence, the test pattern data can be output while being converted from parallel data into serial data. Further, the test pattern data required to produce serial pattern data do not need to be taken into the TPM section 50. The storage capacity of the PG section 60 required for taking in the test pattern data can also be reduced. Function tests based on the serial test pattern data can also be performed. Function tests of compatible types can be performed without capturing special test pattern data.

Embodiment 2-4

Figure 39:
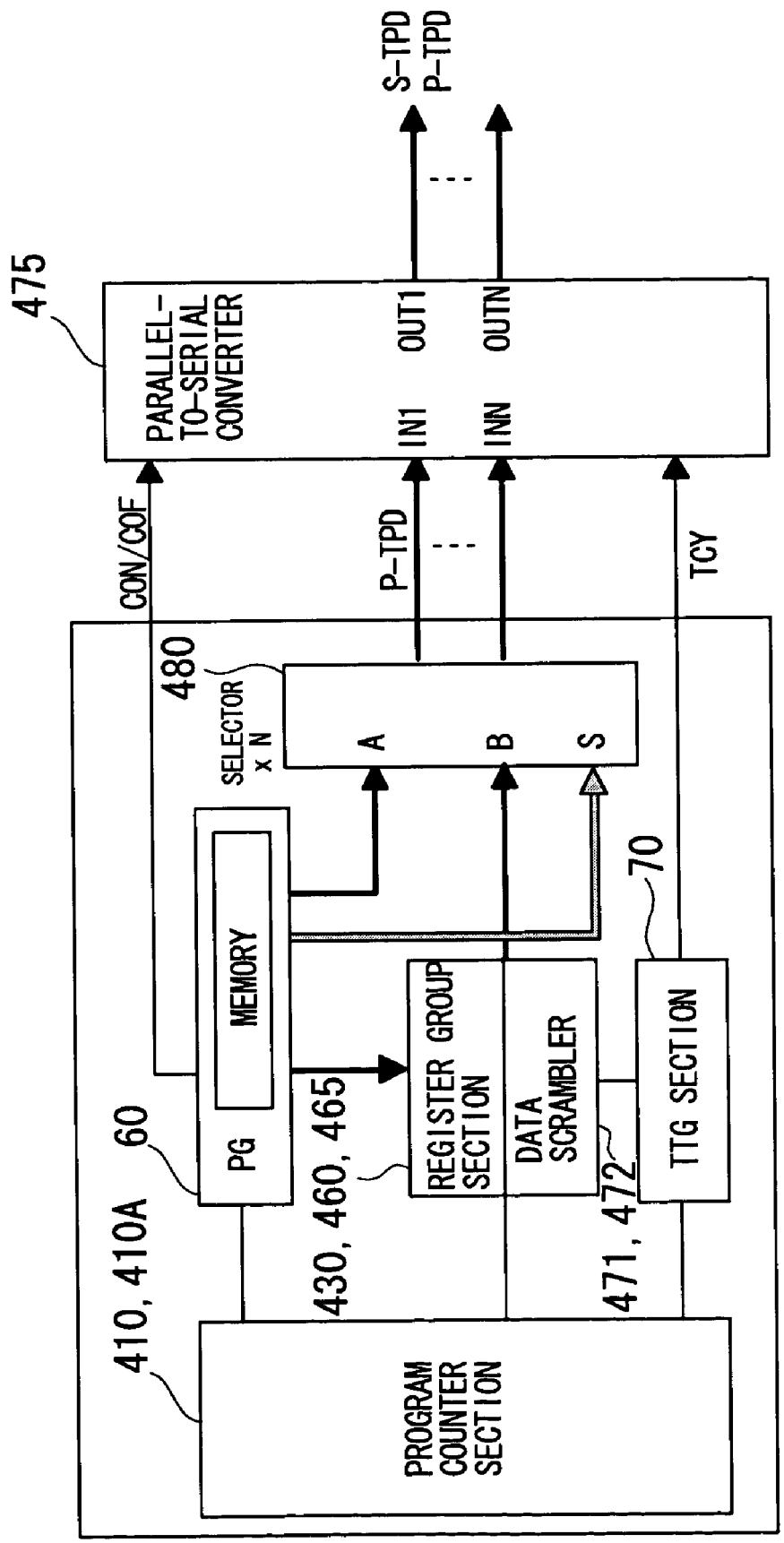
FIG. 39 shows the configuration of embodiment 2-4.

Embodiment 2-4 is an embodiment of the apparatus for testing a semiconductor integrated circuit of the invention into which embodiments 2-1, 2-2, and 2-3 are combined. FIG. 39 shows the configuration of embodiment 2-4. Embodiment 2-4 has the PG section 60; the program counter 410 or 410A; the register groups 430, 460, and 465; the data scramblers 471, 472; selectors 480; and the parallel-to-serial converter 475. The PG section 60 is configured in the same manner as in embodiment 2-2, and the program counter 410/410A is configured in the same manner as in embodiments 2-1, 2-2. The register groups 430, 460, 465 and the data scramblers 471, 472 are configured in the same manner as in embodiment 2-2. The parallel-to-serial converter 475 is configured in the same manner as in embodiment 2-3.

The selector 480 is formed to have multi channels; that is, N channels, and is provided for each of the channels. The selector 480 switches between the input A connected to the PG section 60 and the input B connected to the data scramblers 471, 472, by means of the control signal S output from the PG section 60. The parallel-to-serial converter 475 converts the parallel test pattern data P-TPD output from the selector 480 into serial test pattern data S-TPD, as required.

Embodiment 2-4 yields the same effect as that yielded by embodiment 1 and, in addition, enables production of a variety of test pattern data sets, thereby readily effecting a plurality of types of function tests for a digital circuit.

Embodiment 2-5

Figure 40:
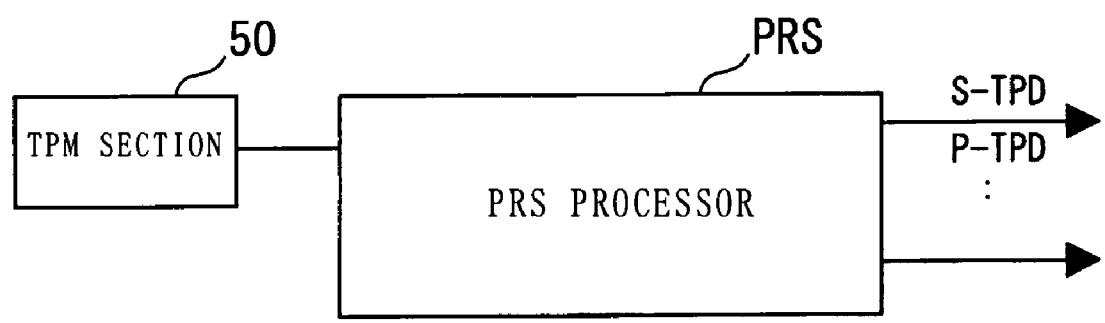
FIG. 40 shows the configuration of embodiment 2-5.

Embodiment 2-5 relates to a processor PRS in to which the circuits shown in FIG. 39 are packaged. FIG. 40 shows the configuration of embodiment 2-5. The processor PRS has the functions into which the PG section 60, the TG section 70, the program counters 410/410A, the register groups 430, 460, 465, the data scramblers 471, 472, the selectors 480, and the parallel-to-serial converters 475, all being shown in FIG. 39, are packaged. The processor PRS is formed from a CPU or DSP.

Embodiment 2-5 yields the same effect as that yielded by embodiment 2-4, and the BOST device 20 is more simplified.

Embodiment 2-6

Figure 41:
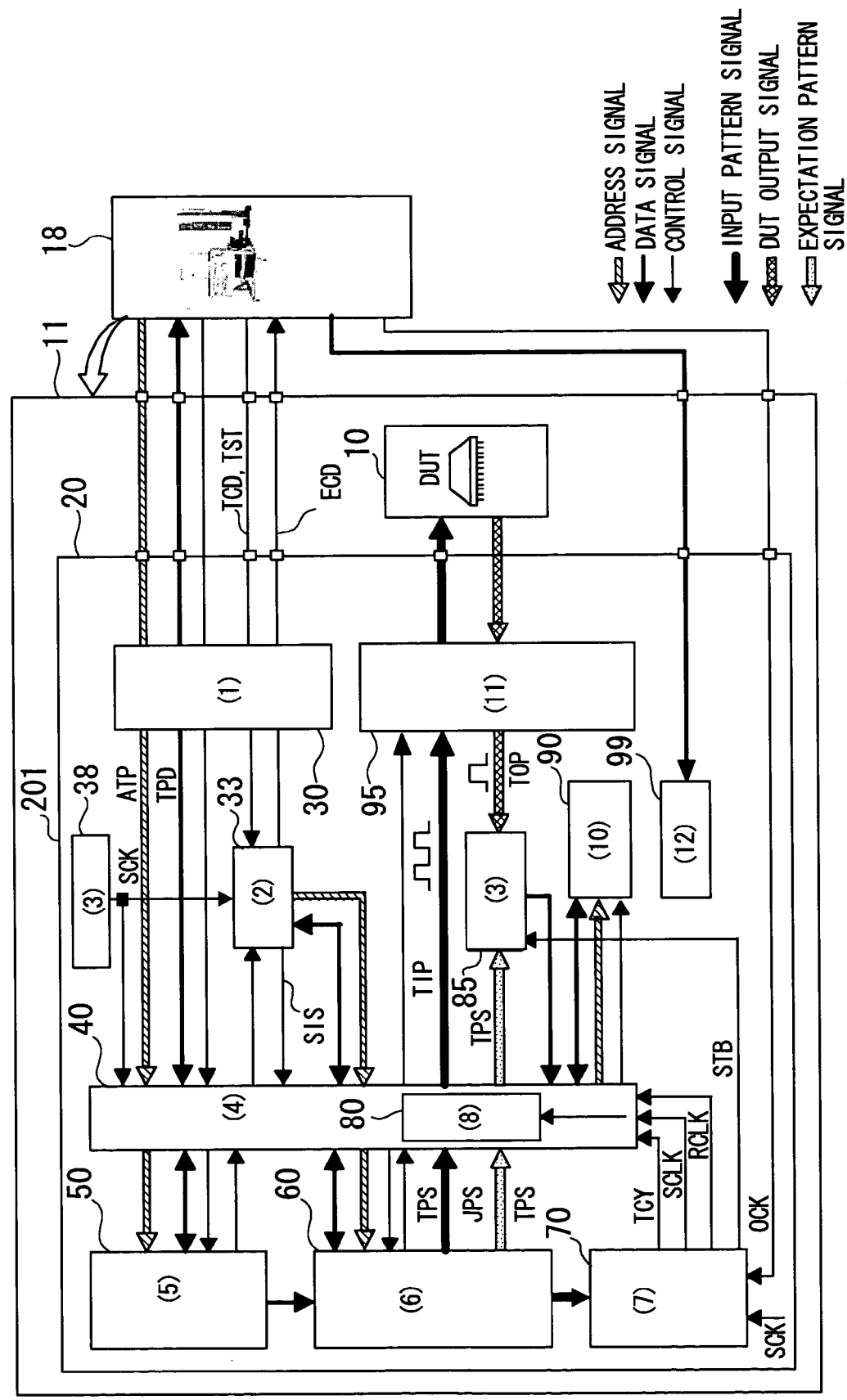
FIG. 41 shows the overall configuration of the test apparatus of embodiment 2-6.
Figure 42:
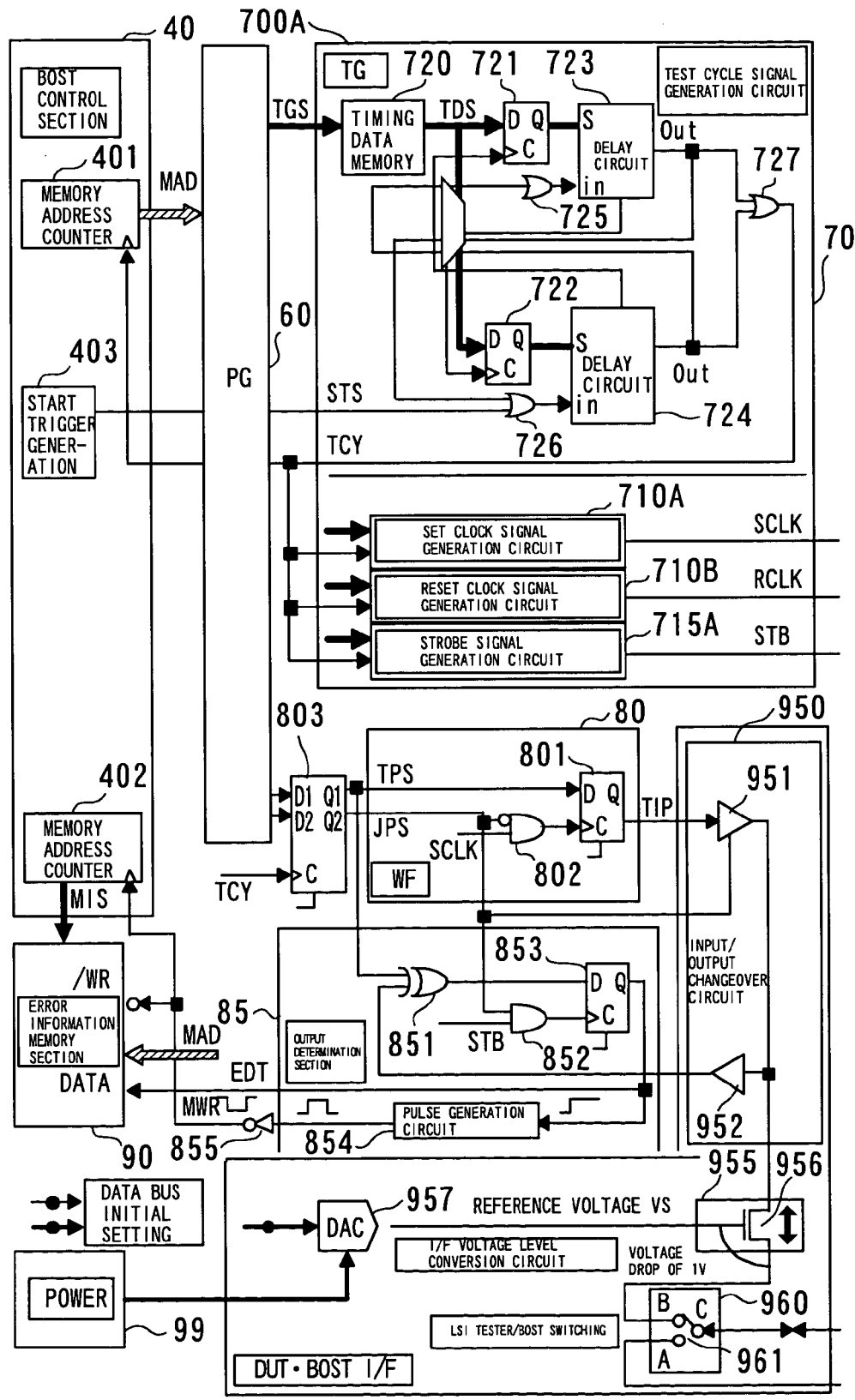
FIG. 42 shows a detailed configuration of the BOST control section, that of the TG section, that of the WF section, that of the output determination section, and that of the DUT-BOST I/F section 95.
Figure 43:
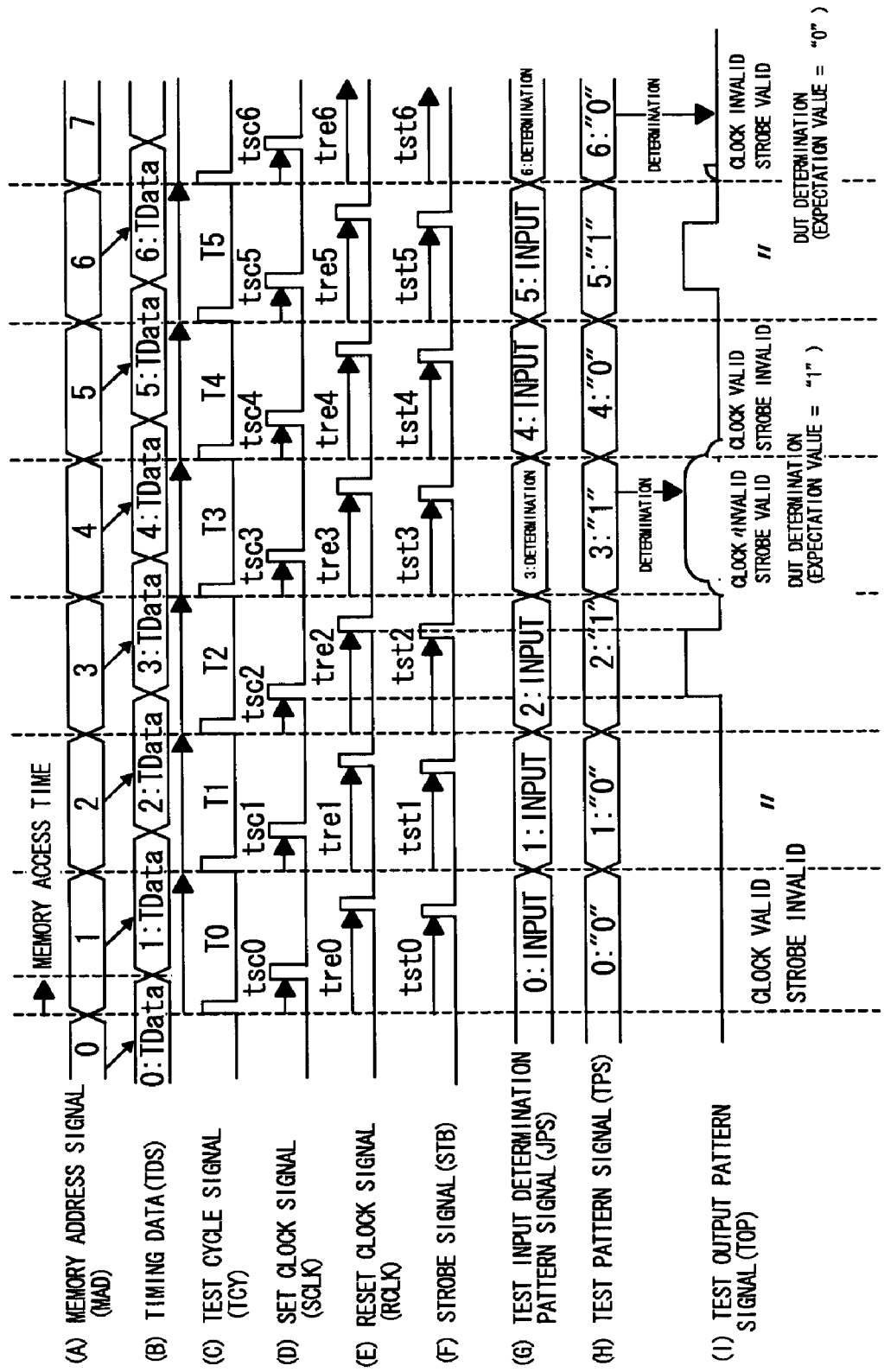
FIG. 43 shows an operation timing chart of embodiment 2-6.

Embodiment 2-6 is an embodiment of the improved apparatus for testing a semiconductor integrated circuit of the invention which enables expansion of capability of the TG section 70 and variations in conditions for timing. FIG. 41 shows the overall configuration of the test apparatus of embodiment 2-6. FIG. 42 shows a detailed configuration of the BOST control section 40, that of the TG section 70, that of the WF section 80, that of the output determination section 85, and that of the DUT-BOST I/F section 95. FIG. 43 shows an operation timing chart of embodiment 2-6.

The overall configuration of the embodiment 2-6 will be described by reference to FIG. 41. The overall configuration is analogous to that of embodiment 1 shown in FIG. 1. In relation to the overall configuration of embodiment 2-6, the TG section 70 supplies the set clock signal SCLK and the reset clock signal RCLK to the BOST control section 40, in addition to supplying the test cycle signal TCY and the strobe signal STB. The set clock signal SCLK and the reset clock signal RCLK are produced in place of the clock signal CLK of the first embodiment. In other respects, embodiment 2-6 is identical in configuration with embodiment 1. Like sections are assigned like reference numerals, and their repeated explanations are omitted.

Detailed circuits shown in FIG. 42 are analogous to those shown in FIG. 2. In relation to the detailed circuits, the TG section 70 includes a test cycle signal generation circuit 700A, a set clock signal generation circuit 710A, are set clock signal generation circuit 710B, and a strobe signal generation circuit 715A. The configurations of the signal generation circuits 700A, 710A, 710B, and 715A differ from those of the detailed circuits shown in FIG. 2. Moreover, in addition to having the memory address counters 401 and 402, the BOST control section 40 has a start trigger generation circuit 403. In other respects, the BOST control section 40 is identical with the detailed circuits shown in FIG. 2. Like sections are assigned like reference numerals, and their repeated explanations are omitted.

The test cycle signal generation circuit 700A shown in FIG. 42 has timing data memory 720, a pair of flip flops 721 and 722, a pair of delay circuits 723 and 724, a pair of OR circuits 725 and 726, and an OR circuit 727. The timing data memory 720 receives a timing group signal TGS from the PG section 60. The timing group signal TGS is formed from the test pattern data TPD downloaded from the TPM section 50 to the PG section 60. The timing group signal TGS imparts timing variation capability to the test cycle signal TCY. The timing data memory 720 produces the timing data signal TDS shown in FIG. 43B. The memory address counter 402 reads, from the timing data memory 720, the timing data signal TDS on the basis of the memory address signal to be supplied to the PG section 60 (shown in FIG. 43A).

The flip flops 721, 722 each have an input D for receiving the timing data signal TDS, an output Q connected to the delay circuits 723, 724, respectively, and a clock input C. The delay circuits 723, 724 each have an In terminal, an Out terminal, and a control input S. The output Q of the flip flop 721 is connected to the control input S of the delay circuit 723, and the output Q of the flip flop 722 is connected to the control input S of the delay circuit 724. The Out terminal of the delay circuit 723 and the Out terminal of the delay circuit 724 are connected to respective inputs of the OR circuit 727. An output of the OR circuit 727 serves as the test cycle signal TCY. The OR circuit 725 is a mere OR circuit having one input. The input is connected to the Out terminal of the delay circuit 724. An output of the OR circuit 725 is connected to the In terminal of the delay circuit 723. The OR circuit 726 has two inputs. One of the two inputs receives a start trigger signal STS output from the start trigger generation circuit 402, and the other input is connected to the Out terminal of the delay circuit 723.

The test cycle signal generation circuit 700A operates upon receipt of the start trigger signal STS. After lapse of a delay time produced by the delay circuits 723, 724, the test cycle signal generation circuit 700A produces the test cycle signal TCY. The delay time is varied by the timing data signal TDS output from the timing data memory 720. The test cycle signal TCY is supplied to the memory address counter 401 as well as to the set clock signal generation circuit 710A, the reset clock signal generation circuit 710B, and the strobe signal generation circuit 715A.

The set clock signal generation circuit 710A, the reset clock signal generation circuit 710B, and the strobe signal generation circuit 715A are formed in the same manner as the test cycle signal generation circuit 700A and each have the timing data memory 720, the pair of flip flops 721, 722, the pair of delay circuits 723, 724, and the OR circuits 725, 726, and 727.

Upon receipt of the test cycle signal TCY, the set clock generation circuit 710A issues the set clock signal SCLK after lapse of the delay time produced by the delay circuits 723, 724. The set clock signal SCLK is shown in FIG. 43D and has delay times tsc0, tsc1, . . . tsc6 behind the test cycle signal TCY. The delay times are variable in respective cycles of the test cycle signal TCY. The delay times tsc0, tsc1, . . . tsc6 of the respective cycles are adjusted by the timing data memory 720 incorporated into the set clock signal generation circuit 710A. The timing group signal TGS is imparted to the timing data memory 720.

Upon receipt of the test cycle signal TCY, the reset clock generation circuit 710B issues the reset clock signal RCLK after lapse of the delay time produced by the delay circuits 723, 724. The reset clock signal RCLK is shown in FIG. 43E and has delay times trc0, trc1, . . . trc6 behind the test cycle signal TCY. The delay times are variable in respective cycles of the test cycle signal TCY. The delay times trc0, trc1, . . . trc6 of the respective cycles are adjusted by the timing data memory 720 incorporated into the reset clock signal generation circuit 710B. The timing group signal TGS is imparted to the timing data memory 720.

Similarly, upon receipt of the test cycle signal TCY, the strobe signal generation circuit 715A produces the strobe signal STB after lapse of the delay time produced by the delay circuits 723, 724. The strobe signal STB is shown in FIG. 43F and has delay times tst0, tst1, . . . tst6 behind the test cycle signal TCY. The delay times are variable in respective cycles of the test cycle signal TCY. The delay times tst0, tst1, . . . tst6 of the respective cycles are adjusted by the timing data memory 720 incorporated into the set clock signal generation circuit 710A. The timing group signal TGS is imparted to the timing data memory 720.

In the operation timing chart of embodiment 2-6 shown in FIG. 43, the test output pattern signal TOP shown in FIG. 43I assumes a high level H in response to the set clock signal SCLK when the test pattern signal TPS shown in FIG. 43H assumes a value of 1. In response to the reset clock signal RCLK, the test output pattern signal TOP assumes a low level. When the test pattern signal TPS assumes a value of 0, the test output pattern TOP maintains a low level L even in response to the set clock signal SCLK. The timing of the test output pattern signal TOP can be changed by making the timing of the set clock signal SCLK and that of the reset clock signal RCLK variable. The same also applies to the test input pattern signal TIP. When the test input/determination pattern signal JPS shown in FIG. 43G is in a state of determination, the output determination circuit 85 performs determination through use of the strobe signal STB. The timing of the strobe signal STB is also changeable.

In this way, in embodiment 2-6, the timing of the test input pattern signal TIP and that of the test output pattern signal TOP are made variable. Further, the timing of the strobe signal STB for use in determining an output can also be made changeable. Tests that are more effective can be performed in accordance with various types of function tests for a digital circuit.

Embodiment 2-7

Figure 44:
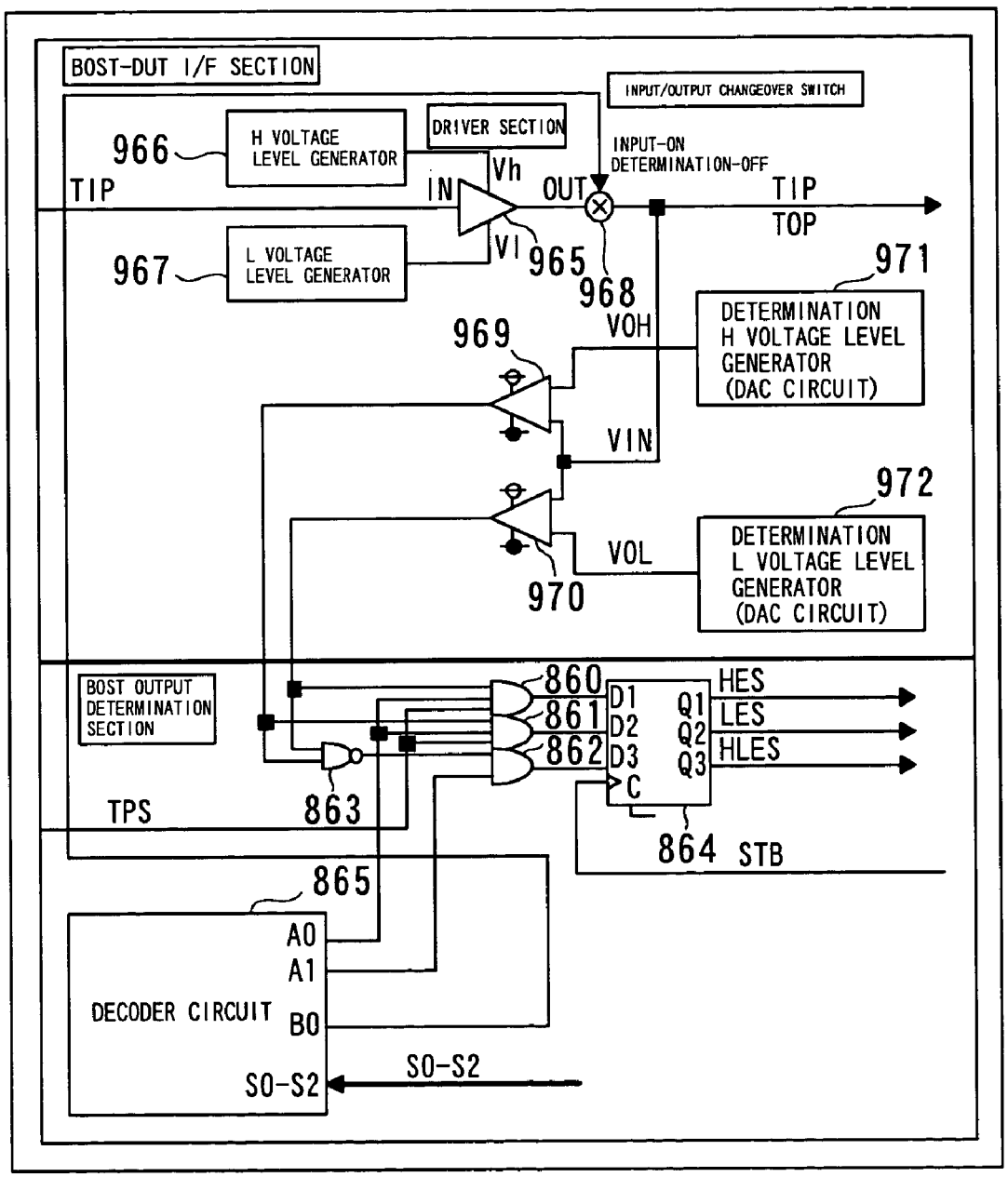
FIG. 44 shows details of the output determination section and details of the DUT-BOST I/F section in embodiment 2-7.

Embodiment 2-7 relates to an embodiment of an apparatus for testing a semiconductor integrated circuit of the invention, wherein the voltage level of a test pattern signal TPS employed in the output determination section 85 and the voltage level of a test input pattern signal TIP employed in the DUT-BOST I/F section 95 are made variable. FIG. 44 shows details of the output determination section 85 and details of the DUT-BOST I/F section 95 in embodiment 2-7.

The DUT-BOST I/F section 95 is constituted of a driver 965; a high-level voltage generator 966; a low-level voltage generator 967; an input/output changeover switch 968; a high-level determination comparator 969; a low-level determination comparator 970; a high-level determination voltage generator 971; and a low-level determination voltage generator 972. The high-level voltage generator 966, the low-level voltage generator 967, the high-level determination voltage generator 971, and the low-level determination voltage generator 972 are each formed from a digital-to-analog converter (DAC).

The driver 965 has an IN terminal, an OUT terminal, a Vh terminal, and a Vl terminal. The test input pattern signal TIP output from the WF section 80 is supplied to the IN terminal of the driver 965. A high-level voltage VH is supplied from the high-level voltage generator 966 to the VH terminal. A low-level voltage VL is supplied from the low-level voltage generator 967 to the Vl terminal. The OUT terminal of the driver 965 is connected to the input/output changeover switch 968. The high-level voltage generator 966 can supply the high-level voltage VH after having varied the voltage, and the low-level voltage generator 967 can supply a low-level voltage VL after having varied the voltage. Consequently, the high-level voltage VH and the low-level voltage VL of the test input pattern signal TIP can be changed at the OUT terminal of the driver 966. The test input pattern signal TIP is supplied to the DUT 10 via the input/output changeover switch 968. When the test input pattern signal TIP is supplied to the DUT 10, the input/output changeover switch 968 is activated. When the output determination section 80 determines the test output pattern signal TOP through use of the test pattern signal TPS, the input/output changeover switch 968 is deactivated.

The high-level determination comparator 969 has a positive input, a negative input, and an OUT terminal and inverts and compares the positive and negative inputs. A high-level determination voltage VOH is supplied from the high-level determination voltage generator 971 to the positive input of the comparator 969. The negative input is connected to an output of the input/output changeover switch 968, and the test output pattern signal TOP or the test input pattern signal TIP output from the input/output changeover switch 968 is supplied as VIN to the negative input. The low-level determination comparator 970 also has a positive input, a negative input, and an OUT terminal and inverts and compares the positive and negative inputs. The test output pattern signal TOP or the test input pattern signal TIP output from the input/output changeover switch 968 is supplied as a VIN to the positive input. Further, the low-level determination voltage VOL is supplied from the low-level determination voltage generator 972 to the negative input of the comparator 970.

The high-level determination comparator 969 detects whether the VIN is higher or lower than the VOH. When VIN>VOH, operation is determined to be normal, and the output of the high-level determination comparator 969 assumes a low level L. If VIN<VOH, operation is determined to be false, and the output of the high-level determination comparator 969 assumes a high level H. The low-level determination comparator 970 determines whether the VIN is lower or higher than the VOL. When VIN<VOL, operation is determined to be normal. The output of the low-level determination comparator 970 assumes a low level L. If VIN>VOL, operation is determined to be false, and the output of the low-level determination comparator 970 assumes a high level H.

The output determination section 85 has three AND circuits 860, 861, 862, a NAND circuit 863, a flip flop 864, and a decoder circuit 865. Outputs from the comparators 969, 970 are input to the NAND circuit 863. The AND circuits 860, 861 each have three input terminals. The AND circuit 862 has two input terminals. One input of the AND circuit 860 is connected to the OUT terminal of the low-level determination comparator 970, and a determination pattern signal TPS is delivered to one of the inputs of the low-level determination comparator 970. The two inputs of the NAND circuit 863 are connected to an OUT terminal of the high-level determination comparator 969 and an OUT terminal of the low-level determination comparator 970, respectively. An output of the NAND circuit 863 is connected to one input of the AND circuit 862. The flip flop 864 has three inputs D1, D2, D3 connected to respective output terminals of the AND circuits 860, 861, 862 and thee outputs Q1, Q2, and Q3 corresponding to the three inputs D1, D2, and D3. The output Q1 outputs a high-level error data signal HES; the output Q2 outputs a low-level error data signal LES; and the output Q3 outputs a high-to-low level error data signal HLES.

The decoder circuit 865 has outputs A0, A1, and B0 and receives an input/output changeover control signal S0–S2 output from the PG section 60. The output A0 is connected to another input of the AND circuit 860, and the output A1 is connected to another input of the AND circuit 862. By means of the outputs A0, A1, operating statuses of the AND circuits 860, 861, and 862 are controlled. The input/output changeover switch 968 is switched by means of the output B0. The outputs A0, A1, and B0 of the decoder circuit 865 are set as follows in accordance with the control signal S0–S2.

First, when S0=0, S1=0, and S2=0, there are obtained the output A0=L, the output A1=L, and the output B0=H. Specifically, the outputs A0, A1 assume a low level L, and determination operations to be performed by the AND circuits 860, 861, and 862 are stopped. The output B0 assumes a high level H, and the input/output changeover switch 968 is activated. The test input pattern signal TIP is supplied to the DUT 10.

When S0=1, S1=0, and S2=0, there are obtained the output A0=H, the output A1=L, and the output B0=L. Specifically, as a result of the output A0 having assumed a high level H, the AND circuits 860, 861 perform determination operation. Outputs from the comparators 969, 970 and the test pattern signal TPS are determined. In short, when the test pattern signal TPS is at a high level H, the outputs from the comparators 969, 970 are determined. If the output from the comparator 969 is at a high level H, the high-level error data signal HES assumes a high level H. Further, if the output from the comparator 970 is at a high level H, the low-level error data signal LES assumes a high level H. Since the output A1 remains at the low level L, the determination operation to be performed by the AND circuit 862 is stopped. Since the output B0 remains at the low level L, the input/output changeover switch 968 becomes deactivated. The test output pattern signal TOP output from the DUT 10 is taken into the comparators 969, 970.

When S0=1, S1=1, and S2=0, there are obtained the output A0=L, the output A1=H, and the output B0=L. At this time, the determination operations to be performed by the AND circuits 860, 861 are stopped, and the determination operation to be performed by the AND circuit 862 is carried out. The determination to be performed by the AND circuit 862 concerns whether the test pattern signal TPS and the test output pattern signal TOP are at a high level or a low level. If an error exists, the high-to-low level error data HLES assumes a high level. The output B0 is at the low level L, and the input/output changeover switch 968 becomes deactivated. The test output pattern signal TOP output from the DUT 10 is taken into the comparators 969, 970.

When S0=1, S1=1, and S2=0, there are obtained the output A0=H, the output A1=L, and the output B0=H. At this time, the determination operations to be performed by the AND circuits 860, 861 are carried out. Since the input/output changeover switch 968 is activated, the test input pattern signal TIP is taken into the comparators 969, 970. Consequently, the driver 965 is subjected to self-determination.

When S0=1, S1=1, and S2=1, there are obtained the output A0=L, the output A1=H, and the output B0=H. At this time, the determination operations to be performed by the AND circuit 860, 861 are stopped. The determination operation to be performed by the AND circuit 862 is carried out. Since the input/output changeover switch 968 is activated, the test input pattern signal TIP is taken into the comparators 969, 970. Consequently, the driver 965 is subjected to self-determination.

Embodiment 2-7 yields the same effect as that yielded by embodiment 1. The voltage level of the test input pattern signal TIP is made variable. Further, a determination voltage level for the test output pattern signal TOP can also be made variable. Various types of function tests for a digital circuit can be effectively performed while the voltage levels are changed.

Embodiment 2-8

Figure 45:
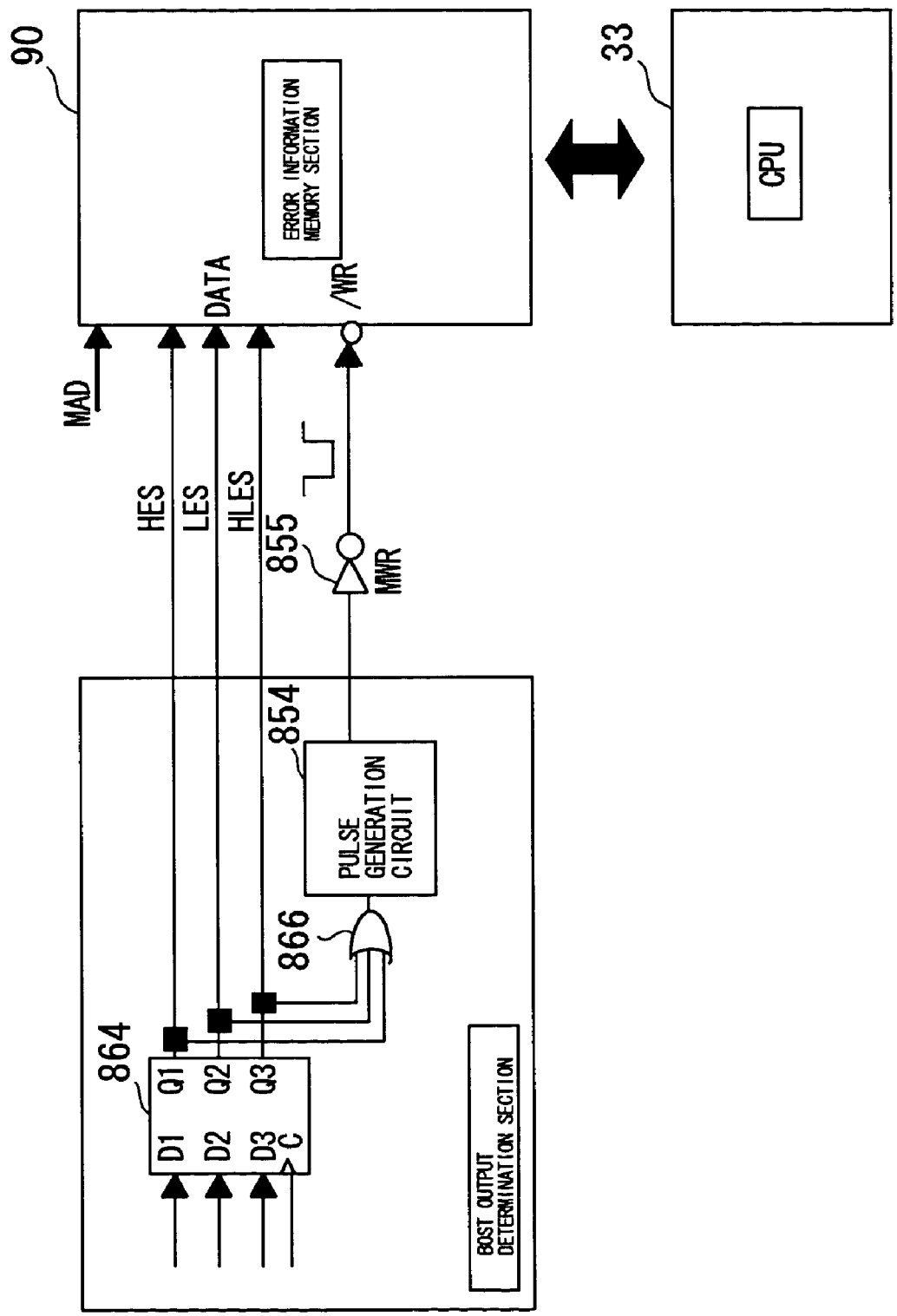
FIG. 45 shows the configuration of the output determination section and the configuration of the error information memory section according to embodiment 2-8.

Embodiment 2-8 is an embodiment of the improved apparatus for testing a semiconductor integrated circuit of the invention, wherein the high-level error data signal HES, the low-level error data signal LES, and the high-to-low level error data signal HLES can be captured in response to embodiment 2-7. FIG. 45 shows the configuration of the output determination section 85 and the configuration of the error information memory section 90 according to embodiment 2-8.

In embodiment 2-8, as shown in FIG. 45, the output determination section 85 of the BOST apparatus 20 has an additional OR circuit 866. The OR circuit 866 has three inputs, and the inputs are connected respectively to outputs Q1, Q2, and Q3 of the flip flop 864. An output of the OR circuit 866 is connected to the pulse generation circuit 854. The output of the pulse generation circuit 854 is connected to the write terminal WR of the error information memory section 90 by way of the inverter circuit 855. The high-level error data signal HES, the low-level error data signal LES, and the high-to-low level error data signal HLES, all being output from the outputs Q1, Q2, and Q3 of the flip flop 864, are supplied to a DATA terminal of the error information memory section 90.

According to embodiment 2-8, every time the high-level error data signal HES, the low-level error data signal LES, and the high-to-low level error data signal HLES assume high levels H, the pulse generation circuit 854 produces the memory write signal MWR. This memory write signal MWR is supplied to the write terminal WR via the inverter circuit 855. Hence, every time the high-level error data signal HES, the low-level error data signal LES, and the high-to-low level error data signal HLES assume high levels H, the error data are stored in the error information memory section 90 along with the memory address signal MAD. The CPU section 33 reads the information stored in the error information memory section 90, thereby analyzing the error of the DUT 10.

Embodiment 2-8 yields the same effect as that yielded in embodiment 1. Further, the high-level error data signal HES, the low-level error data signal LES, and the high-to-low level error data signal HLES are stored, thereby rendering the error information replete, improving capability to analyze an error, and rendering the logic analyzer capability replete.

Now, embodiments 3-1 to 3-6 of the apparatus for testing a semiconductor integrated circuit of the invention, wherein the BOST device 20 is combined with a removable storage medium, such as a PC card, will be described. The embodiments 3-1 to 3-6 are configured to additionally have configurations and capabilities, which will be described later, as well as having the capabilities described in connection with embodiment 1.

Embodiment 3-1

FIG. 46 shows embodiment 3-1, in which the TPM section 50 is combined with a removable storage medium. FIG. 46A shows an embodiment of the BOST device 20 involving a combination of the storage medium. FIG. 46B shows another embodiment of the storage medium to be combined. FIG. 46C shows another embodiment of the BOST device 20, wherein an additional number of circuit boards are to be combined with the storage medium. FIG. 46D shows still another embodiment of the BOST device 20 involving combination of a storage medium.

In embodiment 3-1, a removable storage medium is combined with embodiment 1-2 shown in FIGS. 5 and 6. In the embodiment shown in FIG. 46A, there is formed a BOST assembly 210K combined with a storage medium 230 which is removably attachable to the circuit board 215 shown in FIGS. 5, 12. Employed as the removable storage medium 230 are removable storage mediums for which I/F standards have been specified, such as a PC card complying with a PC card ATA, a compact flash (registered trademark) memory, smart media, a miniature card, a multimedia card, or a memory stick. In the case of the BOST assembly 210K shown in FIG. 46A, a retaining member 231 having a card insert slot is attached to one surface of the circuit board 215. A PC card is used as the storage medium 230 and removably held in the retaining member 231. The storage medium 230 formed from a PC card constitutes memory of the TPM section 50 of the BOST device 20. The storage medium 230 formed from a PC card can also be arranged so as to constitute the entire memory of the TPM section 50. There may also be adopted a form in which semiconductor memory of the TPM section 50 is mounted on the circuit board 215 and the storage medium 230 formed from a PC card is added so as to increase the storage capacity of the TPM section 50. Generally, the PC card operates at low speed but is a compact storage medium having large storage capacity. Hence, the PC card is suitable for memory which constitutes the TPM section 50 of the BOST device 20 of the invention.

In the case of a BOST assembly 210K shown in FIG. 46A, the storage medium 230 formed from a PC card is inserted directly into the retaining member 231. As shown in FIG. 46B, a card adapter 232 may be prepared, and the storage medium 230 removably attached to the card adapter 232. In the embodiment shown in FIG. 46B, the card adapter 232 is removably inserted into the retaining member 231. In the embodiment shown in FIG. 46B, compact flash (registered trademark) memory and smart media are suitable for the storage medium 230.

In an embodiment shown in FIG. 46C, the retaining member 231 is provided on the circuit board 215, and the BOST assembly 210L having an additional circuit board 215A is used at a position adjacent to the circuit board 215. Consequently, the BOST assembly 210L shown in FIG. 46C has the five circuit boards 211 to 215, to which an additional circuit board 215A is added. The additional circuit board 215A is provided in parallel with, e.g., the circuit board 215, and the retaining member 231 is also provided on the additional circuit board 215A. The storage medium 230 formed from the PC card shown in FIG. 46A or the card adapter 232 shown in FIG. 46B is inserted into the retaining member 231.

In the case of a BOST assembly 210M shown in FIG. 46D, the circuit board 215 is provided with a comparatively small retaining member 231A. A comparatively small storage medium 230 shown in FIG. 46B is removably inserted into the retaining member 231A.

Figure 47:
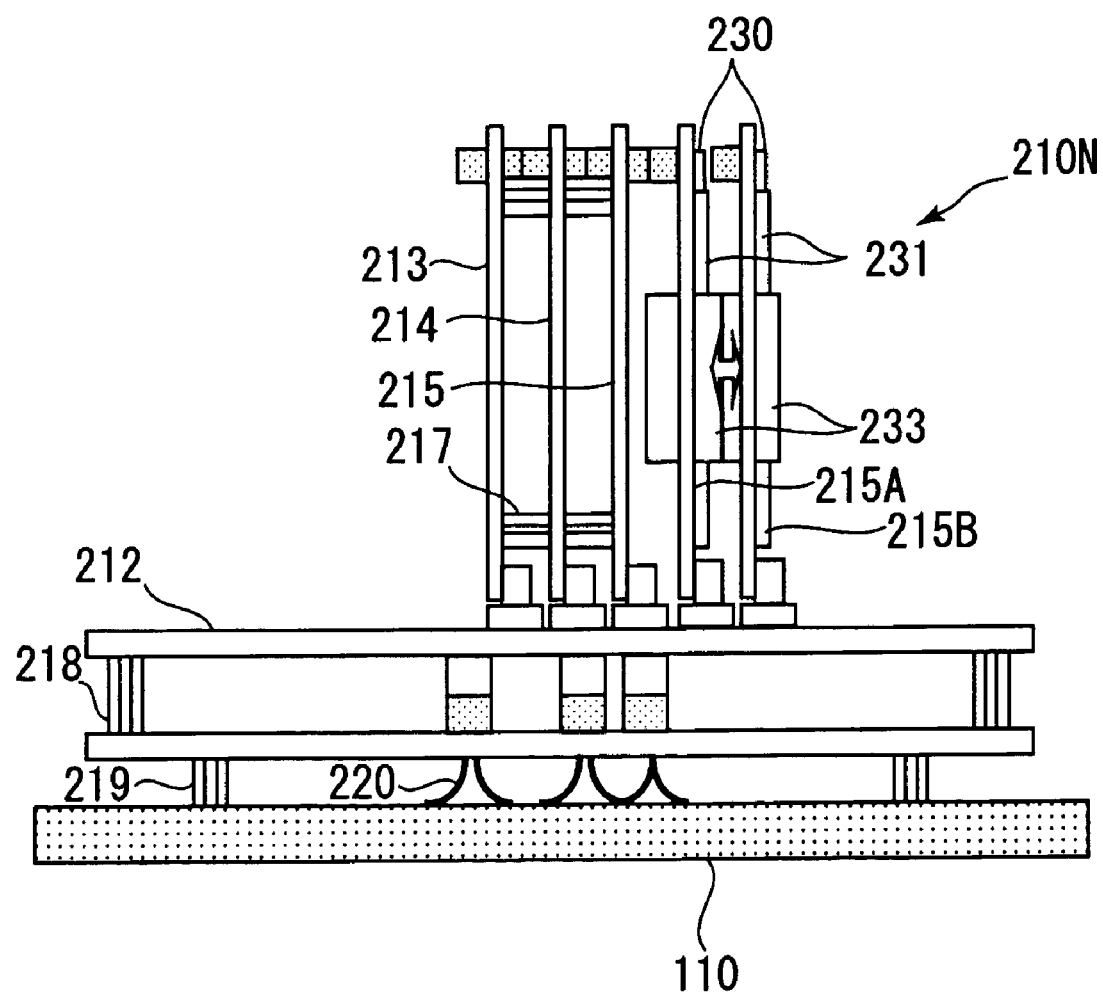
FIG. 47 is a side view showing a BOST assembly that is based on embodiment 3-1.

FIG. 47 is a side view showing a BOST assembly 210N that is based on embodiment 3-1. The BOST assembly 210N is provided with additional circuit boards 215A, 215B. Other than the additional circuit boards 215A, 215B each being provided with the retaining member 231, the BOST assembly 210N is basically identical in configuration with the BOST assembly 210B shown in FIGS. 5 and 12. The circuit boards 213, 214, 215, 215A, and 215B are provided perpendicular to the circuit boards 211, 212. The circuit boards 215A, 215B are each provided with a connector 233 for use with the storage medium 230.

Figure 48A:
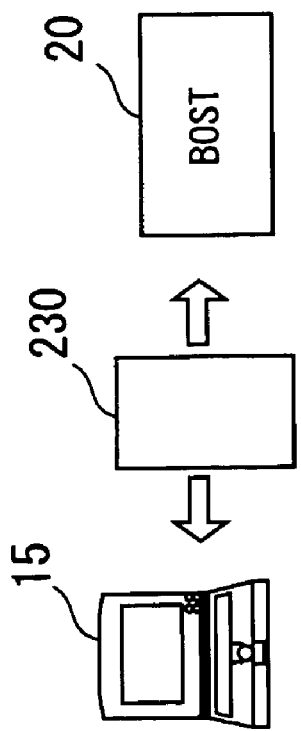
FIG. 48 shows an example system configuration employed when the test pattern data TPD are written into the storage medium.

FIG. 48 shows an example system configuration employed when the test pattern data TPD are written into the storage medium 230. In FIG. 48A, a personal computer terminal 15 is used, and the test pattern data TPD are written into the storage medium 230 while the storage medium 230 is inserted into the terminal 15. The storage mediums 230 that have finished being subjected to writing of the test pattern data TPD are inserted into the retaining members 231, 231A of the BOST device 20.

Figure 48B:
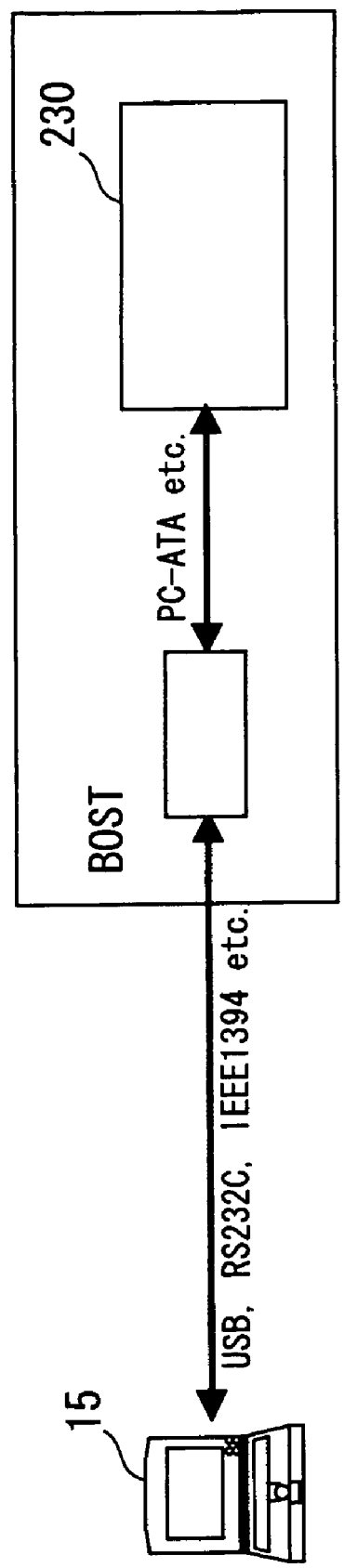

As shown in FIG. 48B, the test pattern data TPD are written into the storage medium 230 from the personal computer terminal 15 while the storage mediums 230 are inserted into the retaining members 231, 231A of the BOST device 20. In this case, the test pattern data TPD are written into the storage medium 230 by way of the I/F section 17.

According to embodiment 3-1, the storage mediums 230, such as the PC card, are removably attached to the circuit boards constituting the BOST device 20. The TPM section 50 is constituted through use of the storage mediums 230. Hence, the storage capacity of the TPM section 50 can be readily increased. A larger amount of test pattern data are stored in the storage medium 230, thereby augmenting the test capability of the BOST device 20. In addition, the storage medium 230 is removable, and the test pattern data can be stored by insertion of the storage medium 230 into another terminal. Test pattern data can be readily stored without use of the BOST device 20.

Embodiment 3-2

Figure 49:
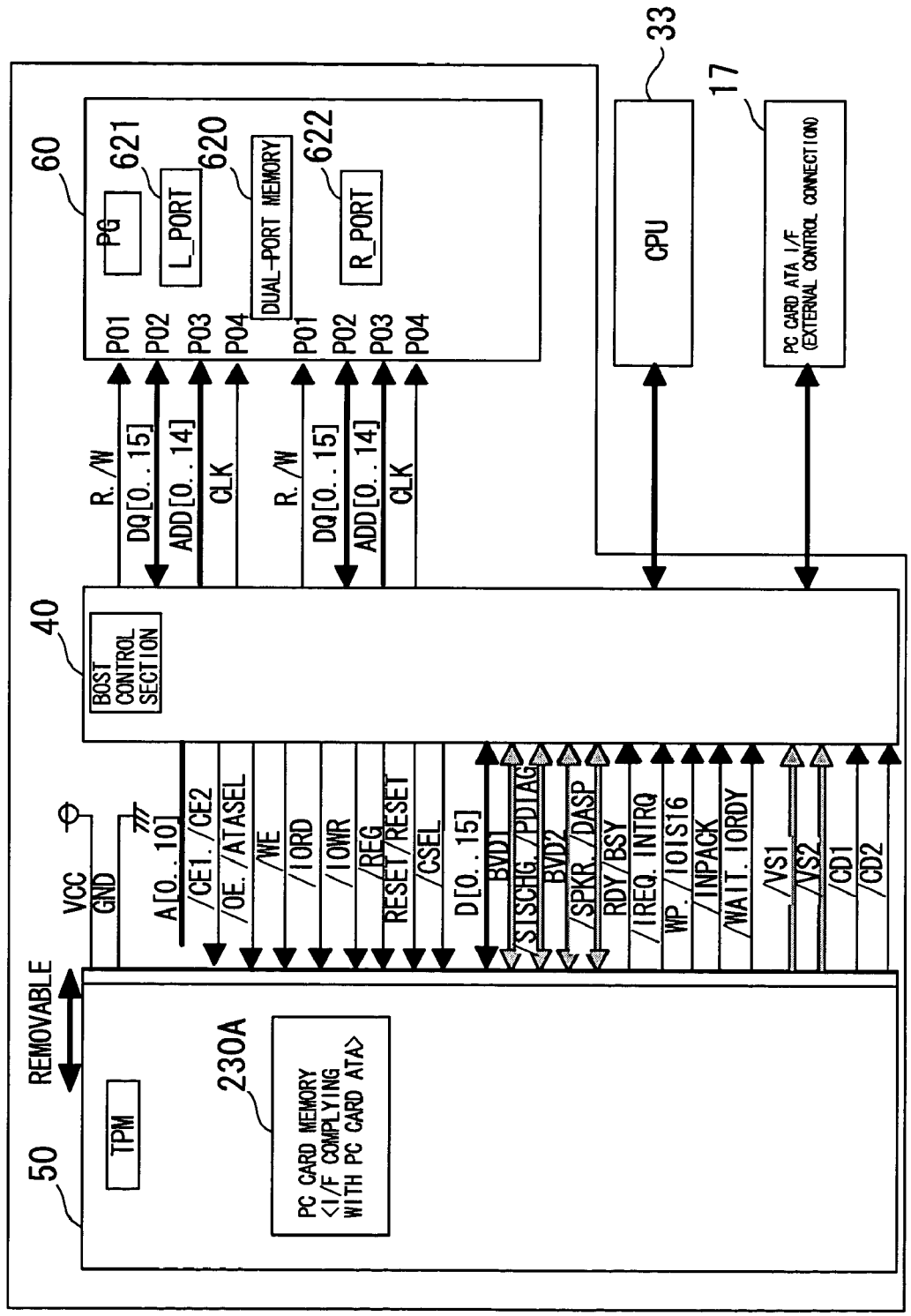
FIG. 49 shows the BOST control section, the TPM section, and a signal input/output system of the PG section, all of which pertain to the embodiment 3-2.
Figure 50:
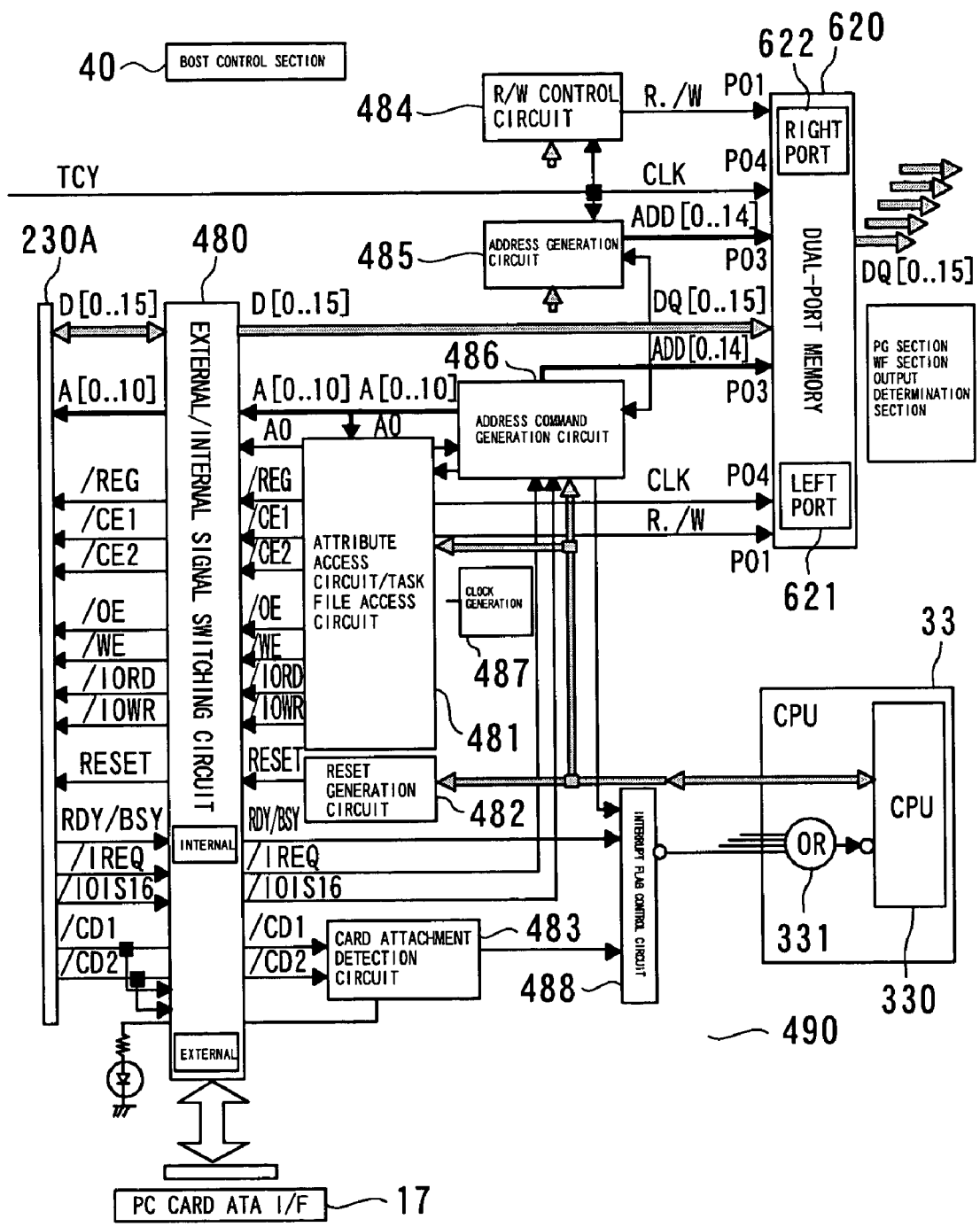
FIG. 50 shows details on the signal input/output system shown in FIG. 49.

Embodiment 3-2 is an embodiment of the improved apparatus for testing a semiconductor integrated circuit of the invention which employs dual-port memory for the PG section 60 and enables downloading of the test pattern data TPD from the TPM section 50 simultaneous with reading of the test pattern signal TPS and the test input/determination pattern signal JPS from the PG section 60. Embodiment 3-2 uses the removable storage medium 230, and the PC card complying with the PC card ATM specifications is used as the storage medium 230. FIG. 49 shows the BOST control section 40, the TPM section 50, and a signal input/output system of the PG section 60, all of which pertain to the embodiment 3-2. Further, FIG. 50 shows details on the signal input/output system shown in FIG. 49.

According to the invention, a plurality of test pattern data TPD corresponding to a plurality of test items for a digital circuit are stored in the TPM section 50. From among the plurality of test pattern data sets, test pattern data corresponding to an execution test pattern are downloaded into the PG section 60. By means of such a configuration, the BOST device 20n enables efficient and simple testing of a digital circuit. However, downloading of the execution test pattern data from the TPM section 50 to the PG section 60 involves consumption of time. In embodiment 3-2, the dual-port memory is used for the PG section 60, and downloading of the execution test pattern datain to the PG section 60 can be performed simultaneously with reading of the test pattern data TPD from the PG section 60, thereby effectively shortening the time required for downloading operation.

As shown in FIG. 49, the PG section 60 has dual-port memory 620. The PG section 60 is formed into multi-channels. For instance, one channel has 320 kilobytes, and the PG section 60 has 16 channels, from channel 0 to channel 15.

The dual-port memory 620 for each channel has two input/output ports 621, 622. The input/output port 621 is a left port (L port), and the input/output port 622 is a right port (R port). The left port 621 and the right port 622 each have four ports PO1 to PO4. The port PO1 is an input port for a read/write signal R/W; the port PO2 is an input/output port for a data signal DQ; the port PO3 is an input port for an address signal ADD; and the port PO4 is an input port for a clock CLK.

The BOST control section 40 exchanges signals with the PG section 60, as well as with the storage medium 230 constituting the TPM section 50. In embodiment 3-2, the storage medium 230 is a PC card 230A complying with the PC card ATA specifications, and signals used in the storage medium 230 correspond to signals defined by the PC card ATA specifications. Signals supplied from the BOST control section 40 to the PC card 230A comprise a signal A [0 . . . 10], a card selection signal /CE1, /CE2, a register control signal /OF of an attribute region and a task file region, an ATASEL signal, a register input signal /WE in an attribute region and a task file region, a data output signal IORD of a register of the task file region, a data input signal IOWR of a register of the task file region, an access signal /REG for the task file region, RESET and /RESET signals, and a CSEL signal.

Signals exchanged bi-directionally between the BOST control section 40 and the PC card 230A comprise a signal D [0 . . . 15], a BVD1 signal, a /STSCHG signal, a /PDIAG signal, a BVD2 signal, a /SPKR signal, and a /DASP signal. Signals supplied from the PC card 230A to the BOST control section 40 comprise an RDY signal, a /BSY signal, a /IREQ signal, a /INTRQ signal, a write protect signal WP, a /IOIS16 signal, a /INPAC signal, a /WAIT signal, an IORDY signal, supply voltage setting signals /VS1 and /VS2, and card detection signals /CD1 and /CD2.

The BOST control section 40 is connected to the CPU section 33, and the PC card ATA I/F 17.

FIG. 50 shows details of the BOST control section 40 and the CPU section 33, both pertaining to the embodiment 3-2. The BOST control section 40 has an external/internal signal changeover circuit 480, an attribute access circuit/task file access circuit 481, a reset generation circuit 482, a card attachment detection circuit 483, an R/W control circuit 484, an address generation circuit 485, an address command generation circuit 486, a clock circuit 487, and an interrupt flag control circuit 488. The CPU section 33 has a CPU 330 and an OR circuit 331.

The external/internal signal changeover circuit 480 switches between the PC card ATA I/F 17 outside the BOST control circuit section 40 and the internal circuit of the BOST control circuit section 40. The address command generation circuit 486 exchanges signals with the CPU 330 and the address generation circuit 485. Signals A[0 . . . 10], A[1 . . . 10] are supplied to the external/internal signal changeover circuit 480, and a signal ADD[0 . . . 14] is supplied to a port PO of the L port of the dual-port memory 620. The address generation circuit 485 supplies a signal A[0 . . . 14] to the port PO3 of the R port of the dual-port memory 620. The R/W control circuit 484 supplies a read/write signal R/W to the port PO of the R port of the dual-port memory 620. The test cycle signal TCY is supplied to the R/W control circuit 484 and the address generation circuit 485. The clock CLK is supplied to the port PO of the R port of the dual-port memory 620. The external/internal signal changeover circuit 480 supplies a signal DQ [0 . . . 15] to the ports PO of the R, L ports of the dual-port memory 620.

The attribute circuit/task file access circuit 481 supplies the clock CLK signal and the read/write signal R/W to the ports PO, PO of the L port of the dual-port memory 620. The attribute circuit/task file access circuit 481 exchange signals with the CPU 330, thereby supplying, to the external/internal signal changeover circuit 480, the signal A0, the signal/REG, the signal /CE1, the signal /CE2, the signal /OE, the signal /WE, the signal /IORD, and the signal /IOWR. The reset generation circuit 482 supplies a RESET signal. The card attachment detection circuit 483 is provided with the signals /CD1, /CD2. An output of the card attachment detection circuit 483 is supplied to the interrupt flag control circuit 488. In addition, an RDY signal, a /BSY signal, and an address command signal are also supplied to the interrupt control circuit 488. An output (inverse output) of the interrupt flag control circuit 488 is supplied to the OR circuit 331.

The dual-port memory 620 which is shown in FIG. 50 and constitutes the BOST control section 40 and the PG section 60 is mounted on one circuit board 490. The circuit board 490 is constructed in the same manner for each of the channels 0 to 15. The test pattern data TPD are read from the dual-port memory 620 of each of the circuit boards 490.

Figure 51:
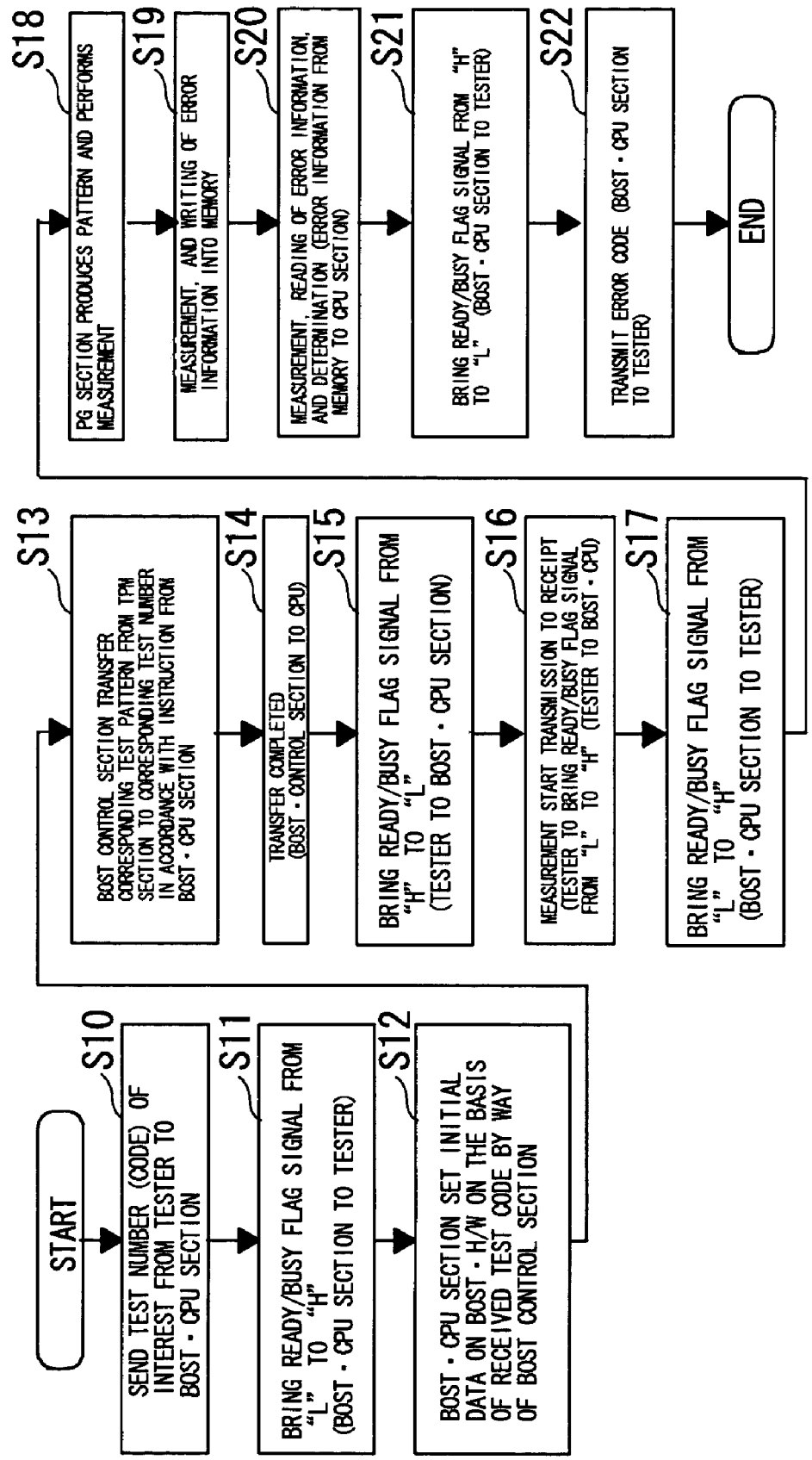
FIG. 51 is a flowchart according to the embodiment 3-2 showing basic procedures for transferring the test pattern data TPD from the TMP section to the PG section, causing the PG section to produce the test pattern signal TPS and the test input/determination pattern signal JPS, and carrying out the test of the DUT.

FIG. 51 is a flowchart according to the embodiment 3-2 showing basic procedures for transferring the test pattern data TPD from the TMP section 50 to the PG section 60, causing the PG section 60 to produce the test pattern signal TPS and the test input/determination pattern signal JPS, and carrying out the test of the DUT 10.

Thirteen steps: that is, S10 to S22, are included between the start and end of the flowchart shown in FIG. 51. All operations pertaining to steps S10 to S22 are performed. Immediately after commencement of operation, in step S10 the test code TCD corresponding to a test to be performed is transmitted from the tester 18 to the CPU section 22 of the BOST device 20 by way of the BOST communication I/F section 30. In step S11, the CPU section 33 of the BOST device 20 brings a READY/BUSY flag signal from a low level L to a high level L. The READY/BUSY flag signal is transmitted to the tester 18. In step S12, the CPU section 33 initializes respective circuit sections of the BOST device 20 by way of the BOST control section 40 on the basis of the received test code TCD. In step S13, the BOST control section 40 transfers the test pattern data TPD corresponding to the test code TCD to be executed from the TPM section 50 to the PG section 60 in accordance with an instruction from the CPU section 33.

In step S13, the BOST control section 40 reports, to the CPU section 33, completion of transfer of the test pattern data TPD is informed from the BOST control section 40. In step S16, the CPU section 22 brings the READY/BUSY flag signal back from the high level H to the low level L. The signal is transmitted to the tester 18 by way of the BOST communication I/F section 30 through communication. In step S16, upon receipt of the READY/BUSY flag signal, the tester 18, the measurement start signal MST is transmitted to the CPU section 33. In step S17, the CPU section 33 again brings the READY/BUSY flag signal from the low level L to the high level H, and the READY/BUSY flag signal is transmitted to the tester 18. Further, the BOST control section 40 is instructed to read the test pattern data TPD from the PG section 60.

By means of the reading instruction, in step S18 the BOST control section 40 reads the test pattern data TPD to be executed from the PG section 60. By means of the reading operation, the PG section 60 produces the test pattern signal TPS and the test input/determination pattern signal JPS. The test pattern signal TPS is shaped to the test input pattern signal TIP by the WF section 80, and the thus-shaped signal is transferred to the DUT 10 by way of the DUT-BOT I/F section 95, where the DUT 10 is tested. In step S19, the output determination section 10 determines the test output pattern signal TOP output from the DUT 10 through use of the test pattern signal TPS. Every time an error arises, the error information is stored in the error information memory 90. In step S20, the error information is read from the error information memory 90 to the CPU section 33, where the information is determined and analyzed. In step S21, the CPU section 22 changes the READY/BUSY flag signal from the high level L to the low level L. The BOST communication I/F section 30 transmits the change to the tester 18. In subsequent step S22, the CPU section 33 transmits an error code ECD, resulting from analysis of the error information, to the tester 18.

Figure 52:
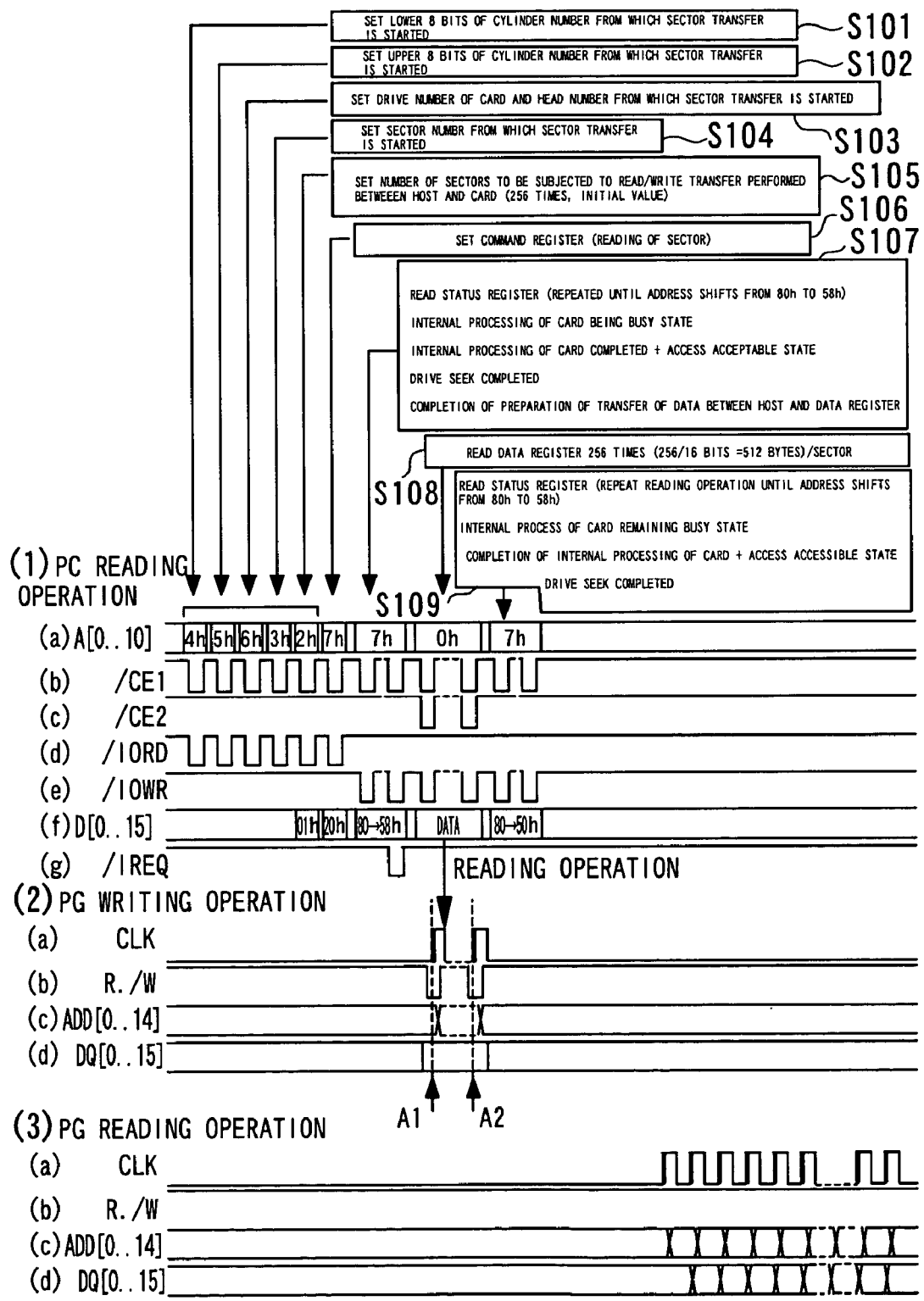
FIG. 52 shows details of operation for transferring the test pattern data TPD from the TPM section to the PG section in step S13 shown in FIG. 51 and reading the test pattern data TPD from the PG section in step S18.

FIG. 52 shows details of operation for transferring the test pattern data TPD from the TPM section 50 to the PG section 60 in step S13 shown in FIG. 51 and reading the test pattern data TPD from the PG section 60 in step S18. (1) Operation for reading a PC card is shown in an upper portion of FIG. 52. The operation for reading a PC card constitutes an operation for reading the TEST pattern data TPD from a PC card 230A. (2) PG writing operation appearing below (1) shows operation for writing the test pattern data TPD read from the PC card 230A in to the dual-port memory 620. (3) PG reading operation constitutes operation for reading the test pattern data TPD from the dual-port memory 620.

In relation to (1) Operation for reading a PC card shown in FIG. 52, FIG. 52A shows a signal A[0 . . . 10] for the PC card 230A; FIG. 52B shows a card selection signal /CE1 signal; FIG. 52C shows a card selection signal /CE2; FIG. 52D shows a data output control signal /IORD of a register of a task file region; FIG. 52E shows a data input control signal IOWR of the register of the task file region; FIG. 52F shows a signal D[0 . . . 15]; and FIG. 52G shows a /IREQ signal.

(1) Operation for reading a PC card shown in FIG. 52 will now be described. The operation for reading a PC card is performed in steps S101 to S109 shown in an upper portion of FIG. 52. In step S101, there are set the lower eight bits of a cylinder number from which sector transfer operation is started. The setting operation is performed in response to, e.g., a signal A[0 . . . 10]=4h. In step S102, there are set the higher eight bits of a cylinder number from which sector transfer is started. This setting operation is performed in response to, e.g., a signal A[0 . . . 10]=5h. In step S103, there are set a drive number of a card, and a head number from which sector transfer is started. The setting is performed in response to, e.g., A[0 . . . 10]=6h. In step S104, a sector number from which sector transfer is started is set. The setting operation is performed in response to, e.g., A[0 . . . 10]=3h.

Instep S105, the number of sectors to be subjected to read/write transfer operation is set. The setting operation is performed in response to, e.g., A[0 . . . 10]=2h. The number of sectors are set such that D[0 . . . 15]="00h"; 256 times and such that "01h": an initial value. The settings mean that 256 reading operations are set. In step S106, a command register is set. This operation is performed in response to a signal A[0 . . . 10]=7h. The command register is set such that D[0 . . . 15]="20h": sector reading. In step S107, a status register is subjected to reading. This reading operation is performed in response to, e.g., A[0 . . . 10]=0h. Reading operation is performed repeatedly until an address shifts from 80h to 58h. In step S107 where the status register is subjected to reading, internal processing of the card assumes a BUSY state at an address 80h. At an address 58h, the internal processing of the card is completed. Acceptance of the next access becomes available, and drive seek operation is completed. Further, preparation for transfer of data between the host and the data register is completed.

In step S108, reading of the data register is performed. In the embodiment, reading operation is performed 256 times. Reading operation of 256×16 bits=512 bytes/sector is performed. In step S109, reading of the status register is again performed. Reading of the status register is repeated until the address shifts from 80h to 58h. In step S109 for reading the status register, the internal processing of the card is brought into a BUSY state at the address 80h. At the address 58h, the internal processing of the card is completed. Acceptance of the next access is made available, and the drive seek operation is completed.

Through (2) PG writing operation shown in FIG. 52, the data read from the PC card 230A in response to operation pertaining to step S10 pertaining to (1) Operation for reading a PC card are written into the left port 621 of the dual-port memory 620 of the PG section 60. Arrow A1 denotes commencement of downloading of data from the PC card 230A to the left port 621 of the dual-port memory 620. Arrow A2 depicts completion of the downloading operation. A plurality of clocks exist between the arrows A1 and A2. The data output from D[0 ... 15] are written into the port PO2 of the left port 621 as DQ[0 ... 15] by means of clocks of respective cycles. In relation to (3) PG reading operation shown in FIG. 52, the test pattern data TPD are read from the right port 622 of the dual-port memory 620 in response to operation pertaining to step S18 shown in FIG. 51. In the embodiment, the test pattern data TPD that have already been written into the right port 622 are read in step S18.

Figure 53:
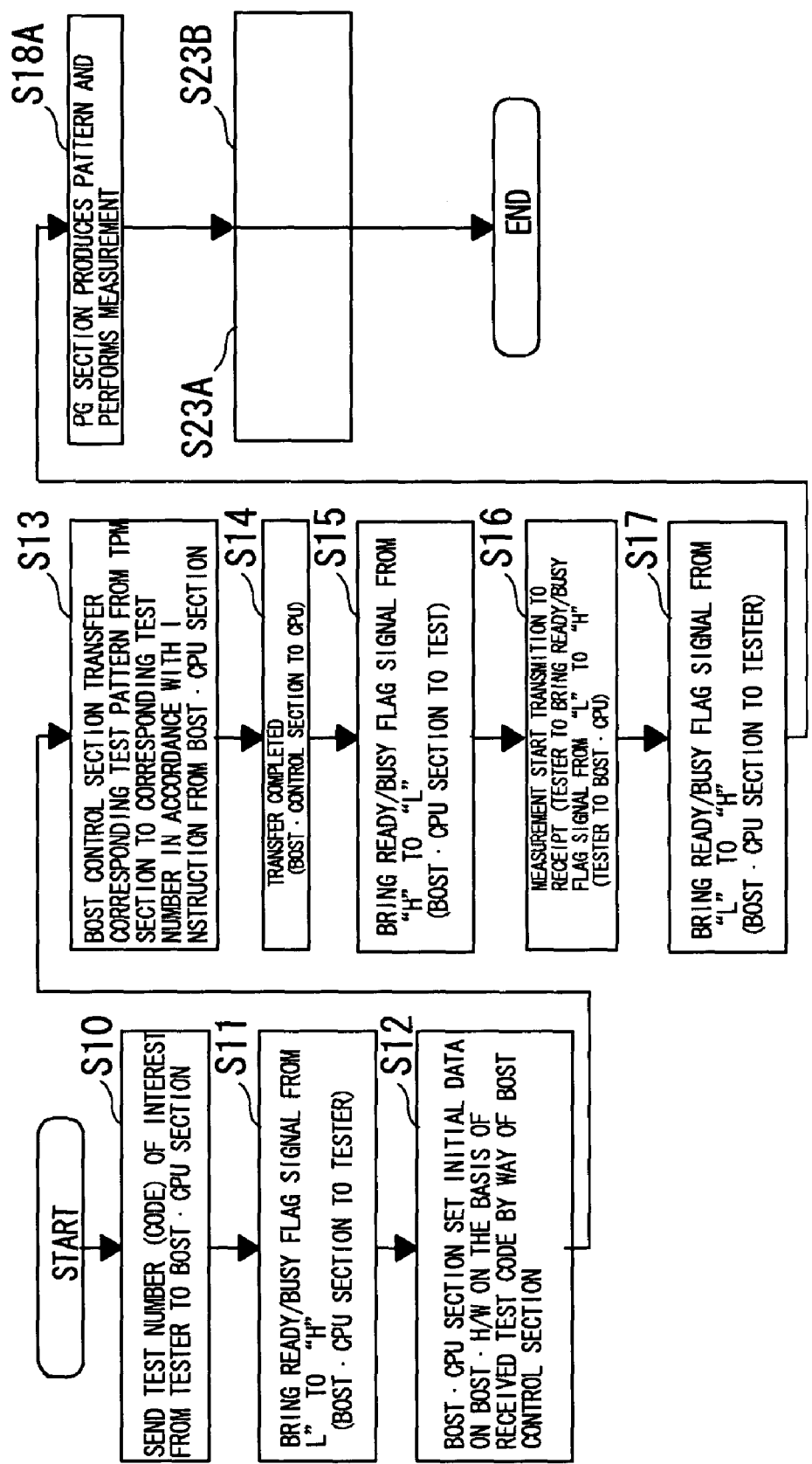
FIG. 53 shows a flowchart showing procedures for transferring the test pattern data TPD from the TPM section to the PG section simultaneously with reading the test pattern data TPD from the PG section.

FIG. 53 shows a flowchart showing procedures for transferring the test pattern data TPD from the TPM section 50 to the PG section 60 simultaneously with reading the test pattern data TPD from the PG section 60. The procedures differ from the basic procedures shown in FIG. 51 in steps S18A, 23A, and 23B. In step S18A, the test pattern data TPD are read from the PG section 60, whereby the test pattern signal TPS and the test input/determination pattern signal JPS are produced. On the basis of these signals, the DUT 10 is tested. Simultaneous with reading of the test pattern data TPD from the PG section 60, the test pattern data TPD are transferred from the TPM section 50 to the PG section 60.

Operations pertaining to steps 23A, 23B subsequent to step S18A are performed concurrently. Step S23A includes operations pertaining to steps S13 to S15, where the test pattern data TPD are transferred from the TPM section 50 to the PG section 60. Step S23B is for writing, reading, and analyzing the error information on the basis of the test pattern signal produced by the PG section 60 and the test input/determination pattern signal JPS. Step S23B includes operations pertaining to steps S19 to S22 shown in FIG. 51.

Figure 54:
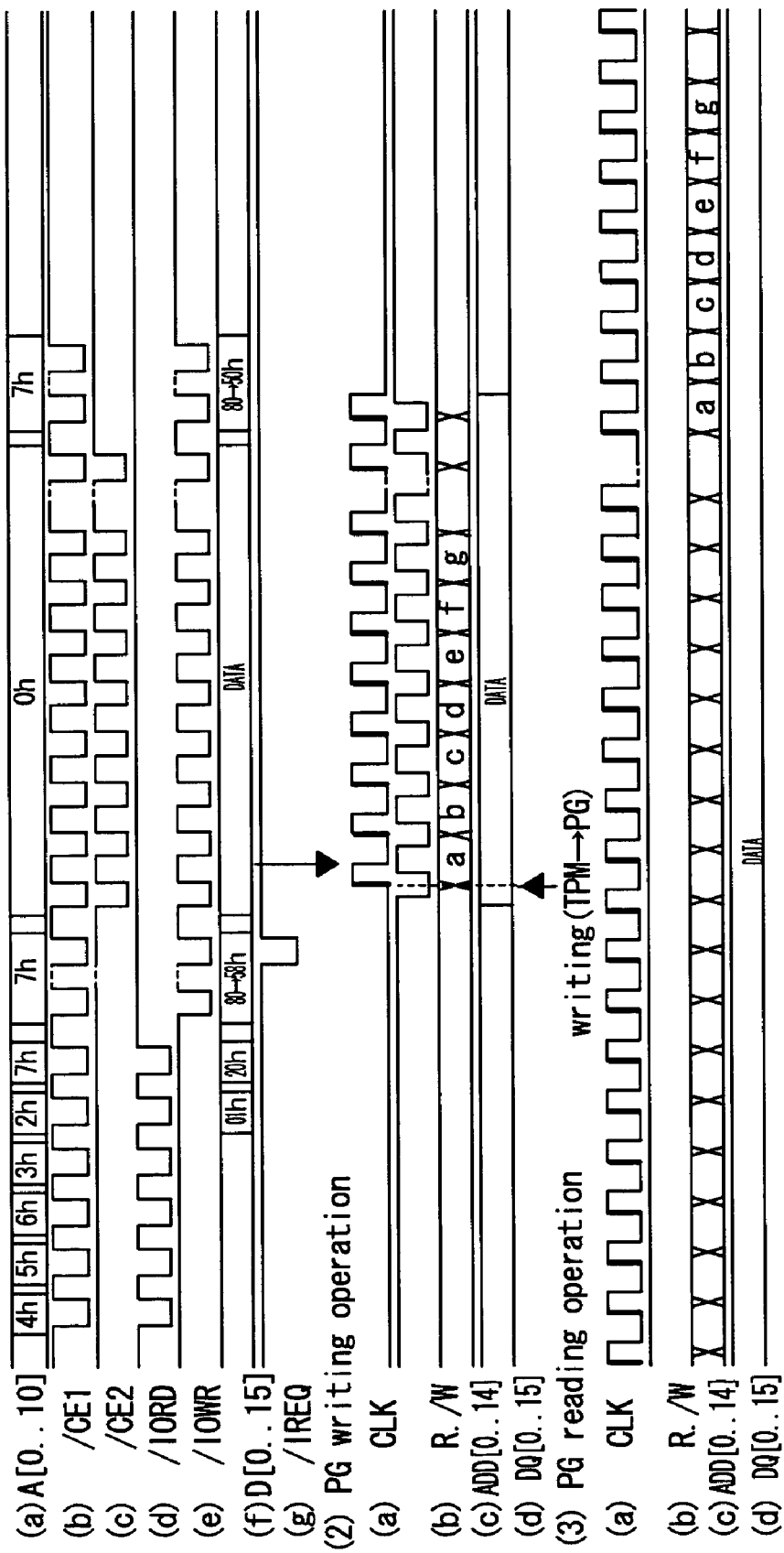
FIG. 54 is a timing chart of detailed operation pertaining to step S18A shown in FIG. 53.

FIG. 54 is a timing chart of detailed operation pertaining to step S18A shown in FIG. 53. As in the case of FIG. 52, FIG. 54 shows (1) Operation for reading a PC card, (2) PG writing operation, and (3) PG reading operation. (2) PG writing operation is an operation for writing the test pattern data output from the PC card 230A to the left port 621 of the dual port memory 620. (3) PG reading operation is for reading test pattern data from the right port 622 of the dual-port memory 620. As is evident from FIG. 54, the dual-port memory 620 is simultaneously subjected to reading of the test pattern data TPD and reading of the same.

In embodiment 3-2, the dual-port memory 620 is used for the PG section 60, thereby simultaneously enabling transfer of the test pattern data TPD from the TPM section 50 to the PG section 60 and reading of the test pattern data TPD from the PG section 60. As a result, a special time to transfer the test pattern data TPD from the TPM section 50 to the PG section 60 can be shortened. Even in embodiment 3-2, a removable storage medium 230 such as a PC card 230A is used, in an attempt to increase storage capacity of the TPM section 50. Since the larger volume of test pattern data TPD corresponding to a larger number of test items can be stored in the TPM section 50, various function tests can be effectively carried out by selection of test pattern data corresponding to test items to be executed from among the larger number of test items. Further, the PC card 230A is removable, and hence the PC card may be detached from the BOST device 20, and test pattern data may be written into the PC card through use of another terminal. The writing operation enables shortening of the time required to use the BOST device 20. Further, the time during which the BOST device 20 awaits writing operation can be shortened.

Embodiment 3-3

Figure 55:
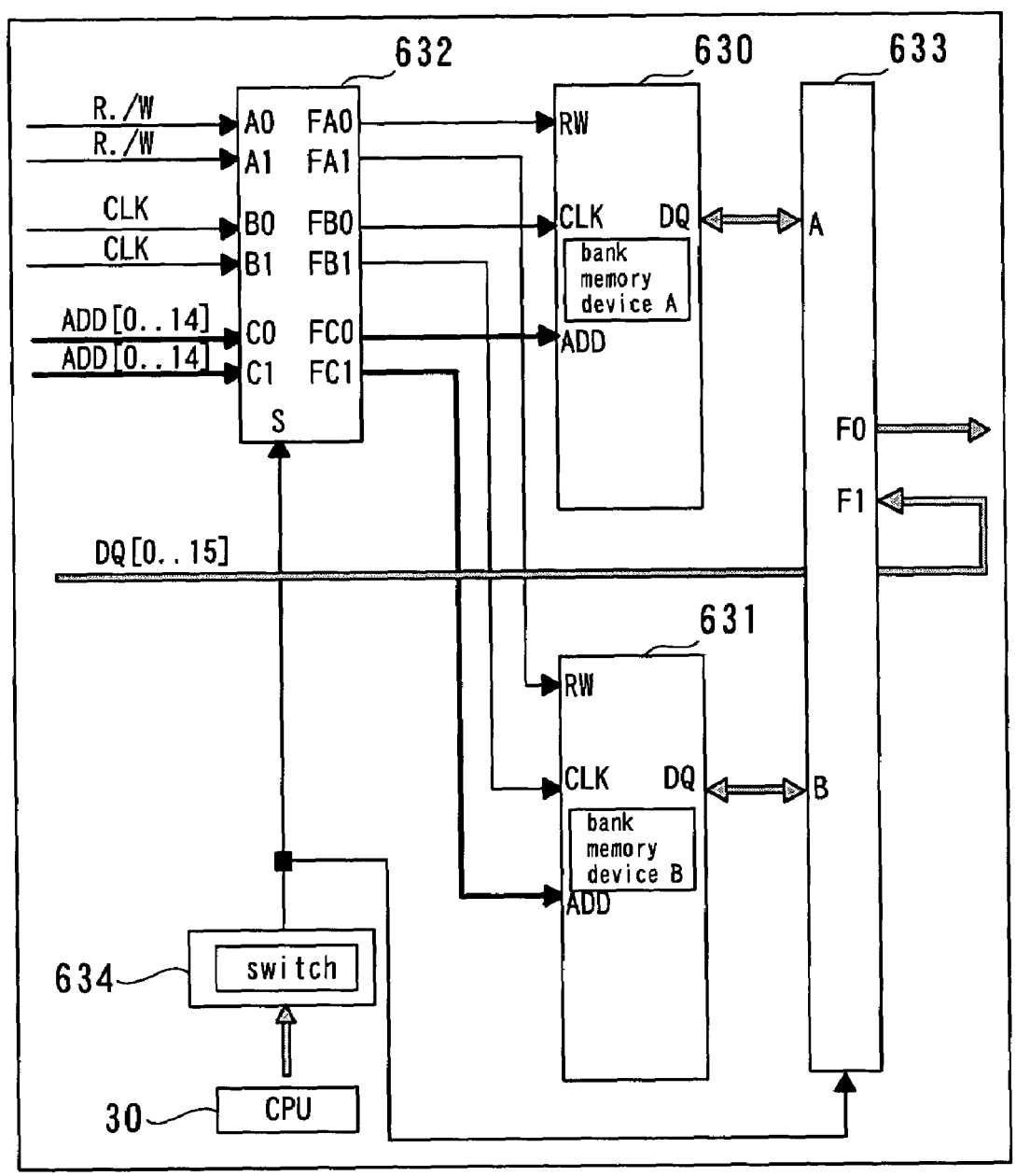
FIG. 55 shows a detailed configuration of the PG section of embodiment 3-3.

Embodiment 3-3 is an embodiment of the apparatus for testing a semiconductor integrated circuit of the invention which employs two bank memory devices A, B in the PG section 60 and is configured to effectively enable various types of function tests, as in the case of embodiment 3-2. FIG. 55 shows a detailed configuration of the PG section 60 of embodiment 3-3. Embodiment 3-3 also employs the PC card 230A in the TPM section 50.

In embodiment 3-3, the PG section 60 has two bank memory devices A630, B631, a switching circuit 632, and a switch setting circuit 634. The bank memory devices A630, B631 each have an RW terminal, a CLK terminal, an ADD terminal, and a DQ terminal.

The switching circuit 632 produces a read/write signal R/W for the bank memory devices A630, B631; a clock signal CLK; and has inputs A0, A1 which switch the address signal ADD and receive the read/write signal R/W; inputs B0, B1 for receiving the clock signal CLK; inputs C0, C1 for receiving an address signal ADD [0 ... 14]; outputs FA0, FA1, FB0, FB1, FC0, and FC1 corresponding to the inputs; and a control input S. The read/write signal R/W and the address signal ADD are supplied from the BOST control section 40 shown in FIG. 51, and the clock signal CLK is based on the test cycle signal TCY.

If the control input S is at a low level L, the input A0 is switched to an output FA0; the input A1 is switched to the output FA1; the input B0 is switched to the output FB0; the input b1 is switched to the output FB1; the input C0 is switched to the output FC0; and the input C1 is switched to the output FC1. If the control input S has assumed a high level H, the input A0 is switched to the output FA1; the input A1 is switched to the output FA0; the input B0 is switched to the output FB1; the input B1 is switched to the output FB0; the input C0 is switched to the output FC1; and the input C1 is switched to the output FC0. The control input S is output from the switch setting circuit 634, and the switch setting circuit 634 is controlled by the CPU section 33.

The outputs FA0, FA1 of the switching circuit 632 are connected to RW terminals of the bank memory devices A630, B631; the outputs FB0, FB1 are connected to CLK terminals of the bank memory devices A630, B631; and the outputs FC0, FC1 are connected to ADD terminals of the bank memory devices A630, B631.

The switching circuit 633 has input/output terminals A, B, an output terminal F0, and an input terminal F1. The input/output terminals A, B are connected to DQ terminals of the bank memory devices A630, B631. A DQ[0 ... 15] signal output from the PC card 230A is supplied to the input terminal F1. The control terminal S is connected to the switch setting circuit 634.

When the control input S is at a low level L, the input/output terminals A, B of the switching circuit 633 are connected to the terminals F0, F1. When the control input S is at a high level H, the input/output terminals A, B are switched so as to be connected to the terminals F1, F2. When the control input S is at a low level L, the input/output terminal A is connected to the output terminal F0, and the input terminal F1 is connected to the input/output terminal B. In this state, the bank memory A630 receives the read/write signal R/W output from the outputs FA0, FB0, FC0 of the switching circuit 632, the clock signal CLK, and the address signal ADD[0 ... 14], thereby performing reading operation and producing an output at the output terminal F0. Moreover, the data DQ[0 ... 15] to be delivered to the input terminal F1 are connected to DQ of the bank memory B631.

The bank memory B631 receives the read/write signal R/W, the clock signal CLK, and the address signal ADD, all being output from the outputs FA1, FB1, and FC1 of the switching circuit 632, and the bank memory B631 performs a writing operation.

If the control input S is at a high level H, the input/output terminal B is connected to the output terminal F0, and the input terminal F1 is connected to the input/output terminal A. In this state, the bank memory B631 receives the read/write signal R/W, the clock signal CLK, and the address signal ADD[0 . . . 14] from the outputs FA0, FB0, and FC0 of the switching circuit 632, thereby performing a reading operation. A read output is delivered to the output terminal F0. The data DQ[0 . . . 15] output to the input terminal F1 are connected to DQ of the bank memory A630. The bank memory A630 receives the read/write signal R/W, the clock signal CLK, and the address signal ADD from the outputs FA1, FB1, and FC1 of the switching circuit 632, and the bank memory A630 performs a writing operation.

In embodiment 3-3, the state in which the bank memory A630 performs a reading operation and the bank memory B631 performs a writing operation and the state in which the bank memory 630 performs a writing operation and the bank memory B631 performs a reading operation are switched in accordance with the control input S. The bank memory devices A630, B631 alternately perform reading and writing operations. Hence, as in the case of use of the dual-port memory 620 of the embodiment 302, transfer of the test pattern data from the TPM section 50 to the PG section 60 and reading of the test pattern data TPD from the PG section 60 can be performed simultaneously and in tandem with each other. Even in embodiment 3-3, the removable storage medium 230 such as the PC card 230A is used, in an attempt to increase storage capacity of the TPM section 50. Since the larger volume of test pattern data TPD corresponding to a larger number of test items can be stored in the TPM section 50, various function tests can be effectively carried out by selection of test pattern data corresponding to test items to be executed from among the larger number of test items. Further, the PC card 230A is removable, and hence the PC card may be detached from the BOST device 20 and test pattern data may be written into the PC card through use of another terminal. The writing operation enables shortening of the time required to use the BOST device 20. Further, the time during which the BOST device 20 awaits writing operation can be shortened.

The features and advantages of the present invention may be summarized as follows.

As described above, the apparatus for testing a semiconductor integrated circuit of the invention enables simple expansion of the capability to test a digital circuit of a semiconductor integrated circuit under test without development of a custom-designed tester by expansion of test pattern data stored in the test pattern memory. Further, as a result of required test pattern data having been stored in the test pattern memory beforehand, the digital circuit can be tested quickly by means of an ancillary test device.

The apparatus is industrially utilized as an apparatus for testing a semiconductor integrated circuit in a factory for producing a semiconductor integrated circuit.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2003-049893, filed on Feb. 26, 2003 including specification, claims, drawings and summary, on which the Convention priority of the present application is based, are incorporated herein by reference in its entirety.

What is claimed is:

1. An apparatus for testing a semiconductor integrated circuit comprising:
   a test circuit board for exchanging signals with a semiconductor integrated circuit under test; and
   an ancillary test device which is disposed in the vicinity of the test circuit board and connected to the test circuit board;
   wherein the ancillary test device comprises digital circuit testing capability for testing a digital circuit included in the semiconductor integrated circuit under test;
   the ancillary test device comprises test pattern memory for storing a plurality of test pattern data sets corresponding to a plurality of test items for testing the digital circuit, a test pattern signal generator into which are written test pattern data selected from a plurality of test pattern data sets stored in the test pattern memory, and a control section for controlling an operation for the test pattern data selected from among the plurality of test pattern data sets stored in the test pattern memory and an operation for writing the selected test pattern data into the test pattern signal generator; and
   the ancillary test device generates a test input pattern signal for the semiconductor integrated circuit under test on the basis of test pattern data written in the test pattern signal generator and determines a test output pattern signal output from the semiconductor integrated circuit under test on the basis of the test input pattern signal, thereby testing a digital circuit of the semiconductor integrated circuit under test.

2. The apparatus for testing a semiconductor integrated circuit according to claim 1, wherein the test pattern memory is formed so as to have storage capacity greater than the storage capacity of the test pattern signal generator.

3. The apparatus for testing a semiconductor integrated circuit according to claim 2, wherein
   the test pattern signal generator is constituted of memory which is higher in speed than the test pattern memory;
   the test pattern signal generator stores a test vector address control code, test vector address control data, and test pattern data along a test vector address;
   the control section comprises a program counter which generates a test vector address signal on the basis of the test vector address control code and test vector address control data; and
   the test pattern signal generator generates a test pattern signal on the basis of the test pattern data while advancing the test vector address by means of the test vector address signal.

4. The apparatus for testing a semiconductor integrated circuit according to claim 2, wherein
   the test pattern signal generator is constituted of memory which is higher in speed than the test pattern memory;
   the test pattern signal generator stores, along test vector addresses, a control code for an algorithmic data generation register, control data for the algorithmic data generation register, a test vector address control code, and test vector address control data;
   the control section comprises a program counter for generating a test vector address signal on the basis of the test vector address control code and test vector address control data, and a plurality of groups of registers for generating an algorithmic test pattern signal on the basis of the control code for an algorithmic data generation register and the control data for an algorithmic data generation register.

5. The apparatus for testing a semiconductor integrated circuit according to claim 1, wherein the ancillary test device further comprises a CPU section, the CPU section generates a selection instruction signal to be used for reading test pattern selected from the plurality of test pattern data sets stored in the test pattern memory, and the control section reads the test pattern data selected from the plurality of test pattern data sets stored in the test pattern memory in accordance with the selection instruction signal and writes the test pattern data into the test pattern signal generator.

6. The apparatus for testing a semiconductor integrated circuit according to claim 1, wherein the control section reads the test pattern data written into the test pattern signal generator; and
the test pattern signal generator generates a test pattern signal and a test input/determination pattern signal on the basis of the read test pattern data.

7. The apparatus for testing a semiconductor integrated circuit according to claim 6, wherein the ancillary test device further comprises a waveform shaping section, the waveform shaping section shapes the test input pattern signal on the basis of the test pattern signal, and the test input pattern signal is input to the semiconductor integrated circuit under test.

8. The apparatus for testing a semiconductor integrated circuit according to claim 7, wherein the ancillary test device further comprises an output determination section, and the output determination section compares a test output pattern signal output from the semiconductor integrated circuit under test with the test pattern signal, thereby outputting an error data signal.

9. The apparatus for testing a semiconductor integrated circuit according to claim 8, wherein the ancillary test device further comprises an error information memory section, and the error information memory section is formed so as to receive address information to be used for reading the test pattern data written into the test pattern signal generator and also stores address information obtained when the output determination section has generated the error data signal.

10. The apparatus for testing a semiconductor integrated circuit according to claim 1, wherein the test device comprises a test head device disposed in the vicinity of the test circuit board;
the test head device comprises an ancillary test assembly formed by combination of a plurality of circuit boards; and
the ancillary test device comprises circuit components mounted on the plurality of circuit boards in a distributed manner.

11. The apparatus for testing a semiconductor integrated circuit according to claim 10, wherein the ancillary test device assembly comprises five circuit boards:
two of the five circuit boards are arranged in substantially parallel with the test circuit board; and
the remaining three circuit boards are arranged substantially perpendicular to the test circuit boards.

12. The apparatus for testing a semiconductor integrated circuit according to claim 11, wherein the test head device comprises a test head having a scope hole; and
portions of the three circuit boards disposed substantially perpendicular to the test circuit board are arranged uniformly within the scope hole.

13. The apparatus for testing a semiconductor integrated circuit according to claim 1, wherein the test pattern signal generator comprises a plurality of channels and is formed so as to read test pattern data from each of the channels;
the control section comprises a parallel-to-serial converter into which the test pattern data read from the channels are input; and
the parallel-to-serial converter comprises the function of serially outputting the test pattern data read from the respective channels for each test cycle.

14. The apparatus for testing a semiconductor integrated circuit according to claim 1, wherein the ancillary test device further comprises a timing signal generator;
the timing signal generator has a test cycle signal, a set clock signal, a reset clock signal, and a strobe signal;
the set clock signal, the reset clock signal, and the strobe signal are generated respectively from the test cycle signal with a certain variable time delay;
the set clock signal is used for setting a timing at which the test input pattern signal rises;
the reset clock signal is used for setting a timing at which the test input pattern signal falls; and
the strobe signal is used for setting a timing at which there is determined a test output pattern output from the semiconductor integrated circuit under test on the basis of the test input pattern.

15. The apparatus for testing a semiconductor integrated circuit according to claim 1, wherein the ancillary test device further comprises an interface circuit which interfaces with the semiconductor integrated circuit under test, and an output determination section;
the interface circuit comprises a high-level voltage generator and a low-level voltage generator;
a high-level voltage output from the high-level voltage generator and a low-level voltage output from the low-level voltage generator are made variable;
the test input pattern is generated through use of the high-level voltage and the low-level voltage; and
the output determination section is formed so as to determine the level of the test output pattern signal output from the semiconductor integrated circuit under test through use of a high-level voltage for determination output from a high-level voltage generator for determination purpose and generates an error data signal pertaining to a high-level voltage of the test output pattern, an error data signal pertaining to a low-level voltage of the test output pattern signal, and an error data signal pertaining to a voltage between the high-level voltage and the low-level voltage.

16. An apparatus for testing a semiconductor integrated circuit comprising:
a test circuit board for exchanging signals with a semiconductor integrated circuit under test; and
an ancillary test device which is disposed in the vicinity of the test circuit board and connected to the test circuit board;
wherein the ancillary test device comprises digital circuit testing capability for testing a digital circuit included in the semiconductor integrated circuit under test;
the ancillary test device comprises test pattern memory for storing a plurality of test pattern data sets corresponding to a plurality of test items for testing the digital circuit, a test pattern signal generator into which are written test pattern data selected from a plurality of test pattern data sets stored in the test pattern memory, and a control section for controlling an operation for the test pattern data selected from among the plurality of test pattern data sets stored in the test pattern memory, an operation for writing the selected test pattern data into the test pattern signal generator, and an operation for reading test pattern data from the test pattern signal generator;

the ancillary test device generates a test input pattern signal for the semiconductor integrated circuit under test on the basis of test pattern data read from the test pattern signal generator and determines a test output pattern signal output from the semiconductor integrated circuit under test on the basis of the test input pattern signal, thereby testing a digital circuit of the semiconductor integrated circuit under test;

the ancillary test device is formed from a plurality of circuit boards including a circuit board to which a storage medium is removably attached; and the pattern data memory is formed from the storage medium.

17. An apparatus for testing a semiconductor integrated circuit comprising:

a test circuit board for exchanging signals with a semiconductor integrated circuit under test; and an ancillary test device which is disposed in the vicinity of the test circuit board and connected to the test circuit board;

wherein the ancillary test device comprises digital circuit testing capability for testing a digital circuit included in the semiconductor integrated circuit under test;

the ancillary test device comprises test pattern memory for storing a plurality of test pattern data sets corresponding to a plurality of test items for testing the digital circuit, a test pattern signal generator having first and second memory devices into which are written test pattern data selected from a plurality of test pattern data sets stored in the test pattern memory, and a control section for controlling an operation for the test pattern data selected from among the plurality of test pattern data sets stored in the test pattern memory, an operation for writing the selected test pattern data into the first and second memory devices of the test pattern signal generator, and an operation for reading test pattern data from the first and second memory devices of the test pattern signal generator;

the ancillary test device generates a test input pattern signal for the semiconductor integrated circuit under test on the basis of test pattern data read from the test pattern signal generator and determines a test output pattern signal output from the semiconductor integrated circuit under test on the basis of the test input pattern signal, thereby testing a digital circuit of the semiconductor integrated circuit under test; and when first test pattern data written into the first memory of the test pattern signal generator are read, second test pattern data selected from the plurality of test pattern data sets stored in the test pattern memory are written into the second memory device.

18. The apparatus for testing a semiconductor integrated circuit according to claim 17, wherein the test pattern signal generator is formed from dual-port memory;

the first memory device is formed from a first port; and
the second memory is formed from a second port.

19. The apparatus for testing a semiconductor integrated circuit according to claim 17, wherein the test pattern signal generator is formed from first and second bank memory devices;

the first bank memory device constitutes the first memory; and the second bank memory device constitutes the second memory.

20. A method of manufacturing a semiconductor integrated circuit comprising the step of testing the semiconductor integrated circuit; wherein a test circuit board for exchanging signals with a semiconductor integrated circuit under test, and an ancillary test device which is disposed in the vicinity of the test circuit board and connected to the test circuit board are used in the step of testing the semiconductor integrated circuit;

the ancillary test device comprises digital circuit testing capability for testing a digital circuit included in the semiconductor integrated circuit under test;

the ancillary test device comprises test pattern memory for storing a plurality of test pattern data sets corresponding to a plurality of test items for testing the digital circuit, a test pattern signal generator into which are written test pattern data selected from a plurality of test pattern data sets stored in the test pattern memory, and a control section for controlling an operation for the test pattern data selected from among the plurality of test pattern data sets stored in the test pattern memory and an operation for writing the selected test pattern data into the test pattern signal generator; and the ancillary test device generates a test input pattern signal for the semiconductor integrated circuit under test on the basis of test pattern data written in the test pattern signal generator and determines a test output pattern signal output from the semiconductor integrated circuit under test on the basis of the test input pattern signal, thereby testing a digital circuit of the semiconductor integrated circuit under test, in the step of testing the semiconductor integrated circuit.

* * * * *